United States Patent [19]

Taguchi et al.

[11] Patent Number: 5,729,154
[45] Date of Patent: Mar. 17, 1998

[54] TERMINATION CIRCUITS AND RELATED OUTPUT BUFFERS

[75] Inventors: Masao Taguchi; Tsuyoshi Higuchi, both of Kawasaki, Japan

[73] Assignee: Fujitsu Limited, Kanagawa, Japan

[21] Appl. No.: 715,358

[22] Filed: Sep. 10, 1996

Related U.S. Application Data

[62] Division of Ser. No. 351,064, Nov. 28, 1994.

[30] Foreign Application Priority Data

| Nov. 29, 1993 | [JP] | Japan | 5-297669 |
| Feb. 28, 1994 | [JP] | Japan | 6-030470 |
| Feb. 28, 1994 | [JP] | Japan | 6-030501 |

[51] Int. Cl.$^6$ .............. H03K 17/16; H03K 19/0175
[52] U.S. Cl. .................. 326/30; 326/86; 326/90
[58] Field of Search ............... 326/83, 90, 30, 326/86, 36, 115; 333/32

[56] References Cited

U.S. PATENT DOCUMENTS

| 4,647,797 | 3/1987 | Sanwo et al. | 326/86 |
| 4,766,334 | 8/1988 | Warner | 326/30 |
| 4,808,855 | 2/1989 | Lloyd | 326/86 |
| 4,843,262 | 6/1989 | Abe | 326/86 |
| 4,853,560 | 8/1989 | Iwamura et al. | 326/86 |
| 4,871,931 | 10/1989 | Fitzpatrick et al. | |
| 4,985,646 | 1/1991 | Kumagai et al. | 326/86 |
| 4,994,690 | 2/1991 | Sundstrom et al. | 326/86 |
| 5,019,729 | 5/1991 | Kimura et al. | 326/86 |
| 5,105,107 | 4/1992 | Wilcox | 326/30 |
| 5,149,992 | 9/1992 | Allstot et al. | 326/115 |
| 5,227,677 | 7/1993 | Furman | 326/30 |
| 5,347,177 | 9/1994 | Lipp et al. | 326/30 |

FOREIGN PATENT DOCUMENTS

| 492613 | 7/1992 | European Pat. Off. . |
| 533971 | 3/1993 | European Pat. Off. . |
| 117323 | 7/1984 | Japan . |
| WO-A-94/ 24797 | 10/1994 | WIPO . |

OTHER PUBLICATIONS

"Active Terminators for CMOS Drivers", IBM Technical Disclosure Bulletin, vol. 32 No. 4A, Sep. 1989.

"Design and Characteristics of a CMOS-Off-Chip Driver/Receiver With Reduced Power Supply Distrubance", IEEE Journal of Solid-State Circuits, May 27, 1992, Hanafi et al. No. 5.

Primary Examiner—Edward P. Westin
Assistant Examiner—Richard Roseen
Attorney, Agent, or Firm—Armstrong, Westerman, Hattori, McLeland & Naughton

[57] ABSTRACT

An electronic system includes a plurality of electronic circuits each having a signal input and output function, a bus to which the plurality of electronic circuits are connected, first termination resistors connected to ends of the bus, and a termination voltage circuit having a first part generating a first voltage and a second part generating a second voltage. The sum of the first voltage and the second voltage is supplied, as a power supply voltage, to output circuits of the plurality of electronic circuits connected to the bus. The second voltage is supplied to the first termination resistors as a termination voltage.

90 Claims, 68 Drawing Sheets

FIG. I PRIOR ART

DRAIN VOLTAGE OF nMOS TRANSISTOR 418

F I G. 47
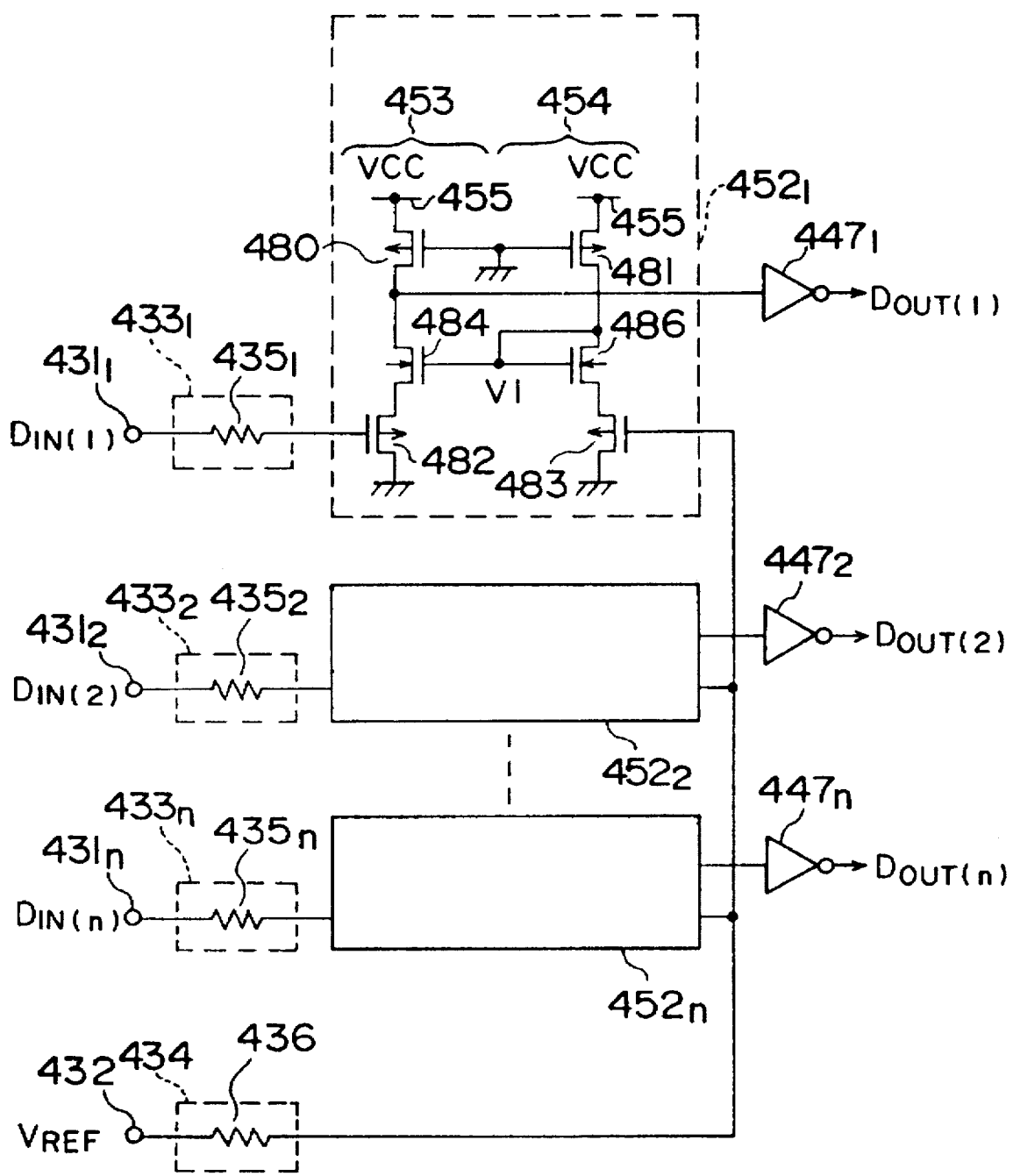

TERMINATION CIRCUITS AND RELATED OUTPUT BUFFERS

This is a division of application Ser. No. 08/351,064 filed Nov. 28, 1994.

BACKGROUND OF THE INVENTION

1. Field of the Invention

The present invention generally relates to electronic systems which transmit signals to remote devices via signal lines, and more particularly to an electronic system which transmits a signal having an amplitude less than the power supply voltage applied to the electronic system. Further, the present invention is concerned with a semiconductor integrated circuit and a termination device used in such an electronic system.

2. Description of the Prior Art

Recently, there has been considerable activity in the development of small-amplitude high-speed signal transmissions. In such transmissions, signals having amplitudes less than the power supply voltage are transmitted. For example, the GTL (Gunning Transceiver Logic) standard is known. According to this GTL standard, the output circuit is an open-drain type driver and an impedance match termination is employed. Under these conditions, the following parameters are defined:

termination voltage $V_{TT}=1.2$ V±5%;
reference voltage $V_{REF}=0.8$ V;
output high-level voltage $V_{OH}=0.8$ V+400 mV;
output low-level voltage $V_{OL}=0.8$ V−400 mV;
input high-level voltage $V_{IN}=0.8$ V+50 mV; and
input low-level voltage $V_{IN}=0.8$ V−50 mV.

Regarding the small-amplitude high-speed signal transmissions, the following documents are known: 1) Taguchi et al., "COMPARING SMALL-AMPLITUDE INTERFACES TOWARD 100 MHZ TIMES", Nikkei Electronics, No. 591, pp. 269–290, 1993. 9. 27; and 2) Taguchi et al., "SMALL-AMPLITUDE INTERFACE CIRCUIT FOR HIGH-SPEED MEMORY BUS", Study Document of Institute of Electronics, Communication and Information Engineers, Nov. 26, 1993.

FIG. 1 is a block diagram of a system having electronic systems in which a small-amplitude signal, which has an amplitude less than the power supply voltage, is transmitted therebetween via a bus line. The system shown in FIG. 1 includes a microprocessor 1, SDRAM (Synchronous Dynamic Random Access Memory) devices $2_1$, $2_2$ and $2_n$ (where n is an integer), and a bus line 3 via which small-amplitude signals are transmitted. At the present time, the transmission of signals between the microprocessor 1 and the DRAM devices $2_1$–$2_n$ are carried out at tens of megahertz. However, it is required that signal transmissions be performed at 100 MHz or higher.

FIG. 2 is a circuit diagram of conventional interfaces and a bus system employed in electronic systems as described above. A microprocessor 5 has a signal input/output terminal 6, a reference voltage input terminal 7 and an input circuit 8. The signal input/output terminal 6 is used to input and output a signal DQ. The reference voltage input terminal 7 is used to receive a reference voltage Vref. The input circuit 8 includes a differential amplifier circuit. Further, the microprocessor 5 has a VCC power supply line 10 providing a power supply voltage VCC (equal to, for example, 3.3 V), a VSS power supply line via which a power supply voltage VSS (equal to, for example, 0 V), a main body circuit 11 and a push-pull-type output circuit 12.

The push-pull-type output circuit 12 is made up of an enhancement-type p-channel MOS transistor 13 functioning as a pull-up element, and an enhancement-type n-channel MOS transistor 14 functioning as a pull-down element.

A bus line 15 transmits small-amplitude signals. A termination voltage supply 16 generates a termination voltage VTT (equal to, for example, 1.65 V). A VTT voltage line 17 supplies the termination voltage VTT to parts connected thereto. Two termination resistors 18 and 19 (equal to, for example, 50 Ω) are connected as shown in FIG. 2. An SDRAM device 20 has a signal input/output terminal 21 used to input and output the signal DQ, a reference voltage input terminal 22 receiving the reference voltage Vref, an input circuit 23 having a differential amplifier circuit, and a push-pull-type output circuit 24.

In the configuration shown in FIG. 2, the termination voltage VTT generated from the termination voltage supply 16 is applied, as the reference voltage Vref, to the reference voltage input terminal 7 of the microprocessor 5 and the reference voltage input terminal 22 of the SDRAM 20.

In the interface circuits and the bus system shown in FIG. 2, the signal DQ is transmitted in such a way that a center voltage is set equal to the reference voltage Vref (=1.65 V), and the amplitude is within the range of ±400 mV. For example, when the microprocessor 5 sends the signal DQ to the DRAM device 20, the pMOS transistor 13 is turned OFF (not conducting), and the nMOS transistor 14 is turned ON (conducting). In this case, the signal DQ is set to the low level (L). When the pMOS transistor 13 is turned ON and the nMOS transistor 14 is OFF, the signal DQ is switched to the high level (H). When the output circuit 12 outputs the low level, a current flows from the termination voltage supply 16 to the load. When the output circuit 12 outputs the high level, a current flows the termination voltage supply 16 from the load.

Generally, the termination voltage supply 16 is formed with a voltage source such as a switching regulator or a series regulator. However, such a regulator is not expected to receive current coming from the power supply. If a current comes into the voltage source from the load, the termination voltage VTT will be varied.

Taking into account the above, a bus system as shown in FIG. 3 can be used. The bus system shown in FIG. 3 includes a power supply voltage generating circuit 25 for generating the power supply voltage VCC. The circuit 25 is connected to a VCC power supply line 26. Further, there is provided a VSS power supply line 27. Further, the system includes termination resistors 28–31 (each equal to, for example, 100 Ω), voltage dividing resistors 32 and 33, and power supply voltage input terminals 34 and 35 of the microprocessor 5. The resistors 32 and 33 divide the power supply voltage VCC to thereby generate the reference voltage Vref.

In the bus system, the termination part made up of the termination resistors 28 and 29 is set approximately equal to 50 Ω, and the termination part made up of the termination resistors 30 and 31 is set approximately equal to 50 Ω.

However, the bus system shown in FIG. 3 has the following disadvantages. The termination resistors 28 and 29 as well as the termination resistors 30 and 31 are respectively connected in series between the VCC line 26 and the VSS line 27. Hence, even when no signal is transmitted, currents flow in the termination resistors 28–31 and increase power consumption.

If the voltage dividing resistors 32 and 33 are designed to have large resistance values, the current flowing in the resistors 32 and 33 can be reduced. However, if the resistors 32 and 33 do not have good precision, the reference voltage Vref will not be equal to the termination voltage VTT. The difference between the reference voltage Vref and the termination voltage VTT functions as a D.C. offset voltage of the input signal, which reduces the operation margin at the high-level or low-level side of the input signal. Hence, it is necessary to use high-precision resistors 32 and 33. However, this leads to an increase in the production cost.

SUMMARY OF THE INVENTION

It is a general object of the present invention to provide an electronic system, an integrated circuit device and a termination device in which the above disadvantages are eliminated.

A more specific object of the present invention is to provide an electronic system, an integrated circuit device and a termination device in which the termination voltage is stabilized with reduced power consumption and a sufficient operation margin for input signals can be ensured by preventing an offset voltage from being produced.

These objects of the present invention are achieved by an electronic system comprising: a plurality of electronic circuits each having a signal input and output function; a bus to which the plurality of electronic circuits are connected; first termination resistors connected to ends of the bus; and a termination voltage circuit having a first part generating a first voltage and a second part generating a second voltage, a sum of the first voltage and the second voltage being supplied, as a power supply voltage, to output circuits of the plurality of electronic circuits connected to the bus, the second voltage being supplied to the first termination resistors as a termination voltage.

The above objects of the present invention are achieved by an electronic circuit comprising: an output circuit having a first pull-up element formed of a first p-channel insulation gate type field effect transistor, and a first pull-down element formed of a first n-channel insulation gate type field effect transistor; a first inverter having a second pull-up element formed of a second p-channel insulation gate type field effect transistor, and a second pull-down element formed of a second n-channel insulation gate type field effect transistor; and a second inverter having a third pull-up element formed of a third p-channel insulation gate type field effect transistor, and a third pull-down element formed of a third n-channel insulation gate type field effect transistor, a power supply voltage supplied to said first and second inverters being the same as power supply voltage supplied to said output circuit.

The above objects of the present invention are also achieved by an electronic circuit comprising: an output circuit having a first pull-up element formed of a first n-channel insulation gate type field effect transistor, and a first pull-down element formed of a second n-channel insulation gate type field effect transistor, the first n-channel insulation gate type field effect transistor has a threshold voltage equal to or higher than a low-level signal output from said output circuit and is lower than a threshold voltage of said second n-channel insulation gate type field effect transistor.

The above objects of the present invention are also achieved by an electronic circuit comprising: an output circuit having a first pull-up element formed of a first n-channel insulation gate type field effect transistor of a depletion type, and a first pull-down element formed of a second n-channel insulation gate type field effect transistor of an enhancement type, the first n-channel insulation gate type field effect transistor has a threshold voltage equal to or higher than a low-level signal output from said output circuit.

The above objects of the present invention are also achieved by a termination device applied to an electronic system comprising: a plurality of electronic circuits each having a signal input and output function; and a bus to which the plurality of electronic circuits are connected, said termination device comprising: termination resistors connected to ends of the bus; and a member packaging said termination resistors.

The above objects of the present invention are also achieved by an electronic system comprising: a plurality of electronic circuits having a signal input and output function and a push-pull type output circuit; a bus to which the plurality of electronic circuits are connected; and a termination device having a first non-linear element having a rise characteristic, and a second non-linear element having a rise characteristic, the first non-linear element being connected between a termination voltage line and said bus in a forward direction, the second non-linear element being connected, in the forward direction, between the bus and a voltage line carrying a voltage lower than a termination voltage supplied via the termination voltage line, no current flowing in the bus when no signal is transmitted via the bus.

The above objects of the present invention are also achieved by a termination device comprising: a first non-linear element having a rise characteristic; and a second non-linear element having a rise characteristic, the first non-linear element being connected, in a forward direction, between a bus and a termination voltage line via which a termination voltage is supplied, the second non-linear element being connected, in the forward direction, between the bus and a voltage line via which a voltage lower than the termination voltage is supplied.

The above objects of the present invention are also achieved by an electronic circuit comprising: a plurality of logic decision circuits, each having a first load element having a first end connected to a power supply line supplying a power supply voltage, and a first n-channel field effect transistor of an insulation gate type having a drain connected to a second end of the first load element, a gate supplied with an inner reference voltage via a first input protection circuit, and a source receiving a transmitted signal, an output signal obtained by making a logic decision on the transmitted signal being output via the drain; and an inner reference voltage generating circuit having a second load element having a first end connected to said power supply line, a second n-channel field effect transistor of the insulation gate type having a drain connected to a second end of the second load element, a gate connected to the drain of the second n-channel field effect transistor and the gate of the first n-channel field effect transistor, and a source receiving a reference voltage via a reference voltage input terminal and a second input protection circuit, the reference voltage being used to make said logic decision, and a capacitor having a first end connected to the gate of the second n-channel field effect transistor and a second end connected to the second input protection circuit, said inner reference voltage being obtained at the gate of the second n-channel field effect transistor, the plurality of logic decision circuits and said inner reference voltage generating circuit forming input circuits of electronic circuits connected to the bus through which the transmitted signal passes.

The above objects of the present invention are also achieved by an electronic circuit comprising: a plurality of logic decision circuits, each having a first load element having a first end connected to a power supply line supplying a power supply voltage, and a first n-channel field effect transistor of an insulation gate type having a drain connected to a second end of the first load element, a gate supplied with an inner reference voltage via a first input protection circuit, and a source receiving a transmitted signal, an output signal obtained by making a logic decision on the transmitted signal being output via the drain; and an inner reference voltage generating circuit having a second load element having a first end connected to said power supply line, a second n-channel field effect transistor of the insulation gate type having a drain connected to a second end of the second load element, a gate connected to the drain of the second n-channel field effect transistor and the gate of the first n-channel field effect transistor, and a source receiving a reference voltage via a reference voltage input terminal and a second input protection circuit, the reference voltage being used to make said logic decision, and an operational amplifier having a non-inverting input terminal connected to the source of the second n-channel field effect transistor, an inverting input terminal connected to an output terminal thereof and the gate of the first n-channel field effect transistor, said inner reference voltage being obtained at the output terminal of the operational amplifier, the plurality of logic decision circuits and said inner reference voltage generating circuit forming input circuits of electronic circuits connected to the bus through which the transmitted signal passes.

The above objects of the present invention are also achieved by an electronic circuit comprising: a plurality of logic decision circuits, each having a first load element having a first end connected to a power supply line supplying a power supply voltage, and a first n-channel field effect transistor of an insulation gate type having a drain connected to a second end of the first load element, a gate supplied with an inner reference voltage, and a source, and a first variable impedance element having a current input terminal connected to the source, a current output terminal set to a group potential, and a control terminal receiving a transmitted signal via which a transmitted signal input terminal and a first input protection circuit, an output signal obtained by making a logic decision on the transmitted signal being output via the drain of the first n-channel field effect transistor; and an inner reference voltage generating circuit having a second load element having a first end connected to the power supply line, a second n-channel field effect transistor of the insulation gate type having a drain connected to a second terminal of the second load element, a gate connected to the second terminal and the gate of the first n-channel field effect transistor, and a source, and a second variable impedance element having a current input terminal connected to the source of the second n-channel field effect transistor, and a current output terminal set to the ground potential, and a control terminal receiving a reference voltage via a reference voltage input terminal and a second input protection circuit, the reference voltage being used to make the logic decision on the transmitted signal, the inner reference voltage being obtained at the gate of the second n-channel field effect transistor.

The above objects of the present invention are also achieved by an electronic circuit comprising: a differential amplifier circuit supplied with an input signal on which a logic decision should be made, and a reference voltage used to make the logic decision; and an input circuit including a current control circuit which controls said differential amplifier circuit so that a variation in a current flowing in the differential amplifier circuit with respect to a change of the reference voltage within a predetermined range.

The above objects of the present invention are also achieved by an electronic circuit connected to a first powers supply line via which a first power supply voltage is supplied, said electronic circuit comprising: a first transistor formed of a p-channel insulation gate field effect transistor having a source connected to a second power supply line via which a second power supply voltage equal to or lower than the first power supply voltage is supplied, a drain connected to an output terminal of the electronic circuit, and a gate supplied with a first signal switchable between a high level corresponding to the second power supply voltage and a low level corresponding to a ground voltage; a second transistor formed of an n-channel insulation gate field effect transistor having a drain connected to the second power supply line, a source connected to the output terminal, and a gate supplied with a second signal switchable between a high level corresponding to said first power supply voltage and a low level corresponding to the ground voltage; and a third transistor formed of an n-channel insulation gate field effect transistor having a drain connected to the output terminal, a source connected to the ground, and a gate supplied with a third signal switchable between a high level corresponding to the first power supply voltage and a second level corresponding to the ground voltage.

The above objects of the present invention are also achieved by an electronic circuit comprising: an output control circuit having a power supply terminal connected to a first power supply line via which a first power supply voltage is supplied and outputting first and second signals each switchable between a high level corresponding to the first power supply voltage and a low level corresponding to a ground voltage; a first inverter having a power supply terminal connected to a second power supply line via which a second power supply voltage equal to or lower than the first power supply voltage, an input terminal supplied with the first signal, and an output terminal outputting a signal switchable between a high level corresponding to the second power supply voltage and a low level corresponding to the ground voltage; a second inverter having a power supply terminal connected to the first power supply line, an input terminal supplied with the second signal, and an output terminal outputting a signal switchable between a high level corresponding to the first power supply voltage and a low level corresponding to the ground voltage; a first transistor formed of a p-channel insulation gate type field effect transistor having a drain connected to the second power supply line, a source connected to the output terminal, and a gate connected to the output terminal of the first inverter; a second transistor formed of an n-channel insulation gate type field effect transistor having a drain connected to the second power supply line, a source connected to the output terminal, and a gate supplied with the first signal; and a third transistor formed of an n-channel insulation gate type field effect transistor having a drain connected to the output terminal, a source grounded, and a gate connected to the output terminal of the second inverter.

BRIEF DESCRIPTION OF THE DRAWINGS

Other objects, features and advantages of the present invention will become more apparent from the following detailed description when read in conjunction with the accompanying drawings, in which:

FIG. 47 is a block diagram of the detailed structure of the input circuit shown in FIG. 42;

DESCRIPTION OF THE PREFERRED EMBODIMENTS

Figure 1:
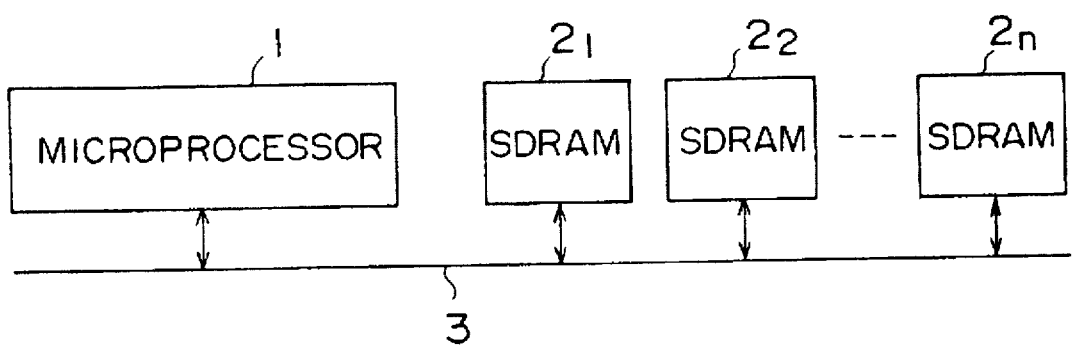
FIG. 1 is a block diagram of an electronic system in which a small-amplitude signal is transmitted.
Figure 2:
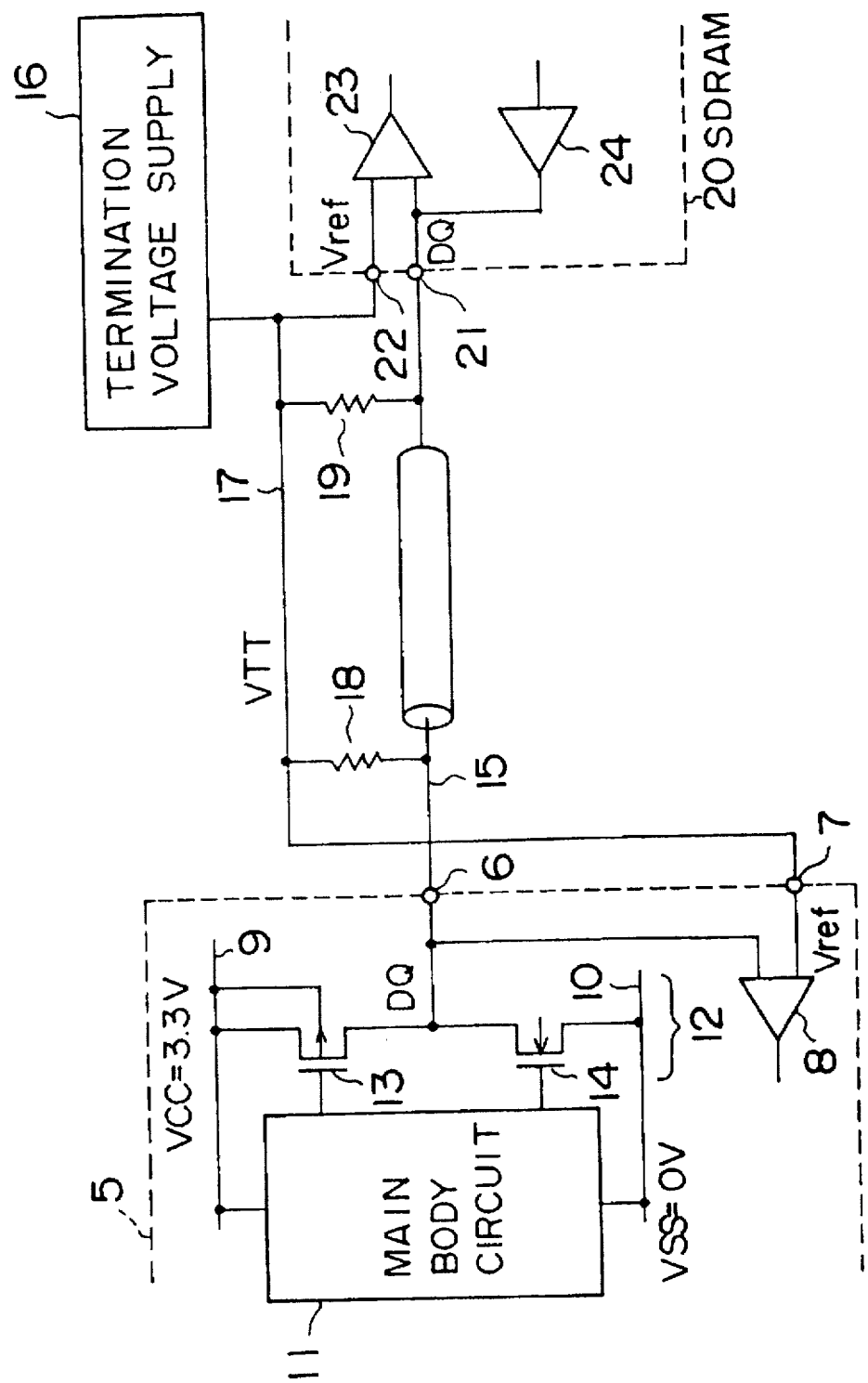
FIG. 2 is a circuit diagram of an interface circuit and a bus system applicable to the electronic device shown in FIG. 1.
Figure 3:
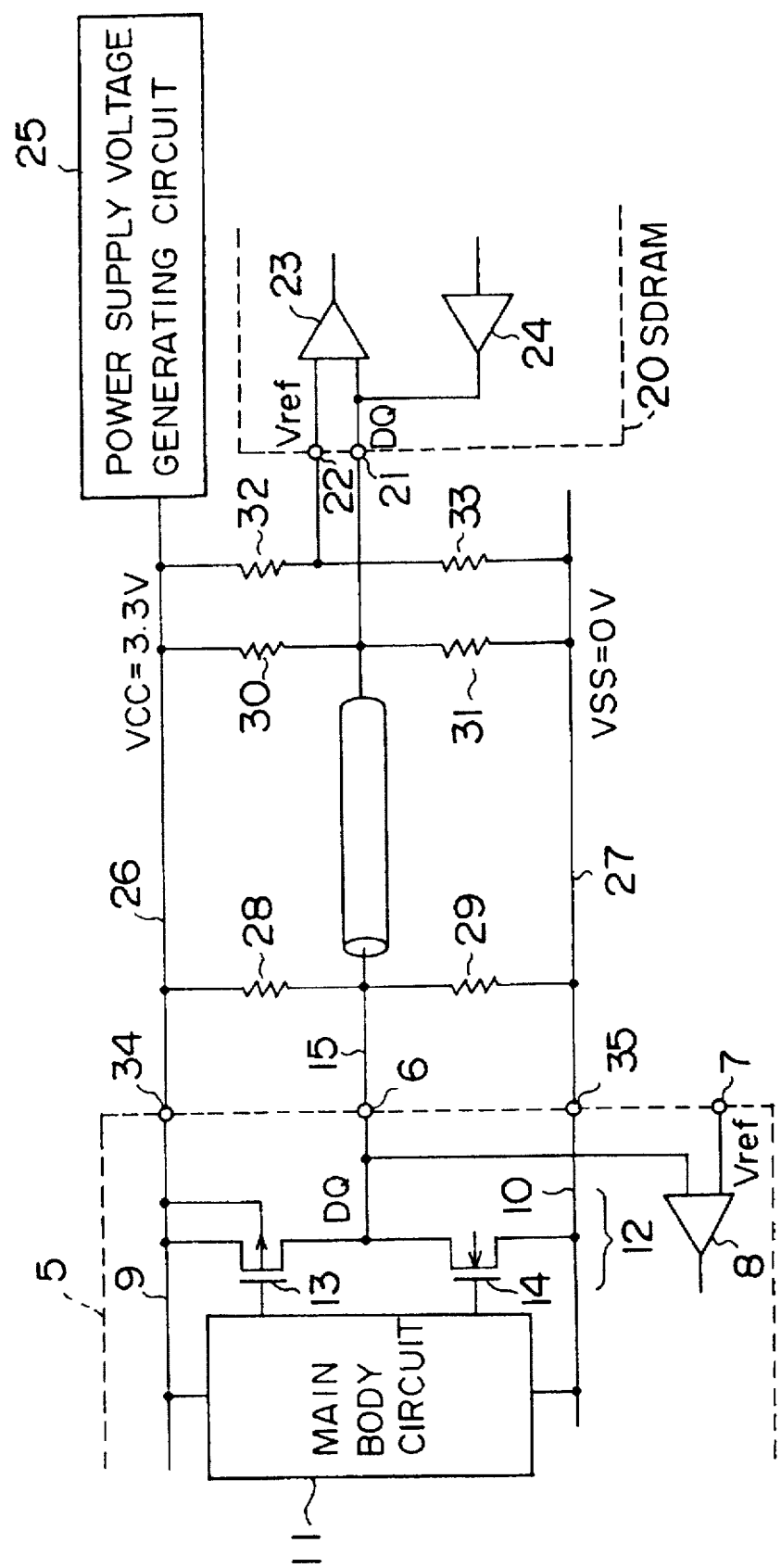
FIG. 3 is a circuit diagram of another interface circuit and another bus system applicable to the electronic device shown in FIG. 1.
Figure 4:
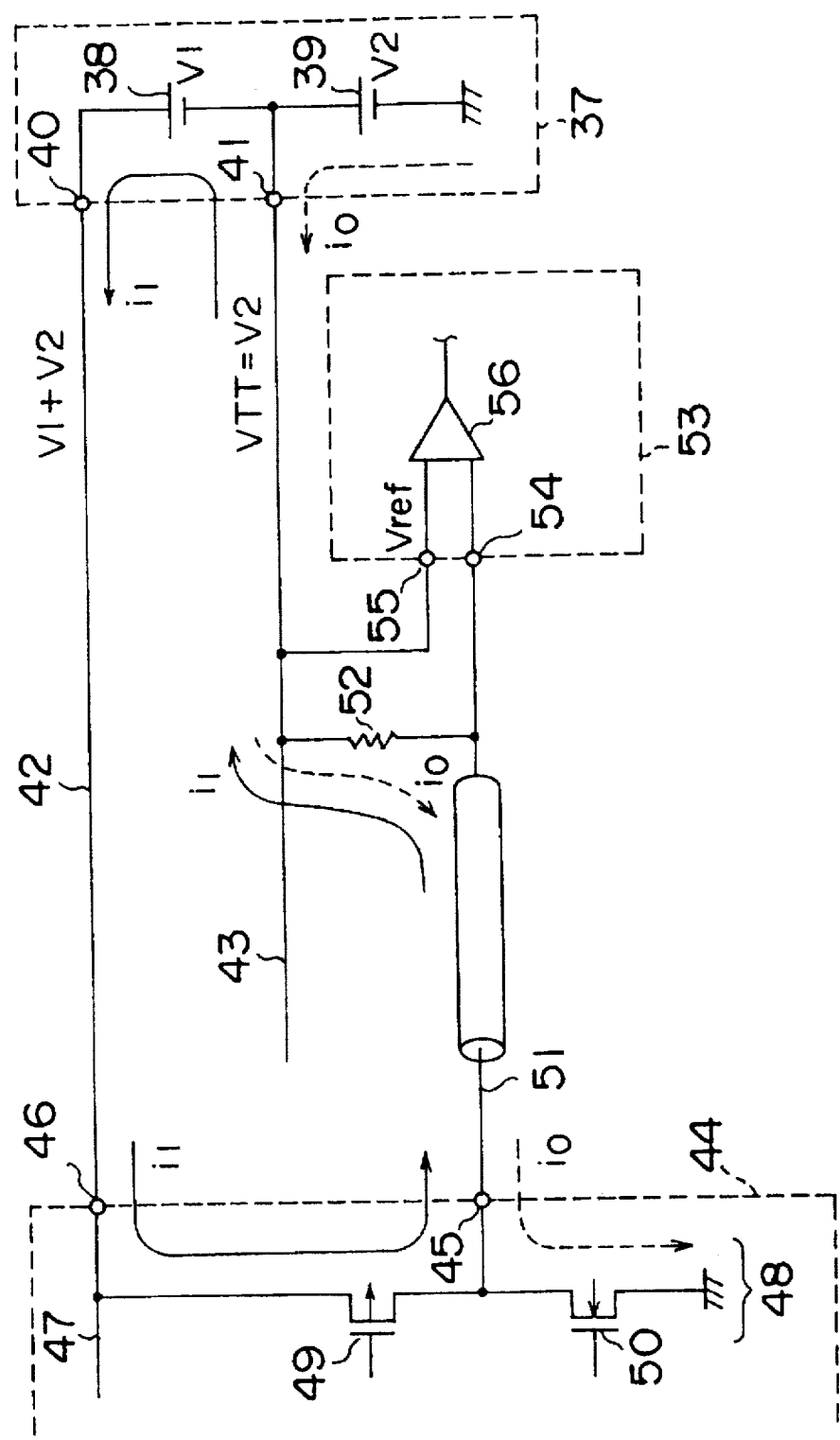
FIG. 4 is a circuit diagram of an electronic system based on a first aspect of the present invention.

FIG. 4 is a circuit diagram of an electronic system based on a first aspect of the present invention. The electronic system shown in FIG. 4 includes a voltage generating circuit 37, which includes a voltage generating circuit 38 for generating a voltage V1, a voltage generating circuit 39 for generating a voltage V2, and voltage output terminals 40 and 41. The voltage generating circuits 38 and 39 are connected in series. The voltages V1 and V2 generated by the circuits 38 and 39 are applied to the voltage output terminals 40 and 41, respectively.

A power supply line 42 carries a power supply voltage equal to V1+V2 generated by the voltage generating circuit 37. A termination voltage line 43 carries a termination voltage VTT equal to the voltage V2 output by the voltage generating circuit 37. An integrated circuit 44 performs inputting and outputting of signals via a signal input/output terminal 45. The integrated circuit 44 has a power supply voltage input terminal 46, which receives the power supply voltage V1+V2, and a power supply line 47 which supplies the voltage V1+V2 as a power supply voltage. Further, the integrated circuit 44 has a push-pull-type output circuit 48. The push-pull-type output circuit 48 includes a p-channel insulation gate type field effect transistor 49 functioning as a pull-up element, and an n-channel insulation gate type field effect transistor 50 functioning as a pull-down element.

Further, the system shown in FIG. 4 includes a bus line forming a signal transmission path, and a termination resistor 52 which terminates the bus line 51. The system includes an integrated circuit 53, which performs inputting and outputting of signals. The integrated circuit 53 has a signal input terminal 54 which inputs signals, a reference voltage input terminal 55 to which the voltage V2 output from the voltage generating circuit 37 is applied, and an input circuit 56.

In the system shown in FIG. 4, the output circuit 48 is supplied with the voltage V1+V2 as the power supply voltage, and the termination resistor 52 is supplied with the voltage V2 as the termination voltage VTT. Hence, it is possible to transmit a signal having a center voltage equal to V2. When the voltages V1 and V2 are set equal to each other, the termination voltage VTT can be set equal to half of the voltage V1+V2.

When the transistor 49 is turned OFF and the transistor 50 is turned ON, the output of the output circuit 48 is switched to the low level. In this case, a current $i_0$ flows, in the following order, in a closed circuit made up of the voltage generating circuit 39, the termination voltage line 43, the termination resistor 52, the bus line 51, the n-channel transistor 50, the ground, and the voltage generating circuit 39. Hence, the voltage of the voltage output terminal 41 is maintained at the voltage V2.

When the transistor 49 is turned ON and the transistor 50 is turned OFF, the output of the output circuit is switched to the high level. In this case, a current $i_1$ flows, in the following order, in a closed circuit made up of the voltage generating circuit 38, the power supply line 42, the transistor 49, the bus line 51, the termination resistor 52, and the voltage generating circuit 38. Hence, the voltage of the voltage output terminal 41 is maintained at the voltage V2.

In the way as described above, according to the first aspect of the present invention, since the voltage generating circuit 37 is made up of the voltage generating circuits 38 and 39 connected in series, the voltage output terminal 41 can be maintained at the voltage V2 even when a current enters the voltage generating circuit 37, so that the stability in which the termination voltage VTT is equal to the voltage V2 can be ensured. Further, when the bus line 51 does not transmit any signal, no current flows in the termination resistor 52, whereby the power consumption can be reduced. Furthermore, the termination voltage VTT can be used as the reference voltage Vref with respect to the integrated circuits 44 and 53. Hence, it is possible to coincide the reference voltage Vref with the termination voltage VTT and prevent an occurrence of an offset voltage and to ensure a sufficient operation margin.

Figure 5:
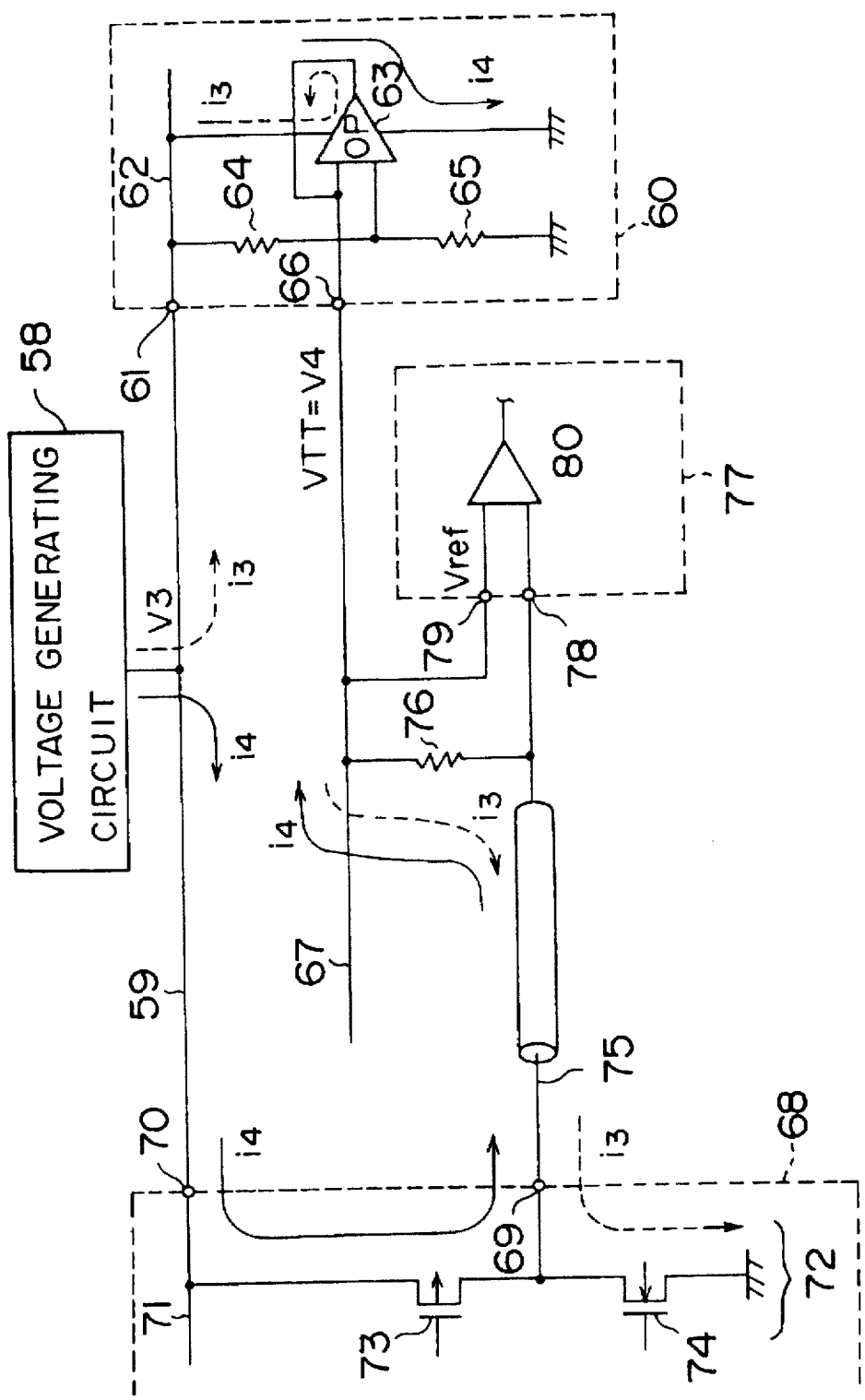
FIG. 5 is a circuit diagram of an electronic system based on a second aspect of the present invention.

FIG. 5 is a circuit diagram of an electronic system based on a second aspect of the present invention. The system includes a voltage generating circuit 58, which generates a voltage V3. A power supply line 59 for supplying the voltage V3 as the power supply voltage is connected to the circuit 58. The system includes a voltage generating circuit 60, which generates a voltage V4. The circuit 60 includes a power supply voltage input terminal 61 receiving the voltage V3, a power supply line 62 and an operational amplifier 63. Further, the voltage generating circuit 60 includes voltage dividing resistors 64 and 65, which divide the voltage V3. Furthermore, the voltage generating circuit 60 includes a voltage output terminal 66 via which the voltage V4 is output, and a termination voltage line 67 for supplying the voltage V4 output from the voltage generating circuit 60 as the termination voltage VTT.

In the voltage generating circuit 60, the voltage V3 is divided by the resistors 64 and 65 to thereby generate a divided voltage applied to the first input terminal of the operational amplifier 63. The output of the operational amplifier 63 is fed back to the second input terminal thereof. Hence, the second input terminal, that is, the voltage output terminal 66 is supplied with the same voltage V4 as the divided voltage divided by the resistors 64 and 66.

The system includes an integrated circuit 68, which has a signal input/output terminal 69 via which signals are input and output, a power supply voltage input terminal 70 via which the voltage V3 is received as the power supply voltage, a power supply line 71 via which the voltage V3 is supplied as the power supply voltage, and a push-pull-type output circuit 72. The push-pull-type output circuit 72 includes a p-channel insulation gate type field effect transistor 73 functioning as a pull-up element, and an n-channel insulation gate type field effect transistor 74 functioning as a pull-down element.

Further, there are provided a bus line 75 serving as a signal transmission path, and a termination resistor 76 which terminates the bus line 75. The system further includes an integrated circuit 77 via which signals are input and output. The circuit 77 includes a signal input terminal 78 via which signals are input, a reference voltage input terminal 79 via which the voltage V4 output by the voltage generating circuit 60 is supplied as the reference voltage Vref, and an input circuit 80.

Assuming that the resistance values of the resistors 64 and 65 are respectively denoted as $R_{64}$ and $R_{65}$, the termination voltage VTT is written as $V3 \times R_{65}/(R_{64}+R_{65})$, so that a small-amplitude signal having the center voltage equal to the termination voltage VTT can be transmitted. When $R_{64}=R_{65}$, the termination voltage VTT can be set equal to $V3/2$.

When the transistor 73 is turned OFF and the transistor 74 is turned ON, the output of the output circuit 72 is switched to the low level. In this case, a current $i_3$ flows, in the following order, in a closed circuit made up of the operational amplifier 63, the termination voltage line 67, the termination resistor 76, the bus line 75, the transistor 74, the ground, the voltage generating circuit 58, the power supply lines 59 and 62 and the operational amplifier 63.

When the transistor 73 is turned ON and the transistor 74 is OFF, the output of the output circuit 72 is switched to the high level. In this case, a current $i_4$ flows, in the following order, in a closed circuit made up of the voltage generating circuit 58, the power supply lines 59 and 71, the transistor 73, the bus line 75, the termination resistor 76, the termination voltage line 67, the operational amplifier 63, the ground and the voltage generating circuit 58.

As described above, the second aspect of the present invention is configured so that the voltage V4 equal to the termination voltage VTT is fed back by means of the operational amplifier 63. Hence even when a current is output or input via the voltage output terminal 66, the stability in which the termination voltage VTT is equal to V4 can be ensured.

Further, when no signal is transmitted via the bus line 75, no current flows in the termination resistor 76, so that the power consumption can be reduced. Furthermore, since the termination voltage VTT can be used as the reference voltage Vref for the integrated circuits 68 and 77, it is possible to coincide the reference voltage Vref with the termination voltage VTT and prevent an occurrence of an offset voltage and to ensure a sufficient operation margin.

A description will now be given of the first through ninth embodiments of the present invention with reference to FIG. 6 through FIG. 36.

First of all, the first embodiment of the present invention will be described with reference to FIGS. 6 through 14.

Figure 6:
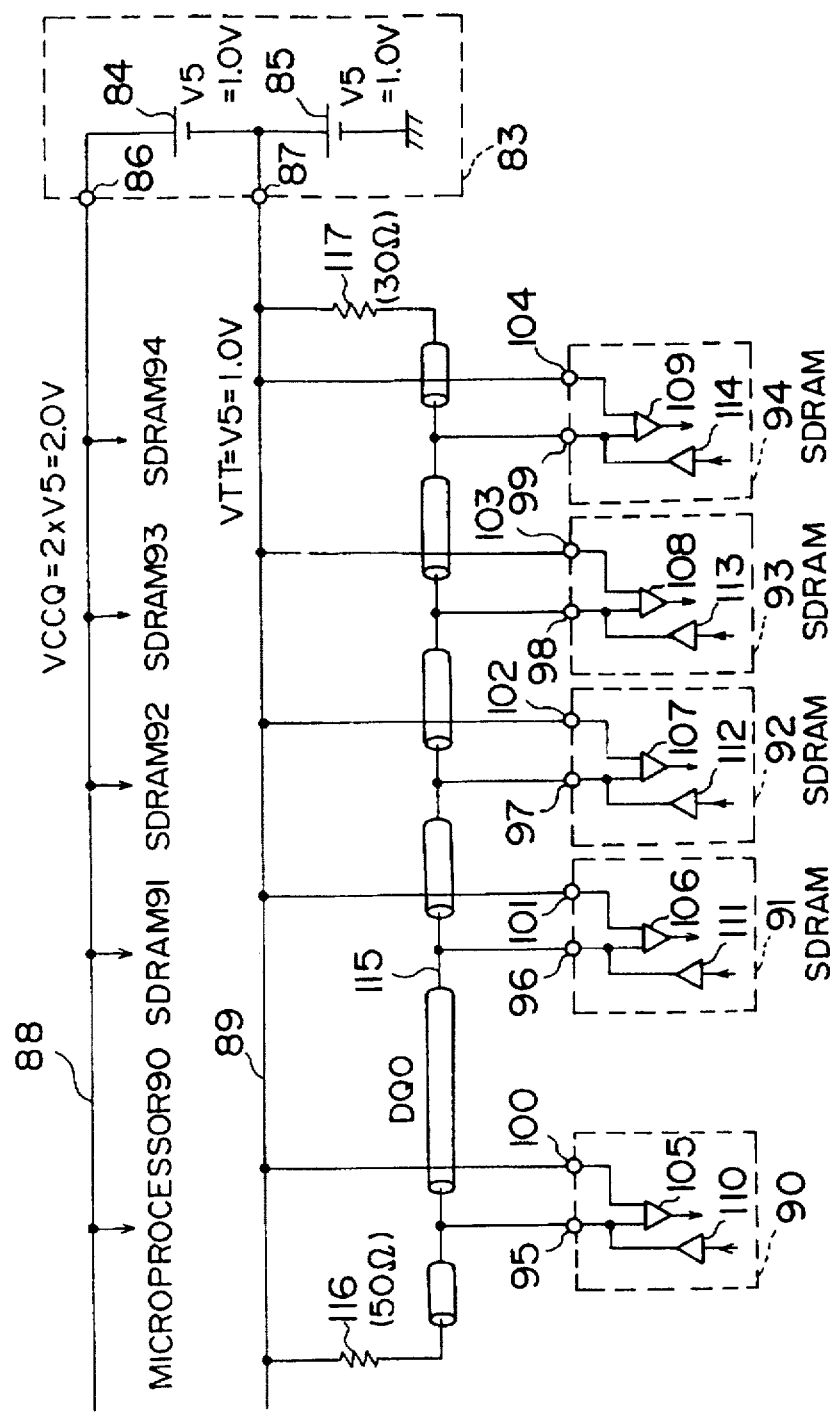
FIG. 6 is a circuit diagram of an essential part of a first embodiment of the present invention.

FIG. 6 is a circuit diagram of the essential part of the first embodiment of the present invention. An electronic system shown in FIG. 6 includes a voltage generating circuit 83, which includes voltage generating circuits 84 and 85 and voltage output terminals 86 and 87. Each of the voltage generating circuits 84 and 85 generates a voltage V5 equal to, for example, 1.0 V. The voltage generating circuits 84 and 85 are connected in series. A voltage equal to $2 \times V5$ (=2.0 V) is output, as a power supply voltage VCCQ, via the voltage output terminal 86, and the voltage V5 (=1.0 V) is output, as the termination voltage VTT, via the voltage output terminal 87.

The electronic system shown in FIG. 6 further includes a VCCQ power supply line 88, which supplies the power supply voltage VCCQ (=$2 \times V5$) output from the voltage generating circuit 83, and a termination voltage line 89, which supplies the termination voltage VTT (=5 V) output from the voltage generating circuit 83. Furthermore, the electronic system includes a microprocessor 90 and SDRAM devices 91–94, each of which devices performs an input/output operation on data of eight bits DQ0–DQ7. Reference numbers 95–99 indicate data input/output terminals via which data is input and output. Reference numbers 100–104 indicate reference voltage input terminals via which the reference voltage Vref is received. In the first embodiment of the present invention, the termination voltage VTT is supplied, as the reference voltage Vref, to the microprocessor 90 and the SDRAM devices 91–94.

The microprocessor 90 includes an input circuit 105 and a push-pull-type output circuit 110, which circuits handle data DQ0. The SDRAM devices 91–94 include input circuits 106–109 and push-pull-type output circuits 111–114, these input and output circuits handling data DQ0. A bus line 115 is provided for transmitting data DQ0. Termination resistors 116 and 117 are connected to the two ends of the bus line 115. For example, the termination resistor 116 has a resistance of 50 Ω, and the termination resistor 117 has a resistance of 30 Ω. The input and output circuits of the microprocessor 90 and the SDRAM devices 91≧94 have an identical circuit configuration, and only the input and output circuit of the microprocessor 90, which is a part thereof, is illustrated in FIG. 7.

Figure 7:
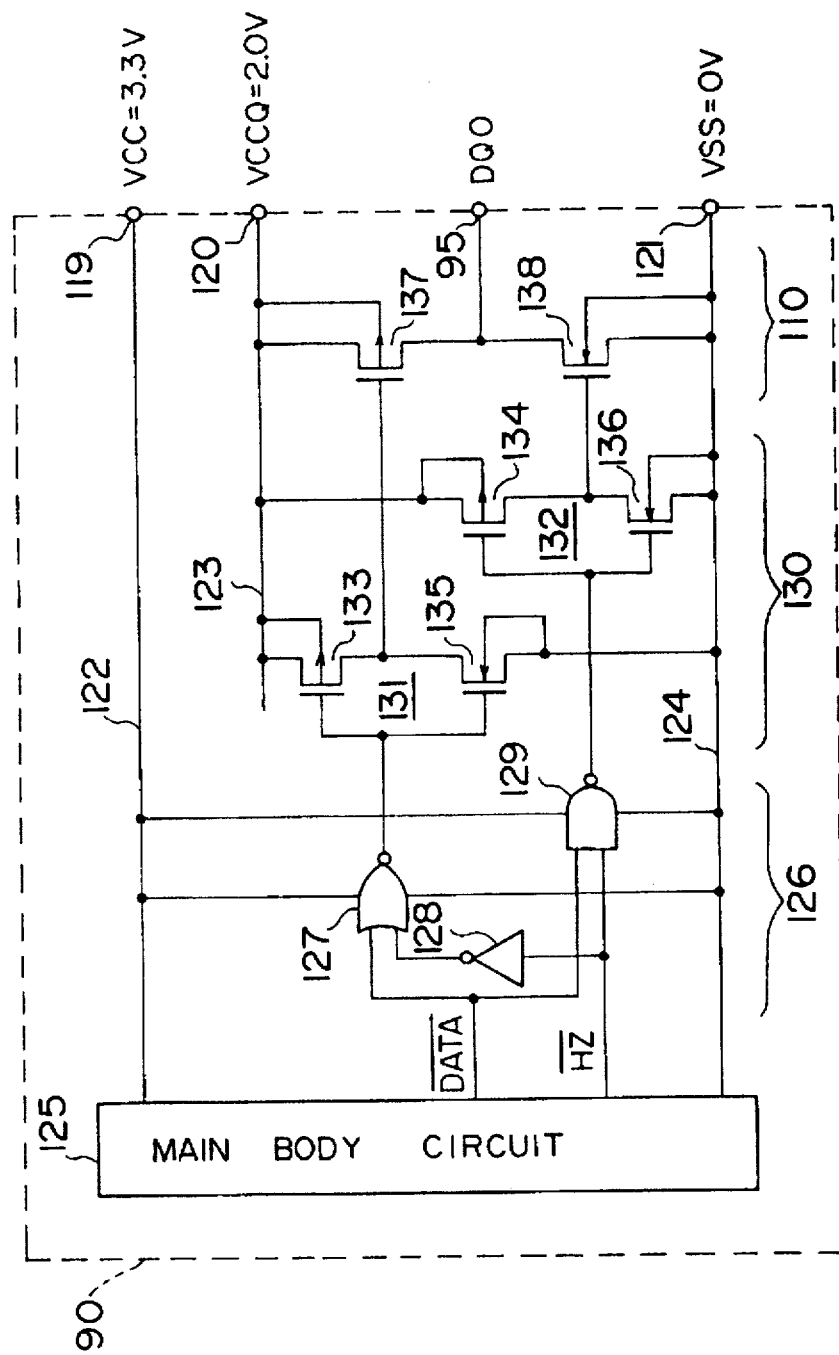
FIG. 7 is a circuit diagram of part of a microprocessor shown in FIG. 6.

Referring to FIG. 7, the microprocessor 90 has a VCC power supply terminal 119 to which the power supply voltage VCC (for example, 3.3 V) is applied, a VCCQ power supply terminal 120 to which the power supply voltage VCCQ (2.0 V, for example) is applied, and a VSS power supply terminal 121 to which the ground voltage VSS (0 V) is applied. The microprocessor 90 has a VCC power supply line 122 connected to the VCC power supply terminal 119, a VCCQ power supply line 123 connected to the VCCQ power supply terminal 120, and a VSS power supply line 124 connected to the VSS power supply terminal 121.

The microprocessor 90 has a main body circuit 125 to which the power supply voltage VCC is applied. The symbol/DATA ("/" is equivalent to the symbol "bar" in FIG. 7) denotes data output from the main body circuit 125, and the symbol/HZ denotes a control signal determining whether the output state should be set to a high-impedance state. An output control circuit 126 is supplied with the power supply voltage VCC, and is made up of a NOR circuit 127, an inverter 128 and a NAND circuit 129. An output driving circuit (pre-driver) 130 is supplied with the power supply voltage VCCQ, and is made up of enhancement-type p-channel MOS transistors 133 and 134, and enhancement-type n-channel MOS transistors 135 and 136. The output circuit 110 is made up of an enhancement-type pMOS transistor 137 serving as a pull-up element, and an enhancement-type nMOS transistor 138 serving as a pull-down element.

In a case where the power supply voltage VCC is supplied, as a back bias voltage, to an N-type well in which the pMOS transistors 133, 134 and 137 are formed, a current flows to the N-type well from the sources of the pMOS transistors 133, 134 and 137 when the power supply voltages VCC and VCCQ become 0 V and 2 V, respectively at the time of power on or off. The above current may damage the pMOS transistors 133, 134 and 137.

With the above in mind, in the first embodiment of the present invention, the power supply voltage VCCQ is applied as the back bias voltage to the N-type well in which the pMOS transistors 133, 134 and 137 are formed. Even when the power supply voltages VCC and VCCQ become 0 V and 2 V, respectively, at the time of power on or off, the current is prevented from flowing from the sources of the pMOS transistors 133, 134 and 137 to the N-type well in which the pMOS transistors 133, 134 and 137 are formed. As a result, it is possible to prevent the pMOS transistors 133, 134 and 137 from being damaged.

Figure 8:
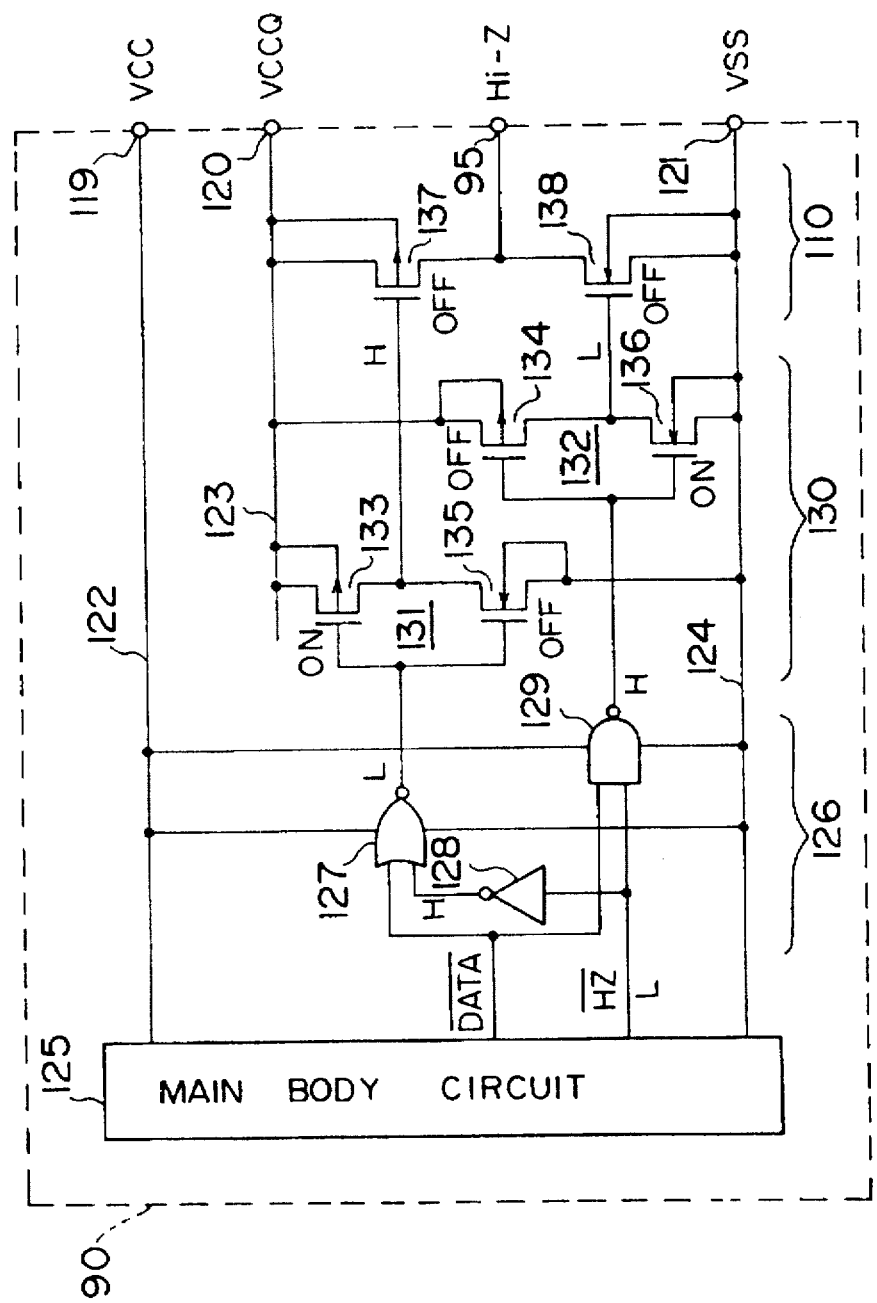
FIGS. 8, 9 and 10 are circuit diagrams showing the operation of the circuit shown in FIG. 7.

Referring to FIG. 8, when the control signal/HZ is low, the output level of the inverter 128 is high and the output level of the NOR circuit 127 is low. Hence, the pMOS transistor 133 is ON and the nMOS transistor 135 is OFF. Further, the output level of an inverter 131 is high, and thus the pMOS transistor 137 is OFF. Further, the output level of the NAND circuit 129 is high, and the pMOS transistor 134 is OFF. The nMOS transistor 136 is ON, and the output level of an inverter 132 is low. The nMOS transistor 138 is OFF. Hence, in the above case, the output circuit 110 is in the high-impedance state (Hi-Z).

Figure 9:
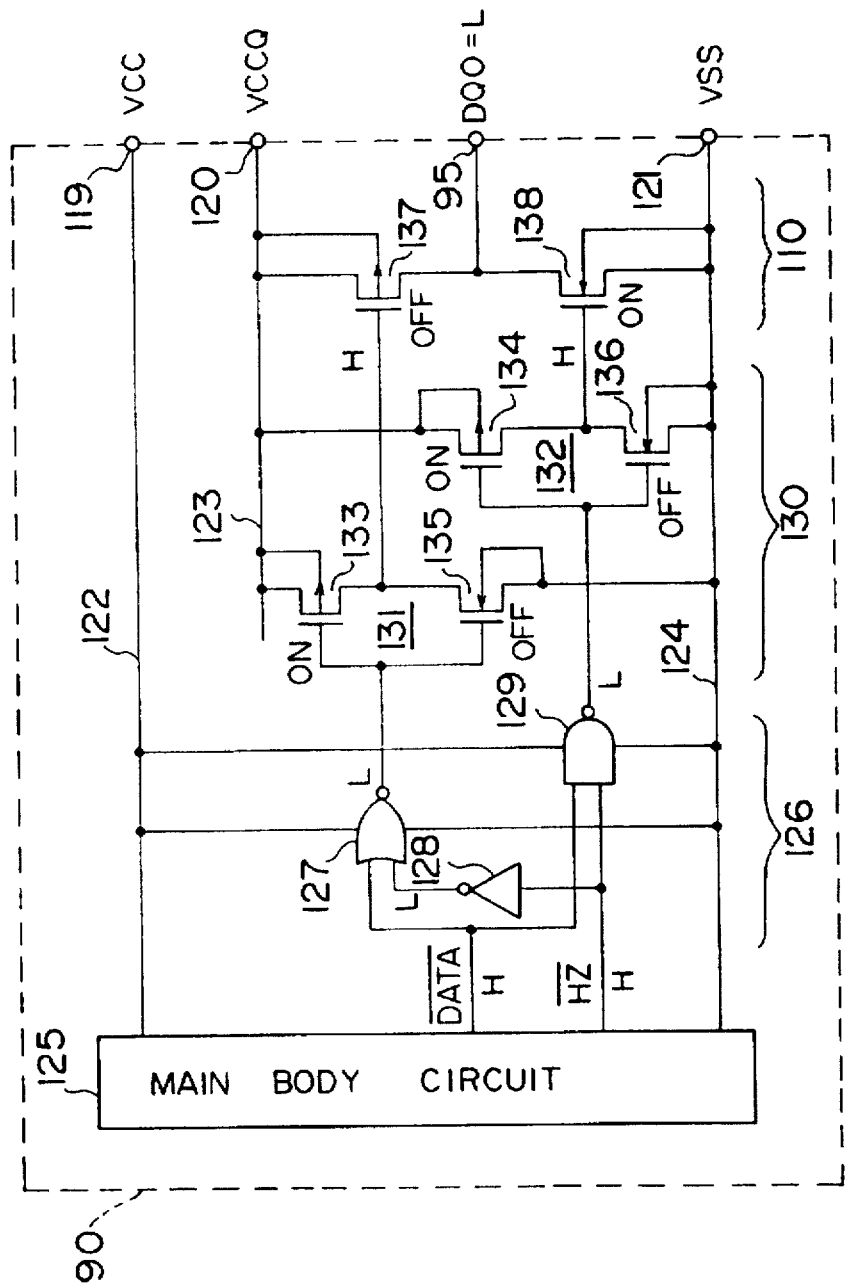

As shown in FIG. 9, when the control signal/HZ is high and data/DATA is high, the output level of the NOR circuit 127 is low. Hence, the pMOS transistor 133 is ON and the nMOS transistor 135 is OFF. The output level of the inverter 131 is high, and the pMOS transistor 137 is OFF. The output level of the NAND circuit 129 is low, and the pMOS transistor 134 is ON. The nMOS transistor 136 is OFF, and the output level of the inverter 132 is high. The nMOS transistor 138 is ON. Hence, the signal DQ0 output from the output circuit 110 is low.

Figure 10:
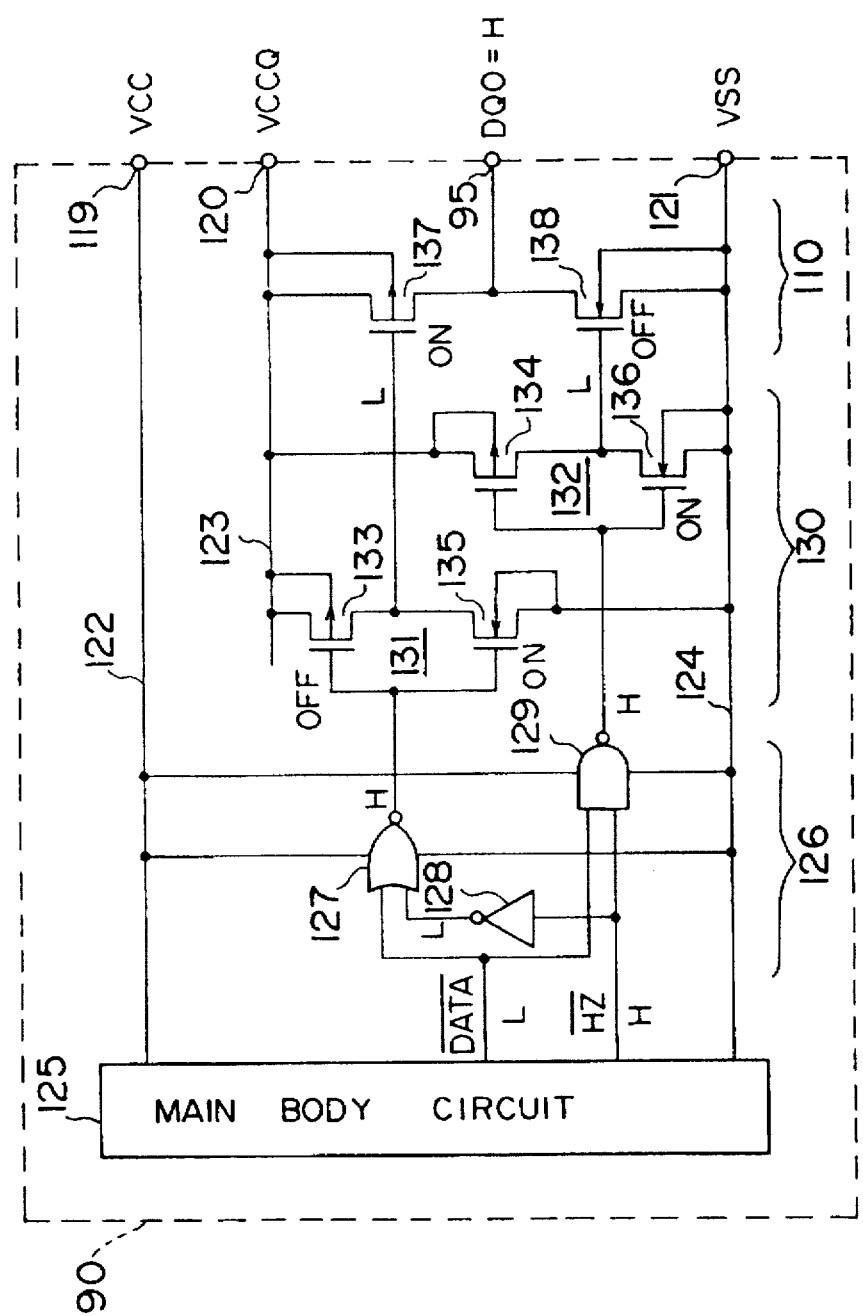

As shown in FIG. 10, when the control signal/HZ is high and the data/DATA is low, the output level of the NOR circuit 127 is high. Hence, the pMOS transistor 133 is OFF, and the nMOS transistor 135 is ON. The output level of the inverter 131 is low, and the pMOS transistor 137 is ON. The output level of the NAND circuit 129 is high, and the pMOS transistor 134 is OFF. The nMOS transistor 136 is ON, and the output level of the inverter 132 is low. The nMOS transistor 138 is OFF. Hence, in the above case, the signal DQ0 output from the output circuit 110 is high.

In the first embodiment of the present invention, the SDRAM devices 91–94 are connected to the bus line 115 at equal intervals, and there is provided only the bus line 115 between the microprocessor 90 and the DRAM device 91. Hence, when the characteristic impedance of the bus line 115 is denoted as Z0, the effective characteristic impedance of parts of the bus line 115 via which the SDRAM devices 91–94 are connected at equal intervals are less than that of parts thereof to which the SDRAM devices 91–94 are not connected.

Generally, the characteristic impedance Z0 of the bus line 115 is represented as $Z0=(L/C)^{1/2}$ where L is the wiring inductance per unit length, and C is the wiring capacitance per unit length. For example, typically L=250 nH/m, and C=100 pF. In this case, $Z0=(250\times10^{-9}/100\times10^{-12})^{1/2}=50$ Ω.

On the other hand, in the case where the SDRAM devices 91–94 are connected, their load capacitances (more particularly, capacitances of the input/output terminals 96–99) are added. If the SDRAM devices 91–94, each having a capacitance of 3.75 pF, are connected to the bus line 115 at equal intervals of 6.25 mm, 160 SDRAM devices are connected to the bus line per meter. Assuming that the capacitance per meter is denoted as CL, CL=3.75 pF×160 $m^{-1}$=600 pF/m. In this case, the effective characteristic impedance ZL of the bus line 115 is represented as $ZL=[L/(C+CL)]^{1/2}$, and is equal to 18.9 Ω $(=[250\times10^{-9}/(100\times10^{-12}+600\times10^{-12})])$. This value of the effective characteristic impedance is much less than the characteristic impedance Z0 (=50 Ω) obtained when there is no load).

In order to strictly establish the impedance matching to thereby avoid any reflection of signals, the resistance values of the termination resistors 116 and 117 should be set equal to the effective characteristic impedance ZL, that is, 18.9 Ω. However, when the resistance values of the termination resistors 116 and 117 are 18.9 Ω, the load resistance viewed from the driving side is 9.45 Ω. Further, the input circuits 105–109 cannot operate stably and provide the sufficient amplitude unless the output circuits 110–114 have a current driving ability of approximately 20 mA.

With the above in mind, according to the first embodiment of the present invention, the value of the termination resistor 117 around which the SDRAM devices 91–94 are concentrated is omitted from the strict matching condition, and is made greater than the effective characteristic impedance ZL. The above value is limited to the characteristic impedance Z0 of the bus line 115 with no load connected thereto, more specifically, 30 Ω.

On the other hand, there are not many loads connected to the microprocessor 90. Hence, the value of the termination resistor 116 is set equal to 50 Ω, which is equal to the characteristic impedance of the bus line 115 obtained when there is no load. As a result, the load resistance viewed from the driving side is 18.7 Ω, which is equal to the parallel-connection value of 30 Ω and 50 Ω. In this case, the load resistance is greater than that obtained when a resistance of 30 Ω is simply connected on either side of the bus line 115

(the load resistance then being equal to 15 Ω). Hence, even when the output circuits 110–114 have a relatively low current driving capability, it is possible to obtain a large signal amplitude.

In the first embodiment of the present invention, the output circuits 110–114 of the microprocessor 90 and the SDRAM devices 91–94 are formed with the CMOS-type push-pull circuits to which the power supply voltage VCCQ is applied. Further, the termination voltage VTT is equal to VCCQ/2, and thus the signals can be transmitted in such a way that the center voltage is equal to the termination voltage VTT.

For example, if the output circuit 110 outputs the low-level output signal, a current flows in a closed circuit made up of the voltage generating circuit 85, the termination voltage line 89, the termination resistors 116 and 117, the bus line 115, the output circuit 110 (nMOS transistor 138), the ground and the voltage generating circuit 85 in the above order.

Alternatively, if the output circuit 110 outputs the high-level output signal, a current flows in a closed circuit made up of the voltage generating circuit 84, the VCCQ power supply line 88, the output circuit 110 (pMOS transistor 137), the bus line 115, the termination resistors 116 and 117 and the voltage generating circuit 84 in the above order.

As described above, according to the first embodiment of the present invention, since the voltage generating circuits 84 and 85 of the voltage generating circuit 83 are connected in series, the voltage of the voltage output terminal 87 is maintained at V5 equal to 1.0 V even if a current is output or input via the voltage output terminal 87. Hence, it is possible to ensure the stability that the termination voltage VTT is equal to the voltage V5 equal to 1.0 V.

Further, no currents flow in the termination resistors 116 and 117 when no signal is transmitted via the bus line 115. Hence, power consumption can be reduced.

Furthermore, according to the first embodiment of the present invention, the termination voltage VTT is used as the reference voltage Vref which is needed in the microprocessor 90 and the SDRAM devices 91–94. Hence, the coincidence of the reference voltage Vref and the termination voltage VTT can be accomplished and no offset voltage is generated. Hence, a sufficient operation margin can be ensured.

Moreover, according to the first embodiment of the present invention, the power supply voltage VCCQ is supplied as the power supply voltage necessary for the output driving circuit 130 to drive the output circuits 110–114. Hence, it is possible to drive the pMOS transistor serving as the pull-up element and the nMOS transistor serving as the pull-down element in a balanced way.

Figure 11:
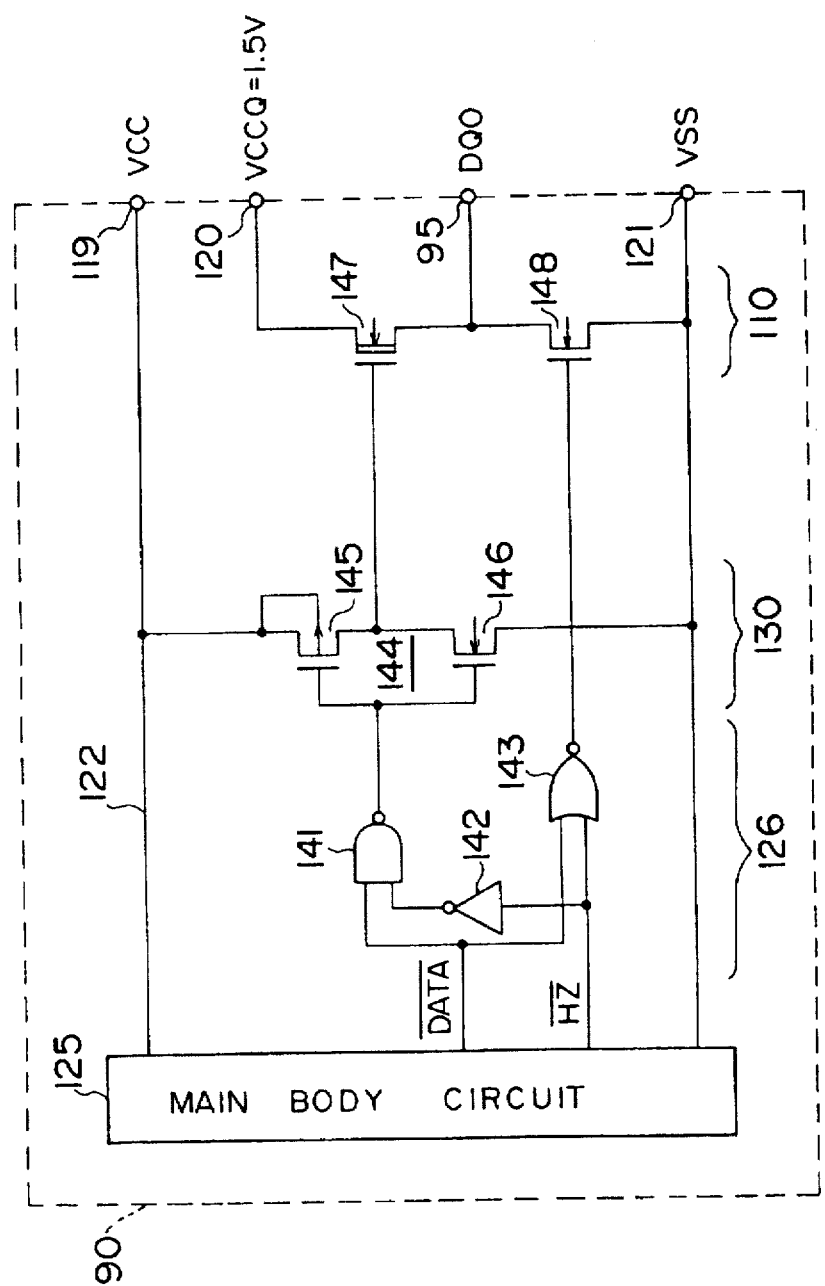
FIG. 11 is a circuit diagram of another example of part of the microprocessor shown in FIG. 6.

The output control circuit 126, the output driving circuit 130 and the output circuit 110 in the microprocessor 90 can be configured as shown in FIG. 11. The circuit shown in FIG. 11 can be applied to the SDRAM devices 91–94 as well.

In FIG. 11, the output control circuit 126 is made up of a NAND circuit 141, an inverter 142 and a NOR circuit 143. The output driving circuit 130 is a CMOS type inverter to which the power supply voltage VCC is applied. The CMOS inverter is made up of an enhancement type pMOS transistor 145 and an enhancement type nMOS transistor 146. The output circuit 110 is made up of a depletion type nMOS transistor 147 functioning as a pull-up element and an enhancement type nMOS transistor 148 functioning as a pull-down element. The output circuit 110 is intended to improve the driving ability of the pull-up element.

In the above case, when the low level of the data signal DQ0 is set equal to $V_{OL}$ in order to make it possible to cut off the depletion type nMOS transistor 147, it is necessary to set the threshold voltage $V_{THD}$ of the nMOS transistor 147 to $-V_{OL} \leq V_{THD}$. For example, in the case where the termination voltage VTT is equal to 1.0 V, when the signal DQ0 is within the range of ±0.25 V (driving current is 10 mA), $V_{OL}=1-0.25=0.75$ V. In this case, the threshold voltage $V_{THD}$ is equal to or greater than −0.75 V.

Figure 12:
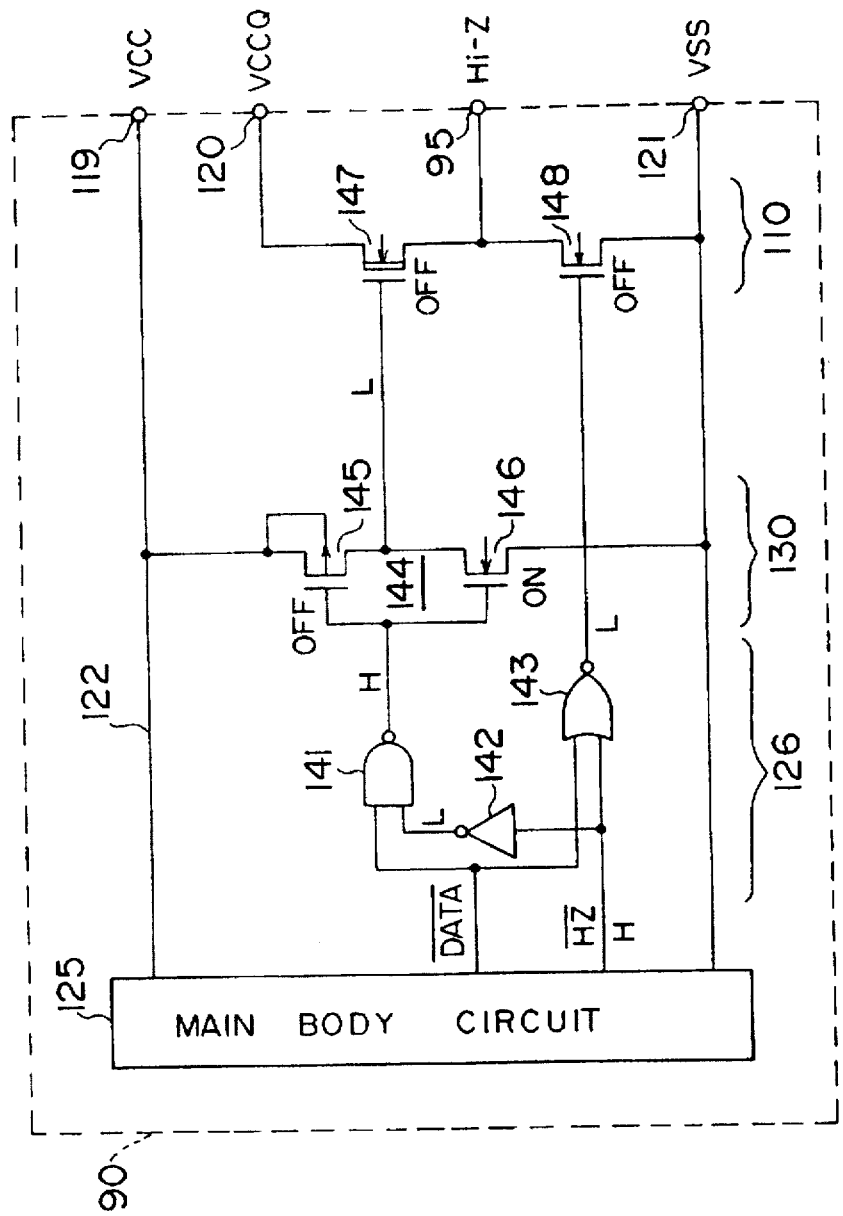
FIGS. 12, 13 and 14 are circuit diagrams of the circuit shown in FIG. 11.

As shown in FIG. 12, when the control signal/HZ is at the high level, the output level of the inverter 142 is low, and the output level of the NAND circuit 141 is high. The pMOS transistor 145 is OFF, and the nMOS transistor 146 is ON. The output level of the inverter 144 is low, and the nMOS transistor 147 is OFF. Further, the output level of the NOR circuit 143 is low, and the nMOS transistor 148 is OFF. In this case, the output circuit 110 is in the high-impedance state.

Figure 13:
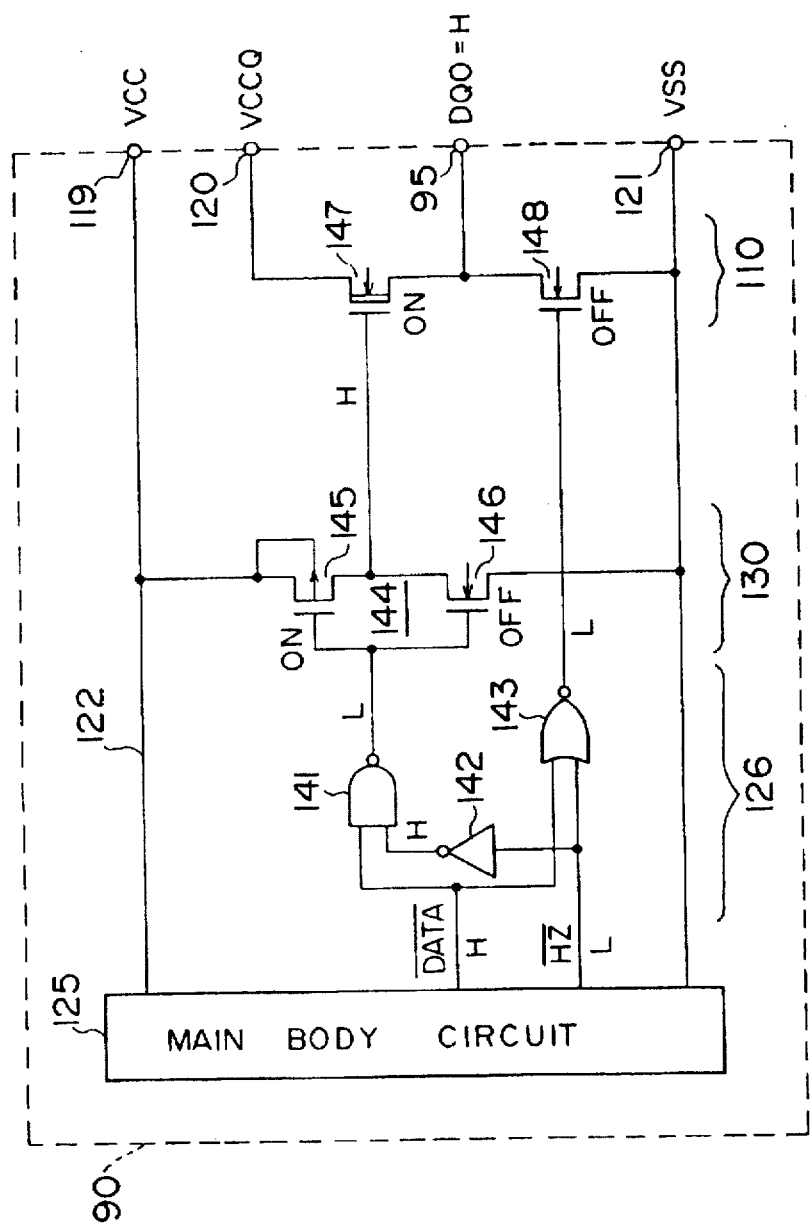

As shown in FIG. 13, when the control signal/HZ is low and the data/DATA is at the high level, the output level of the NAND circuit 141 is low, and the pMOS transistor 145 is ON. The nMOS transistor 146 is OFF, the output level of the inverter 144 is high, and the nMOS transistor 147 is ON. Further, the output level of the NOR circuit 143 is low, and the nMOS transistor 148 is OFF. In this case, the signal DQ0 output from the output circuit 110 is at the high level.

Figure 14:
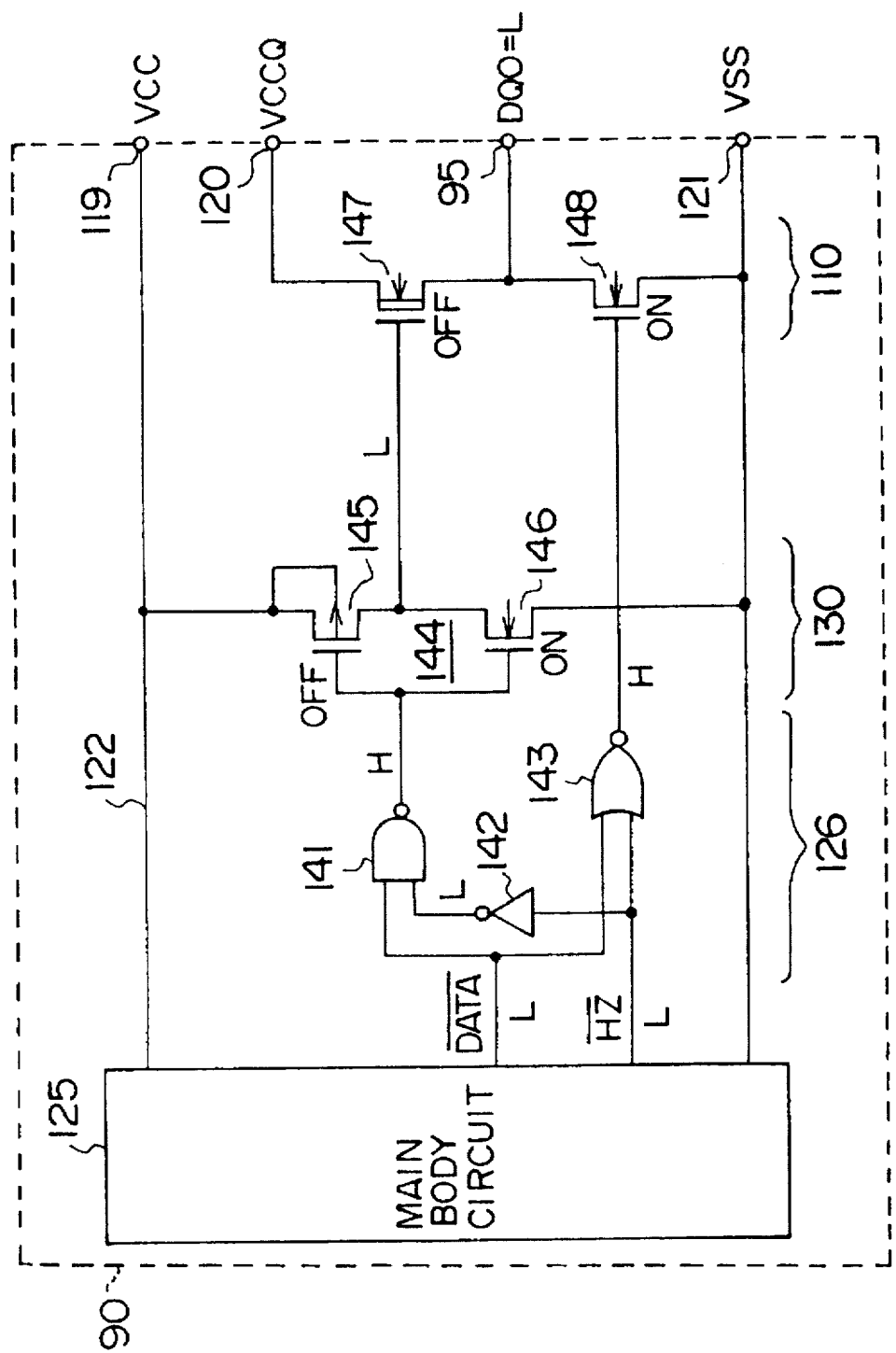

As shown in FIG. 14, when the control signal/HZ is at the low level and the data/DATA is at the low level, the output level of the NAND circuit 141 is high, and the pMOS transistor 145 is OFF. The nMOS transistor 146 is ON, and the output level of the inverter 144 is low. The nMOS transistor 147 is OFF. Further, the output level of the NOR circuit 143 is high, and the nMOS transistor 148 is ON. In this case, the signal DQ0 output from the output circuit 110 is at the low level.

The nMOS transistor 147 may be replaced by an enhancement-type nMOS transistor. In this case, unless the threshold voltage of the enhancement type nMOS transistor is lower than the threshold voltage of the nMOS transistor 148, the advantage of an increase in the driving ability may be canceled by a decrease in the threshold voltage.

A description will now be given of an electronic system according to a second embodiment of the present invention with reference to FIGS. 15 through 19.

Figure 15:
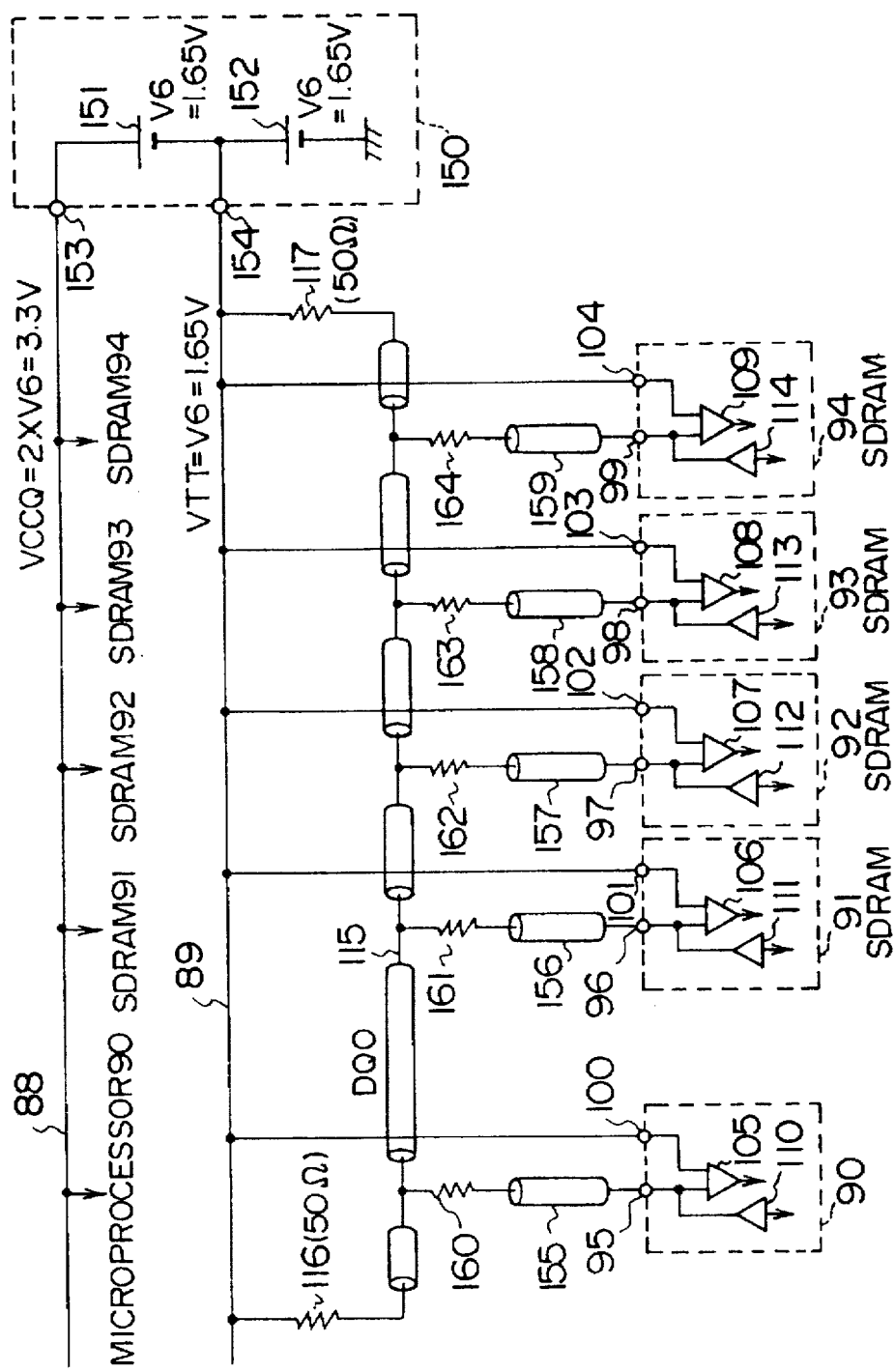
FIG. 15 is a circuit diagram of an essential part of a second embodiment of the present invention.

FIG. 15 is a circuit diagram of the essential part of the electronic system according to the second embodiment of the present invention. The electronic system shown in FIG. 15 has a voltage generating circuit 150, which generates voltages different from those generated by the voltage generating circuit 83 shown in FIG. 6. The voltage generating circuit 150 has voltage generating circuits 151 and 152, each generating a voltage V6 (1.65 V, for example), and voltage output terminals 153 and 154. More specifically, the voltage generating circuits 151 and 152 are connected in series. A voltage 2×V6 (=3.3 V) is output, as the power supply voltage VCCQ, to the voltage output terminal 153, and the voltage V6 (=1.65 V) is output, as the termination voltage VTT, to the voltage output terminal 154.

The bus line 115 shown in FIG. 15 has branched parts 155–159, that is, stubs. Resistors 160–164 are connected between branch points on the bus line 115 and the stubs 155–159.

Figure 16:
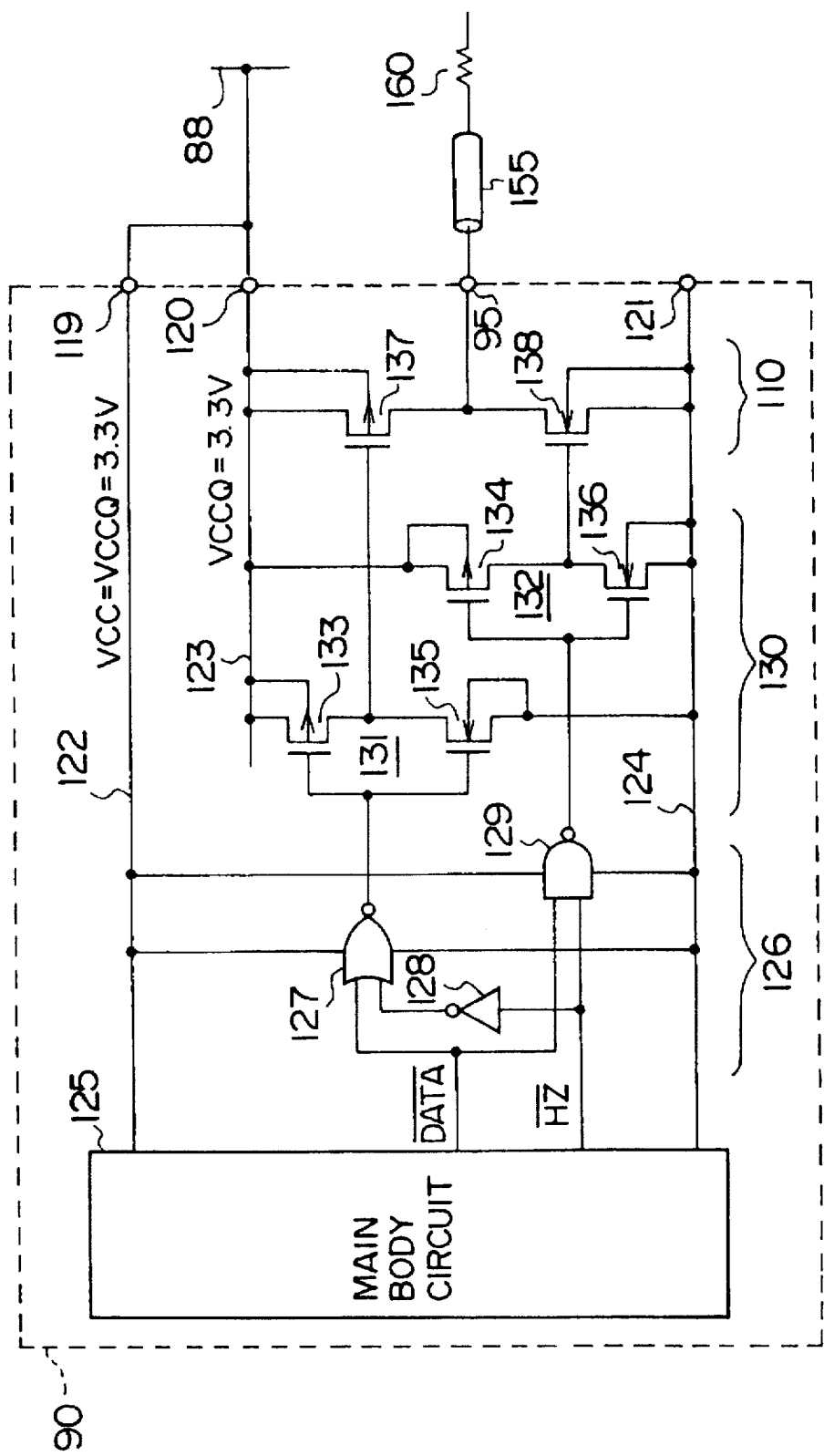
FIG. 16 is a circuit diagram of part of a microprocessor shown in FIG. 15.

In the second embodiment of the present invention, the power supply voltage VCCQ supplied via the VCCQ power supply line 88 is supplied to the VCC power supply terminals and the VCCQ power supply terminals of the microprocessor 90 and the SDRAM devices 91–94. The VCC power supply terminals of the microprocessor 90 and the SDRAM devices 91–94 are connected to the VCCQ power supply terminals outside thereof. FIG. 16 shows such a connection for the microprocessor 90.

As shown in FIG. 16 as an example for the microprocessor 90, according to the second embodiment of the present invention, not only the main body circuit 125 and the output control circuit 126 but also the output driving circuit 130 and the output circuit 110 are driven by the power supply voltage VCCQ equal to 3.3 V. In this case, the gate of the nMOS transistor 138 is also supplied with the power supply voltage VCCQ of 3.3 V, so that the inner resistance of the nMOS transistor 138 is decreased and an excessive current flows in the output.

With the above in mind, according to the second embodiment of the present invention, the resistor 160 is connected between the branching point on the bus line 115 and the stub 155 in order to select an appropriate inner resistance value of the output circuit 110 and prevent changes in the driving currents with respect to the termination resistors 116 and 117. Similarly, the resistors 161–164 are connected between the branch points on the bus line 115 and the stubs 156–159.

Figure 17:
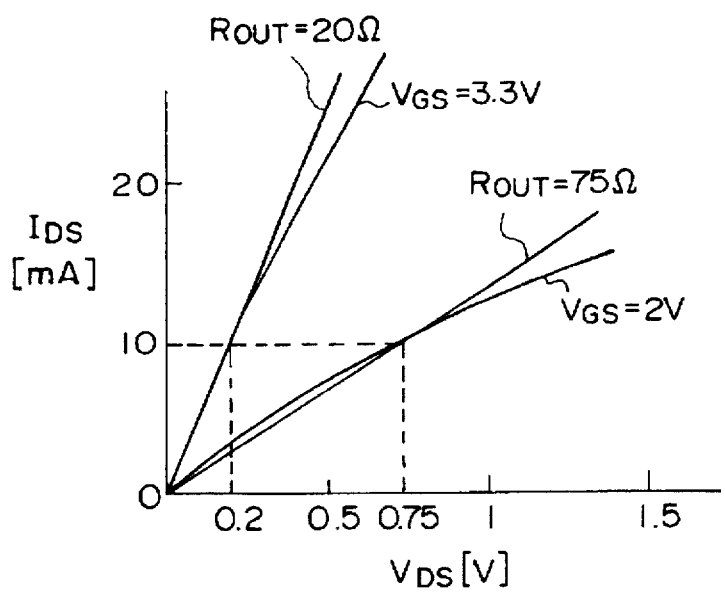
FIG. 17 is a graph of the static characteristic of an nMOS transistor shown in FIG. 16.
Figure 18:
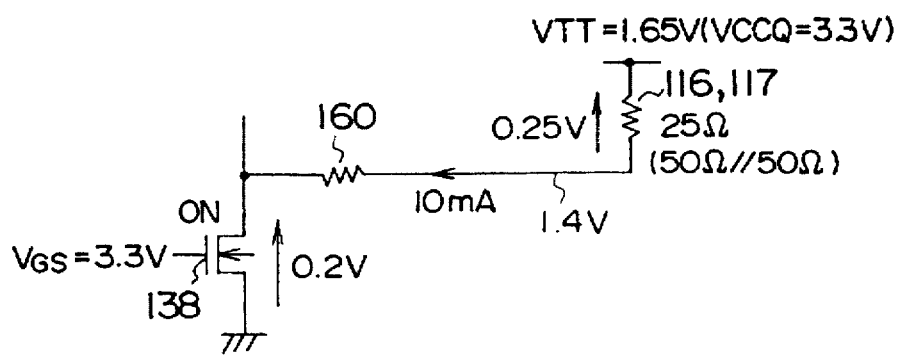
FIG. 18 is a circuit diagram of part of the second embodiment of the present invention.

FIGS. 17 and 18 show how to determine the resistance values of the resistors 160–164. More particularly, FIG. 17 is a graph of the static characteristic of the nMOS transistor 138 in the output circuit 110 of the microprocessor 90, and FIG. 18 shows part of the configuration shown in FIG. 15. In the second embodiment of the present invention, the nMOS transistor 138 is configured so as to have a static characteristic as shown in FIG. 17. In the case where the nMOS transistor 138 is turned ON with the VCCQ equal to 3.3 V, the gate-source voltage $V_{GS}$ thereof is equal to 3.3 V, while the drain-source voltage $V_{DS}$ thereof is equal to 0.2 V.

Assuming that the driving current for the nMOS transistor 138 is equal to 10 mA and the resistance values of the termination resistors 116 and 117 are equal to 50 Ω, the load resistance value is equal to 25 Ω, and the voltage drops developing across the termination resistors 116 and 117 are equal to 0.25 V, as shown in FIG. 18. As a result, the voltage of the bus line 115 becomes equal to 1.4 V, which shows that the resistance value of the resistor 160 is determined as 120 Ω (=(1.4−0.2)/10×10$^{-3}$). The resistance values of the resistors 161–164 are selected in the same way as the resistor 160.

As described above, by providing the resistors 160–164 between the bus line 115 and the stubs 155–159, it is possible to minimize the influence of the signal reflection caused in the stubs 155–159 to the bus line 115.

In the above case, the characteristic impedances of the stubs 155–159 can be determined as follows. First of all, the resistance values of the resistors 160–164 are set equal to 120 Ω taking into consideration the driving ability of the output circuit. Since the characteristic impedance of the bus line 115 is 50 Ω, two resistors having resistances of 50 Ω connected in parallel are seen when viewing the bus line 115 from the branch node. That is, a characteristic impedance of 25 Ω can be seen as a load.

Alternatively, when the resistors 160–164 respectively have a resistance of 120 Ω, an impedance of 145 Ω (=120 Ω+25 Ω) can be seen when viewing the bus line 115 from the stubs 155–160. Hence, the characteristic impedances of the stubs 155–159 are appropriately set equal to 145 Ω. It has been confirmed through a simulation that the above value causes no problems even when it varies within the range of ±50%. When the above value of the characteristic impedance of each stub is selected, the signal is input to the stubs 155–159 from the bus line 115, the input/output terminals 95–99 have no terminations. Hence, the input signal is totally reflected (100% reflection). However, reflection does not take place when the reflected signal is transmitted to the resistors 160–164 because the impedance match is established. That is, the signal is absorbed by the termination resistors 116 and 117 after it comes in the bus 115. Hence, thereafter, the resonance phenomenon does not occur after the stubs 155–159, and good signal transmissions can be carried out.

Figure 19:
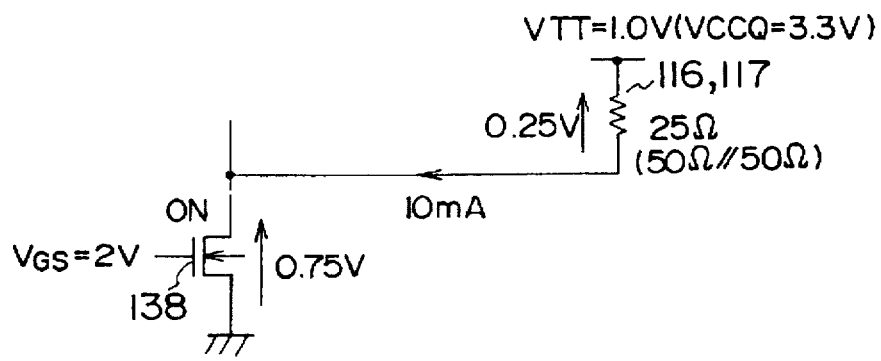
FIG. 19 is a circuit diagram of part of the first embodiment of the present invention.

As in the case of the first embodiment of the present invention, when turning ON the nMOS transistor 138 with VCCQ equal to 2.0 V, the gate-source voltage $V_{GS}$ is equal to 2.0 V, while the drain-source voltage $V_{DS}$ is equal to 0.75 V. Sine the driving current for the nMOS transistor 138 is equal to 10 mA, the resistances of the termination resistors 116 and 117 are equal to 50 Ω, and the load resistance is 25 Ω, the voltage drops developing across the termination resistors 116 and 117 become equal to 0.25 V as shown in FIG. 19. In this case, the resistor 160 is not needed. That is, when decreasing the power supply voltage VCCQ, the resistors 160–164 are needed no longer, and the number of parts can be reduced. However, the resonances caused in the stubs 155–159 cannot be suppressed by means of impedance matching. Hence, it is necessary to reduce the lengths of the stubs 155–159 as much as possible.

In the second embodiment of the present invention, the output circuits 110–114 of the microprocessor 90 and the SDRAM devices 91–94 are formed by the CMOS type push-pull circuits supplied with the power supply voltage VCCQ. Further, the termination voltage VTT is set to VCCQ/2. Hence, it is possible to transmit small-amplitude signals having the center voltage equal to the termination voltage VTT.

When the output circuit 110 provides the low level, a current flows, in the following order, in a closed circuit made up of the voltage generating circuit 152, the termination voltage line 89, the termination resistors 116 and 117, the bus line 115, the output circuit 110 (nMOS transistor 138), the ground and the voltage generating circuit 152. When the output circuit 110 provides the high level, a current flows in a closed circuit made up of the voltage generating circuit 151, the VCCQ power supply line 88, the output circuit 110 (pMOS transistor 137), the bus line 115, the termination resistors 116 and 117, and the voltage generating circuit 151.

As described above, according to the second embodiment of the present invention, since the voltage generating circuits 151 and 152 are connected in series, the voltage V6 of the voltage output terminal can be maintained at 1.65 V even when the current flows out of the voltage output terminal 154 or flows therein. Hence, it becomes possible to ensure the stability in which VTT=V6=1.65 V.

Further, no currents flow in the termination resistors 116 and 117 when no signal is transmitted via the bus line 115. Hence, power consumption can be reduced.

Furthermore, according to the second embodiment of the present invention, the termination voltage VTT is used as the reference voltage Vref which is needed in the microprocessor 90 and the SDRAM devices 91–94. Hence, the coincidence of the reference voltage Vref and the termination voltage VTT can be accomplished and no offset voltage is generated. Hence, the sufficient operation margin can be ensured.

Moreover, according to the second embodiment of the present invention, the resistors 160–164 are provided at the branch points on the bus line 115. Hence, it is possible to not only prevent an excessive current from flowing in the circuits but also to cut off, by means of the resistors 160–164, high-frequency components contained in the reflected signals produced at the stubs 155–159 in the case where these stubs are needed. As a result, it is difficult for the transmitted signal waveforms to be deformed. From these viewpoints, it can be said that the second embodiment of the present invention is suitable for a system in which the SDRAM devices 91–94 are mounted on a module (SIMM) and connectors of the module are connected to the bus line 115. Meanwhile, the structure of the first embodiment of the present invention is suitable for a system in which the SDRAM devices 91–95 are directly connected to the bus line 115 because it does not need the stubs 155–159.

Figure 19A:
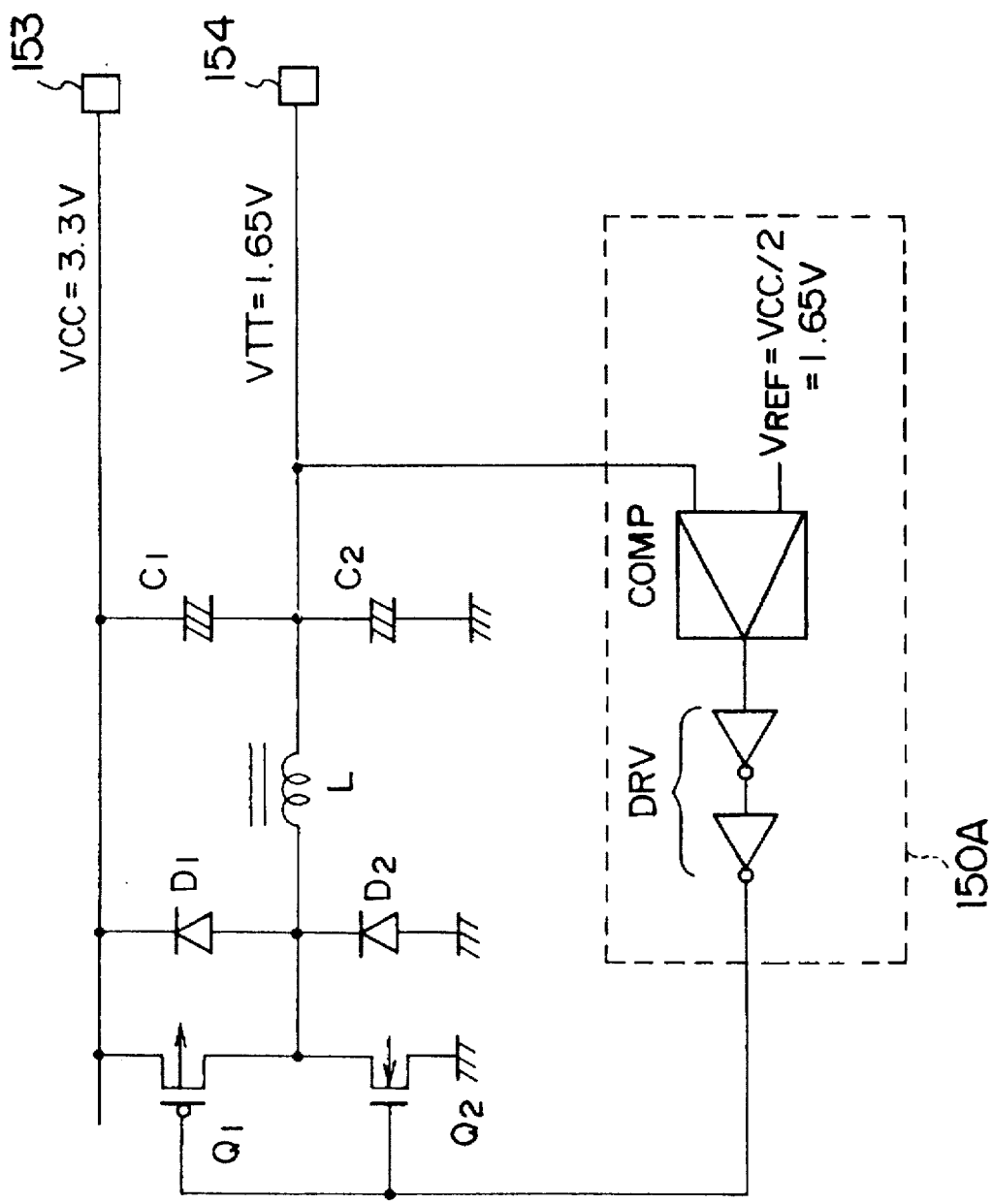
FIG. 19A is a circuit diagram of a voltage generating circuit shown in FIG. 16.

FIG. 19A is a circuit diagram of a practical example of the voltage generating circuit 150 shown in FIG. 15. The circuit shown in FIG. 19A is a switching regulator. The voltage generating circuit 150 shown in FIG. 19A includes a pMOS transistor Q1, an nMOS transistor Q2, diodes D1 and D2, an inductor L, capacitors C1 and C2, and a control circuit 150A. The control circuit 150A includes a comparator COMP and a driver DRV having two CMOS inverters.

The transistors Q1 and Q2 function as switches of the switching regulator. The diodes D1 and D2 allow a counter electromotive force of the inductance to pass therethrough. The inductor L and the capacitors C1 and C2 form a smoothing circuit. The voltage of the output terminal 154 is compared with the reference voltage $V_{REF}$ (=VCC/2=1.65 V in this example), and the output signal of the comparator COMP drives the transistors Q1 and Q2. When no load current flows, the comparator output turns ON and OFF the transistors Q1 and Q2 with the equal duty ratio. In this state, the circuit is in the oscillating state. The control circuit 150A can be formed by Si9145 manufactured by Siliconics in the United States.

The voltage generating circuit 83 shown in FIG. 6 can be configured in the same way as described above.

A description will now be given of an electronic system according to a third embodiment of the present invention with reference to FIG. 20.

Figure 20:
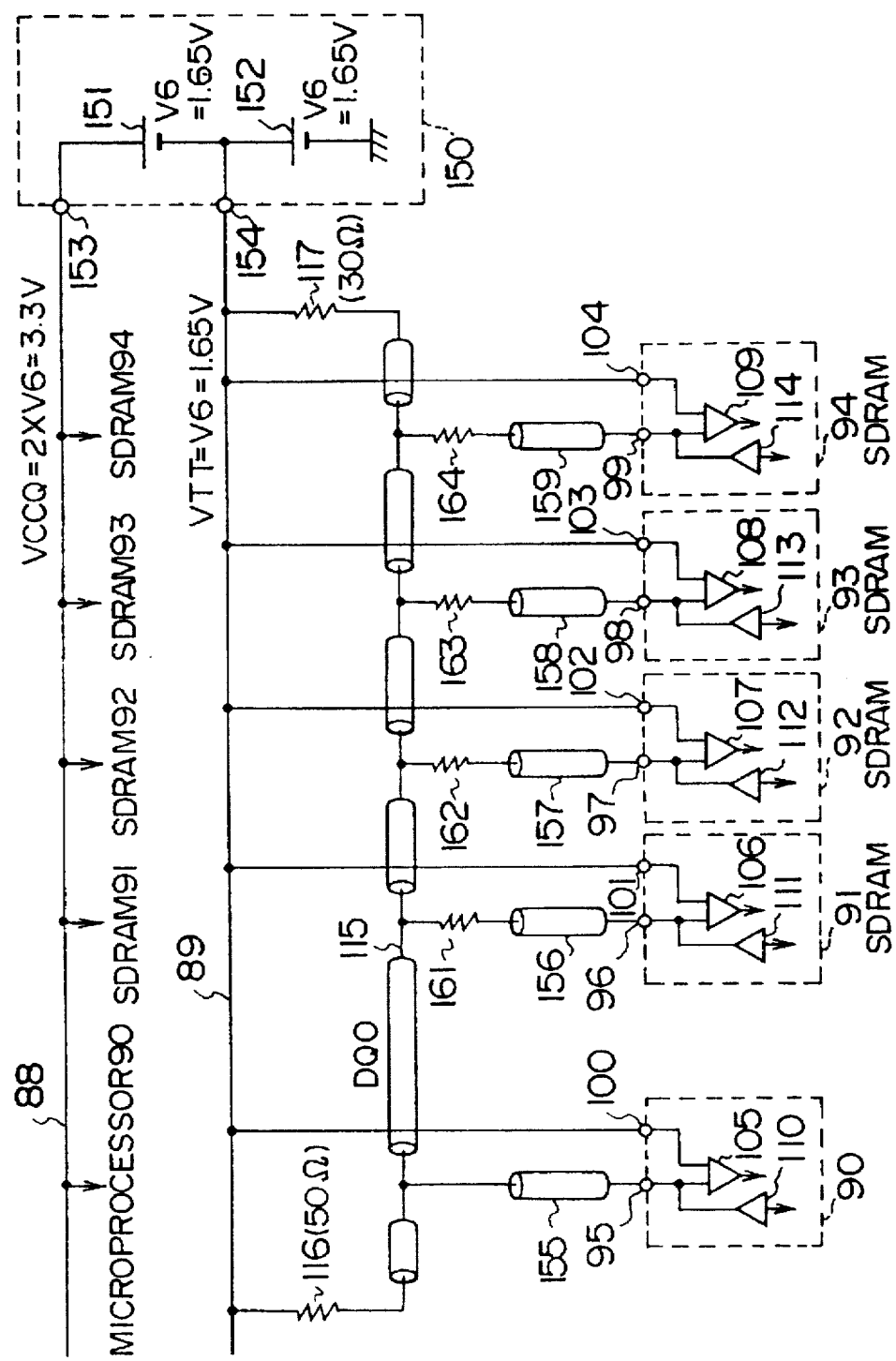
FIG. 20 is a circuit diagram of an essential part of a third embodiment of the present invention.

FIG. 20 is a circuit diagram of the essential part of the electronic system according to the third embodiment of the present invention. In the structure shown in FIG. 20, the resistors 161–164 are connected between the bus line 115 and the stubs 156–159, while no resistor is intentionally connected between the microprocessor 90 and the bus line 115. The other parts of the third embodiment of the present invention are the same as those of the second embodiment thereof.

When the SDRAM devices 91–94 are mounted on the SIMM, it is easy to provide the bus line 115 and the stubs 155–159. However, in many cases, the microprocessor 90 is mounted on PGA (Pin Grid Array) packages and has a large number of pins. Hence, many cases will take place in which no space for providing the resistor 160 shown in FIG. 15 is available.

With the above in mind, according to the third embodiment of the present invention, the resistors 161–164 are connected between the bus line 115 and the stubs 156–159, while the resistor 160 shown in FIG. 15 is not provided between the bus line 115 and the processor 90. Even when the resistor 160 is not used, the microprocessor 90 would be connected to an end portion of the bus line 115 in many cases. This end portion is close to the termination resistor 116, which functions to reduce deformation in the signal waveforms.

Further, in the above case, an excessive current will not flow in the circuits if the output circuit 110 of the microprocessor 90 is designed to have a small driving ability and the inner resistance thereof is as high as approximately 100 Ω. The decreasing of the inner resistance of the output circuit 110 to approximately 100 Ω can be achieved by adjusting the sizes of the pMOS transistor 137 and the nMOS transistor 138, or providing a resistor in series to the output of the output circuit 110 at a position close to the output circuit 110, for example, on the chip or in the package.

When the sizes of the pMOS transistor 137 and the nMOS transistor 138 are adjusted, the gate width of the pMOS transistor 137 is set to, for example, 500 μm and the gate length thereof is set to, for example, 1 μm. Further, the gate width of the nMOS transistor 138 is set to, for example, 200 μm, and the gate length thereof is set to, for example, 1 μm.

When a resistor is connected in series to the output of the output circuit 110, the gate width and gate length of the pMOS transistor 137 are set to, for example, 1000 μm and 1 μm, respectively. Further, the gate width and gate length of the nMOS transistor 138 are set to, for example, 400 μm and 1 μm, respectively.

If the resistor connected in series to the output circuit 110 has a negative temperature coefficient, it advantageously functions to cancel a positive temperature coefficient of the inner resistances of the transistors of the output circuit 110. For example, it is possible to make the series-connected resistor of an amorphous-system semiconductor material generally called thermistor. As a simpler method, the series-connected resistor is formed by a diffused layer formed in a semiconductor substrate. The p-type diffused layer has a temperature coefficient greater than that of the n-type diffused layer. Such diffused layers are suitable for the above purpose. The above-mentioned materials have natures in which the resistance is decreased as the temperature increases. Hence, it is possible to cancel a phenomenon such that the driving abilities of transistors are decreased as the temperature increases.

A description will now be given of an electronic system according to a fourth embodiment of the present invention with reference to FIG. 21.

Figure 21:
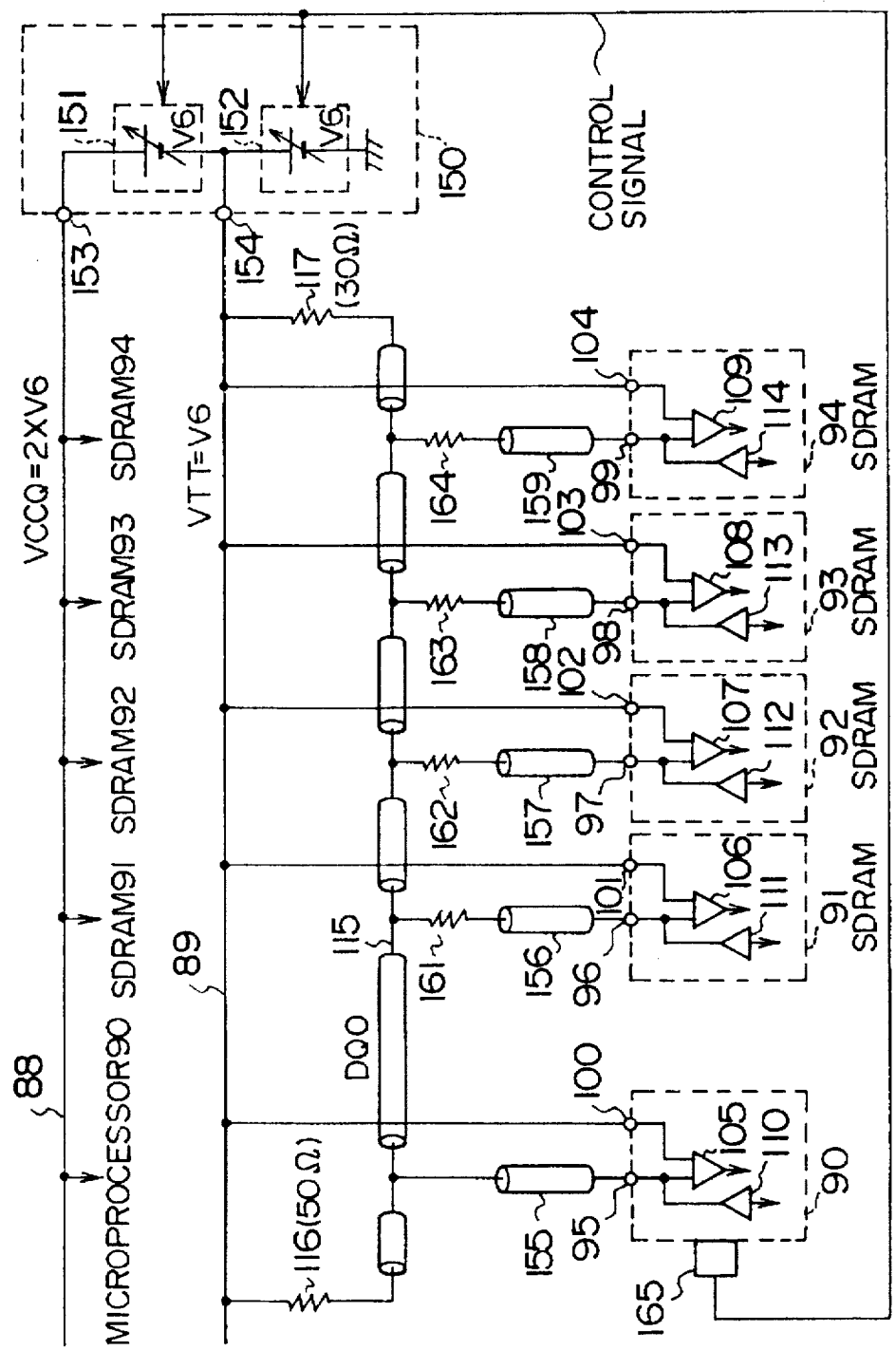
FIG. 21 is a circuit diagram of an essential part of a fourth embodiment of the present invention.

FIG. 21 is a circuit diagram of the essential part of the electronic system according to the fourth embodiment of the present invention. In the structure shown in FIG. 21, a temperature sensor 165 is provided to control the voltage V6 generated by the voltage generating circuits 151 and 152 on the basis of the temperature sensed by the temperature sensor. The other parts of the fourth embodiment of the present invention are the same as those of the third embodiment of the present invention.

It is necessary to pay attention to the temperature dependence of the driving ability of the output circuit 110 of the microprocessor 90 in the following case. That is, the resistors 161–164 are connected between the bus line 115 and the stubs 156–159, and no resistor is connected to the bus line 115 and the microprocessor 90. Further, the transistors in the output circuit 110 of the microprocessor 90 have small driving abilities. It should be noted that the MOS transistors have negative driving current temperature coefficients, in which the driving ability is degraded as the operation temperature increases.

With the above in mind, in order to maintain a constant signal amplitude on the bus line 115 independent of the operation temperature, it is suitable to make the voltage V6 output from the voltage generating circuits 151 and 152 have a positive temperature coefficient. For example, the appropriate value of the voltage V6 is 1.3 V at 25° C. and 1.65 V at 100° C.

It is possible to design the system so that the power supply voltage for only the input/output circuit depends on the temperature, and the power supply voltage for the main body circuit is maintained at the constant level. It is also possible to design the system so that the power supply voltages of both the input/output circuit and the main body circuit depend on the temperature. The above temperature compensation can be applied irrespective of whether any resistor is connected to the bus line 115.

A description will now be given, with reference to FIGS. 22 through 25, of an electronic system according to a fifth embodiment of the present invention.

Figure 22:
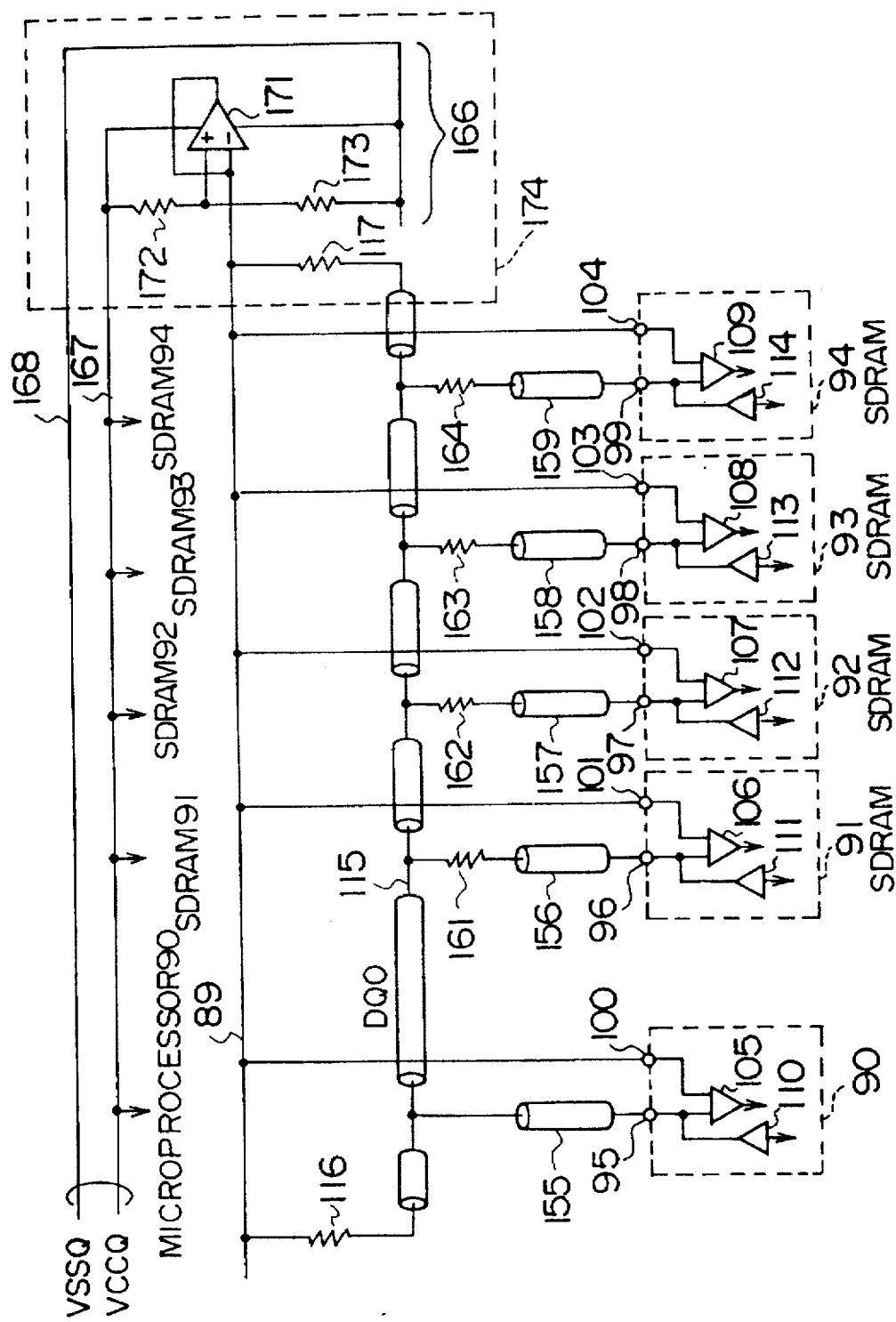
FIG. 22 is a circuit diagram of an essential part of a fifth embodiment of the present invention.

FIG. 22 is a circuit diagram of the essential part of the electronic system according to the fifth embodiment of the present invention. In the structure shown in FIG. 22, the voltage generating circuit 83 shown in FIG. 6 is replaced by a termination voltage generating circuit 166. Correspondingly, there are provided a VCCQ power supply line 167 for supplying the power supply voltage VCCQ equal to 2.0 V to the termination voltage generating circuit 166, and a VSSQ power supply line 168 for supplying the power supply voltage VSSQ equal to 0 V to the termination voltage generating circuit 166.

In the fifth embodiment of the present invention, the power supply voltage VCCQ from the VCCQ power supply line 167 is supplied to the microprocessor 90 and the SDRAM devices 91-94. The other parts of the circuit of the fifth embodiment of the present invention are the same as those of the first embodiment thereof shown in FIG. 6.

The termination voltage generating circuit 166 includes an operational amplifier 171, and voltage dividing resistors 172 and 173 having an identical resistance. The voltage network of the resistors 172 and 173 derives VCCQ/2 (=1.0 V) from the voltage VCCQ, and the divided VCCQ/2 is applied to the forward phase (non-inverting) input terminal of the operational amplifier 171. The output of the operational amplifier 171 is fed back to the reverse phase (inverting) input terminal of the operational amplifier 171. Thereby, the termination voltage VTT equal to VCCQ/2 is obtained at the output terminal of the operational amplifier 171.

There are integrally provided on one chip the termination voltage generating circuit 166, the voltage dividing resistors 172 and 173, the termination resistor 117 for the bus line 115 provided for the data DQ0, and termination resistors for the bus lines for data DQ1-DQ7. These elements provided on one chip are packaged, as a termination module (termination device), with the same dimensions as the SDRAM devices 91-94.

Figure 23:
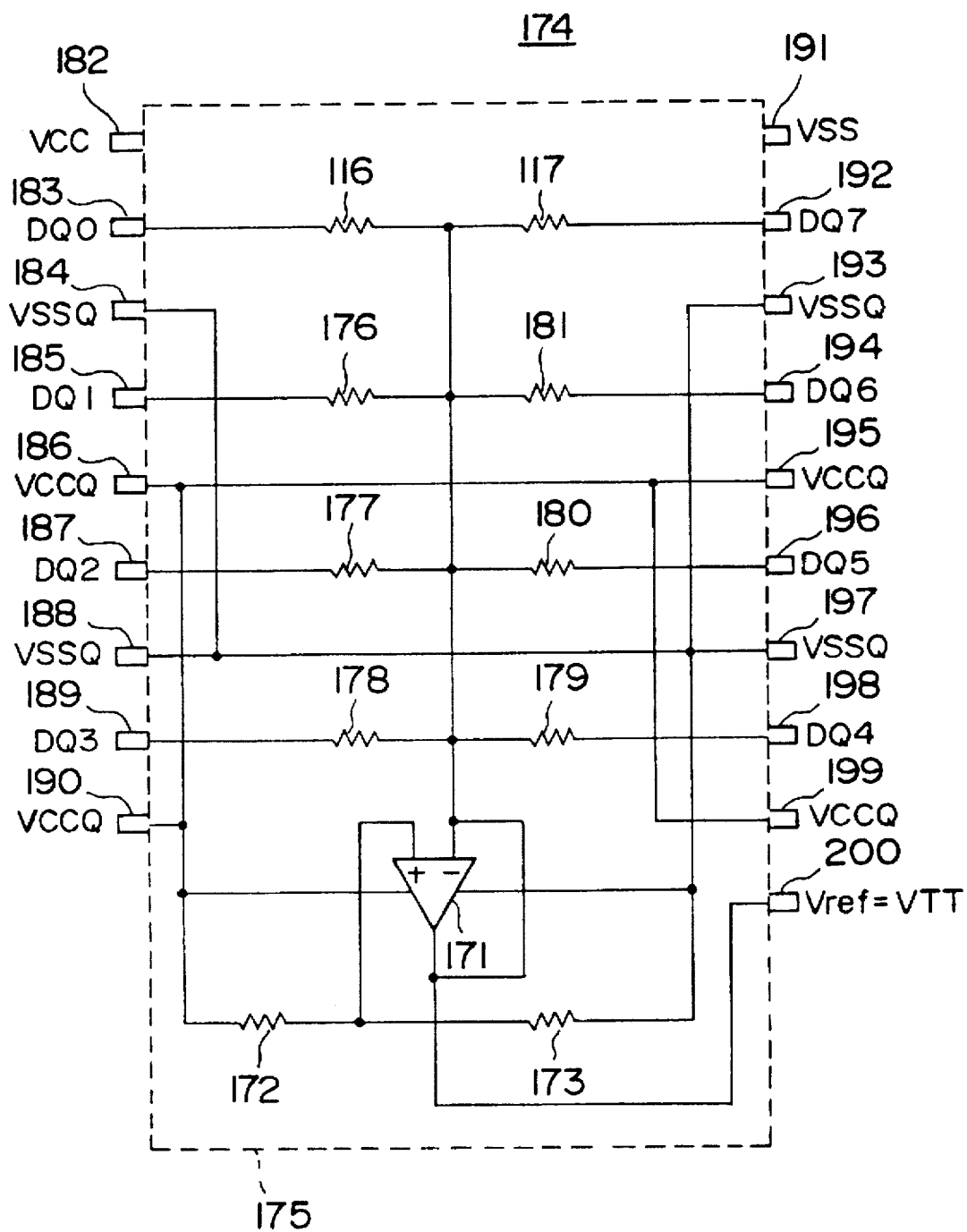
FIG. 23 is a circuit diagram of a termination module shown in FIG. 22.

FIG. 23 schematically shows the termination module 174, which includes a termination module main body 175, termination resistors 176-181 respectively provided for data DQ1-DQ7 and external terminals 182-200. These external terminals 182-200 are located in the same positions of the corresponding external terminals of each of the SDRAM devices 91-94.

Figure 24:
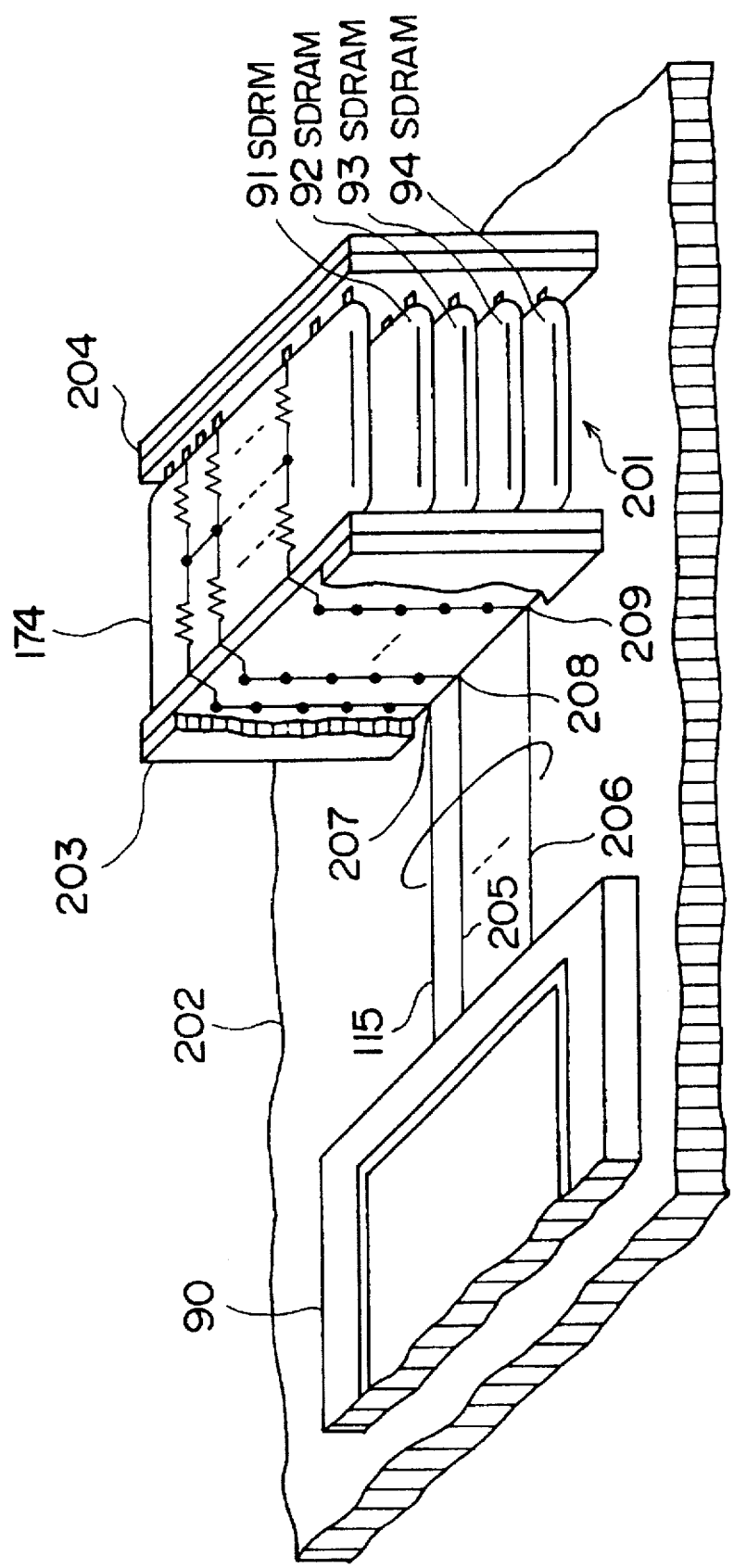
FIG. 24 is a perspective view of an essential part of the system according to the fifth embodiment of the present invention.

As shown in FIG. 24, the SDRAM devices 91-94 and the termination module 174 are arranged in a stack formation so as to be one body, which is handled as a memory stack 201. This memory stack 201 is mounted on a circuit board 202. In the fifth embodiment of the present invention, the supply of the power supply voltage VCCQ from the VCCQ power supply line 167 to the SDRAM devices 91-94 is carried out in the memory stack 201.

In FIG. 24, there are provided vertical sub boards 203 and 204, bus lines 205 and 206 which carry data DQ1 and DQ7 respectively, and connectors 207, 208 and 209.

The structure shown in FIG. 24 contributes to decreasing of the assembly cost and shortening of the bus lines, so that higher-speed signal transmissions can be performed. Further, since the termination voltage VTT is produced in the vicinity of the SDRAM devices 91-94, it is possible to prevent the reference voltage Vref from fluctuating due to noise.

It is also possible to form, separately from the termination voltage generating circuit 166, the termination module with only the termination resistors 116, 117, 176-181.

Figure 25:
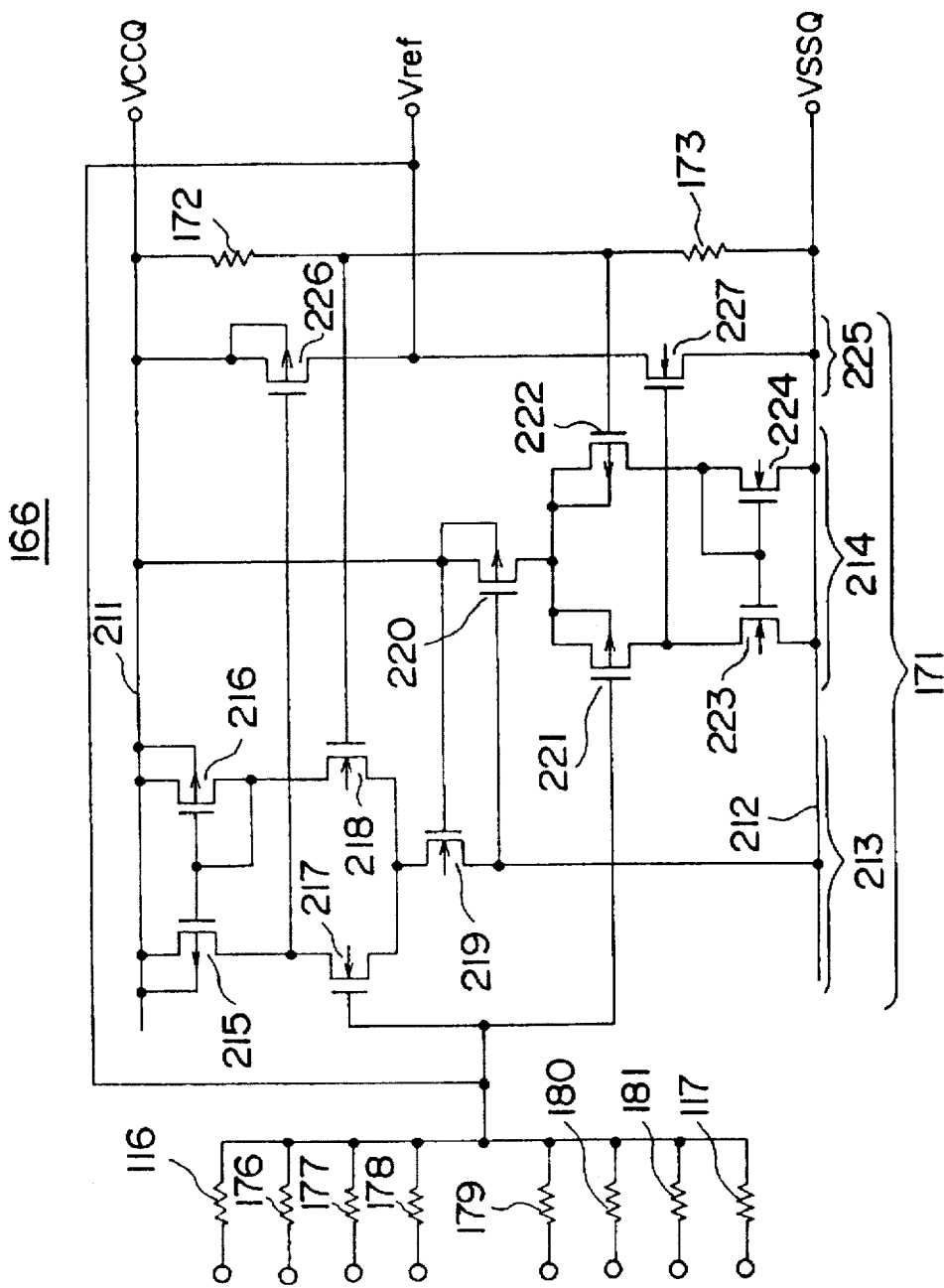
FIG. 25 is a circuit diagram of a termination voltage generating circuit used in the fifth embodiment of the present invention.

FIG. 25 is a circuit diagram of the termination voltage generating circuit 166 used in the fifth embodiment of the present invention. The circuit 166 includes a VCCQ power supply line 211, a VSSQ power supply line 212, and differential amplifier circuits 213 and 214. The differential amplifier circuit 213 includes enhancement type pMOS transistors 215 and 216 forming a current-mirror circuit functioning as a load. The circuit 166 includes enhancement type nMOS transistors 217 and 218 functioning as driving transistors, and an enhancement type nMOS transistor 219 functioning as a resistor.

The differential amplifier circuit 214 includes an enhancement type pMOS transistor 220 functioning as a resistor, enhancement type pMOS transistors 221 and 222 functioning as driving transistors, and nMOS transistors 223 and 224 functioning as loads. Further, the termination voltage generating circuit 166 shown in FIG. 25 includes an output circuit 225, which is made up of an enhancement type pMOS transistor 226 functioning as a pull-up element, and an enhancement type nMOS transistor 227 functioning as a pull-down element.

The termination voltage generating circuit 166 thus formed is capable of generating the termination voltage VTT regulated at a fixed voltage with respect to variations in the power supply voltage VCCQ.

In the fifth embodiment of the present invention, the output circuits 110–114 of the microprocessor 90 and the SDRAM devices 91–94 are formed of the push-pull-type CMOS operating with the power supply voltage VCCQ equal to 2.0 V and the termination voltage VTT=VCCQ/2= 1.0 V. Hence, it is possible to transmit signals having the center voltage equal to the termination voltage VTT.

When the output level of the output circuit 110 is low, a current flows, in the following order, in a closed circuit made up of the termination voltage generating circuit 166, the termination voltage line 89, the termination resistors 116 and 117, the bus line 115, the output circuit 110 (nMOS transistor 138), the ground, a power supply voltage generating circuit (not shown for the sake of convenience) for generating the power supply voltage VCCQ, the VCCQ power supply line 167, and the termination voltage generating circuit 166.

When the output circuit 110 outputs the high-level output signal, a current flows, in the following order, in a closed loop made up of the VCCQ power supply line 167, the output circuit 110 (pMOS transistor 137), the bus line 115, the termination resistors 116 and 117, the termination voltage generating circuit 166, the VSSQ power supply line 168, a power supply voltage generating circuit (not shown for the sake of convenience) for generating the power supply voltage VCCQ, and the VCCQ power supply line 167.

As described above, according to the fifth embodiment of the present invention, the termination voltage generating circuit 166 is controlled so that the output voltage of the operational amplifier 171, that is the termination voltage VTT is fed back by means of the operational amplifier 171, it is possible to stably maintain the termination voltage VTT at the voltage VCCQ/2 equal to 1.0 V even if the current flows to the termination voltage line 89 from the termination voltage generating circuit 166 or the current flows to the termination voltage generating circuit 166 from the termination voltage line 89.

Further, no currents flow in the termination resistors 116 and 117 when no signal is transmitted via the bus line 115. Hence, power consumption can be reduced.

In addition, the input/output circuits of the fifth embodiment of the present invention are configured in the same way as those of the first embodiment thereof, and the output driving circuits and the output circuits 110–114 are driven by the power supply voltage VCCQ equal to 2.0 V lower than the power supply voltage VCC equal to 3.3 V used to drive the main body circuit. In this regard, it is also possible to reduce power consumption.

Furthermore, according to the fifth embodiment of the present invention, the termination voltage VTT is used as the reference voltage Vref which is needed in the microprocessor 90 and the SDRAM devices 91–94. Hence, the coincidence of the reference voltage Vref and the termination voltage VTT can be accomplished and no offset voltage is generated. Hence, sufficient operation margin can be ensured.

Further, according to the fifth embodiment of the present invention, the power supply voltage VCCQ is supplied as the power supply voltage necessary for the output driving circuit to drive the output circuits 110–114. Hence, it is possible to drive, in a balanced way, the pMOS transistor serving as the pull-up element and the nMOS transistor serving as the pull-down element.

A description will now be given, with reference to FIGS. 26 and 27, of an electronic system according to a sixth embodiment of the present invention.

Figure 26:
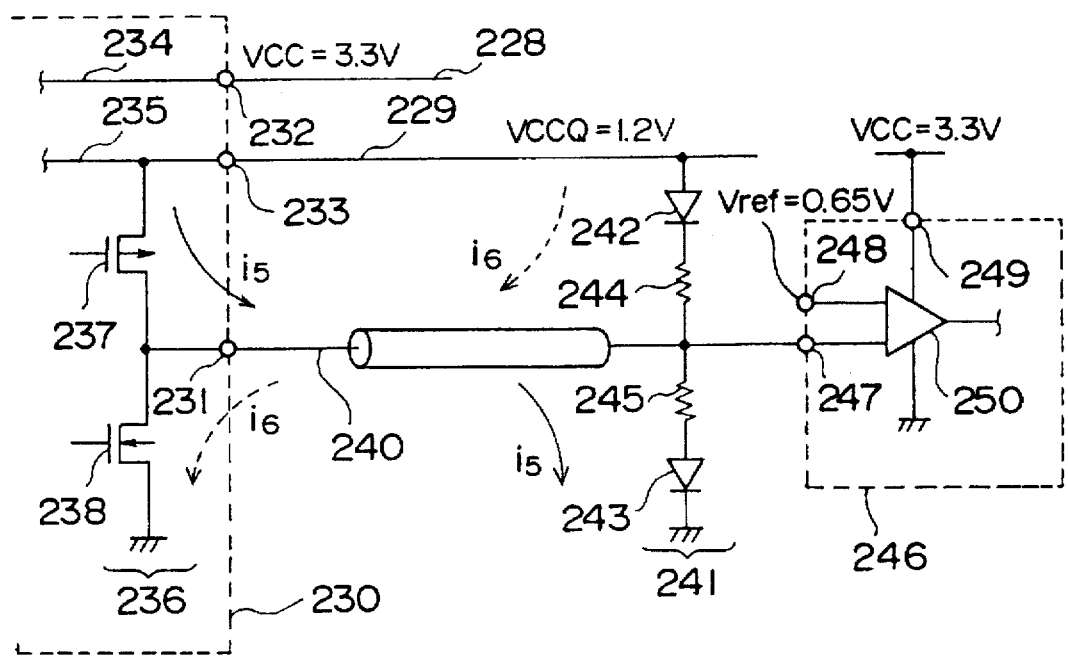
FIG. 26 is a circuit diagram of an essential part of a sixth embodiment of the present invention.

FIG. 26 is a circuit diagram of the essential part of the electronic system according to the sixth embodiment of the present invention. In FIG. 26, there are provided a VCC power supply line 228 supplying the power supply voltage VCC equal to 3.3 V, and a VCCQ power supply line VCCQ 229 equal to 1.2 V. The system shown in FIG. 26 has a microprocessor 230, which has a signal input/output terminal 231 via which signals are input and output, a VCC power supply terminal 232 for receiving the power supply voltage VCC, and a VCCQ power supply line 233 for receiving the power supply line VCCQ equal to 1.2 V. The system further includes a VCC power supply line 234 via which the power supply voltage VCC is supplied to the inner circuits, a VCCQ power supply line 235 for supplying the power supply voltage VCCQ to the inner circuits, and a push-pull-type output circuit 236. The push-pull-type output circuit 236 includes a pMOS transistor 237 functioning as a pull-up element, and an nMOS transistor 238 functioning as a pull-down element.

The system further includes a bus line 240 via which signals are transmitted, and a termination unit 241, which includes diodes (non-linear elements) 242 and 243 each having a forward voltage of 0.65 V, and resistors 244 and 245 each having a resistance of 15 Ω. The sum of the forward voltages of the diodes 242 and 243 is equal to 1.3 V. Hence, no current flows in the termination unit 241 when no signal is transmitted via the bus 240. The diodes 242 and 243 have a rise characteristic.

The system shown in FIG. 26 includes a SDRAM device 246, which has a signal input/output terminal 247 via which signals are input and output, a reference voltage input terminal 248 receiving the reference voltage Vref equal to 0.65 V, a VCC power supply terminal 249 receiving the power supply voltage VCC, and an input circuit 250.

Figure 27:
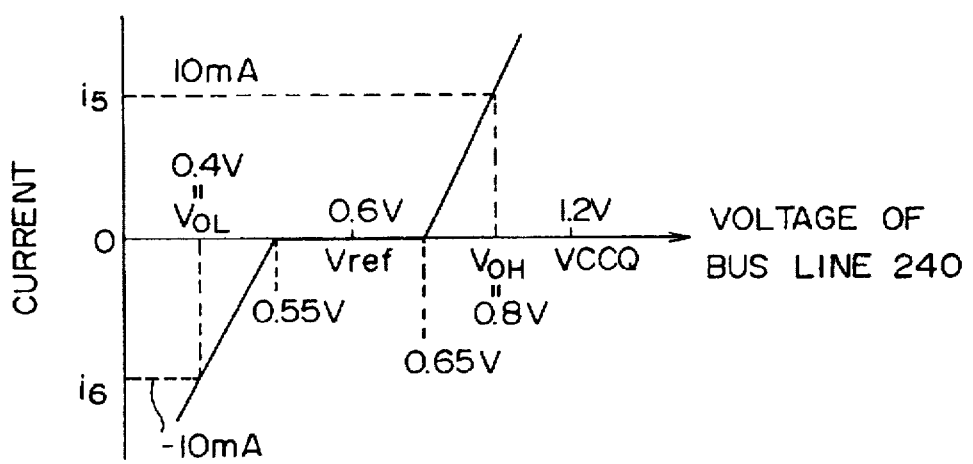
FIG. 27 is a graph of the characteristic of a termination unit shown in FIG. 26.

FIG. 27 is a graph of a characteristic of the termination unit 241 shown in FIG. 25. The horizontal axis of the graph denotes the voltage of the bus line 240, and the positive side of the vertical axis thereof denotes the magnitude of a current $i_5$, which flows from the VCCQ power supply line 235 to, in the order of, the pMOS transistor 237, the bus line 240, the resistor 245, the diode 243 and the ground when the pMOS transistor 237 is turned ON and the nMOS transistor 238 is turned OFF. The negative side of the vertical axis denotes the magnitude of a current $i_6$, which flows from the VCCQ power supply line 229 to, in the order of, the diode 242, the resistor 244, the bus line 240, the nMOS transistor 238 and the ground.

In the sixth embodiment of the present invention, when the pMOS transistor 237 is turned ON and the nMOS transistor 238 is turned OFF, the current $i_5$ flows into the bus line 240 from the VCCQ power supply line 235 via the pMOS transistor 237, whereby the voltage of the bus line 240 starts to be increased. Then, when the voltage of the bus line 240 exceeds the forward voltage of the diode 243 equal to 0.65 V, the diode 243 is turned ON, and the current $i_5$ starts to flow in the resistor 245 and the diode 243. Then, the voltage of the bus line 240 rises up to 0.8 V equal to 0.65 V (the forward voltage of the diode 243)+15 Ω (resistance of the resistor 245)×0.01 mA (driving current of the pMOS transistor 237).

When the pMOS transistor 237 is turned OFF and the nMOS transistor 238 is turned ON, the current $i_6$ flows from the bus line 240 to the ground via the nMOS transistor 238, so that the voltage of the bus line 240 is decreased. Then, when the voltage of the bus line 240 becomes lower than the forward voltage of the diode 242 equal to 0.65 V, the diode 242 is turned ON, and the current $i_6$ starts to flow in the diode 242 and the resistor 244. Then, the voltage of the bus line 240 decreases to 0.4 V equal to 1.2 V–0.65 V (forward voltage of the diode 242)×0.01 mA (driving current of the nMOS transistor 238).

As described above, according to the sixth embodiment of the present invention, it is possible to ensure the stability in which the termination voltage VTT is equal to the power supply voltage VCCQ equal to 1.2 V because no current flows to the VCCQ power supply line 229 even when the output level is output from the output circuit 236.

At the time when the signal is input to or output from the output circuit 236, the diodes 242 and 243 are in the non-conducting state. Hence, the reflection of transmitted signals may take place until the diode 242 or 243 is switched to the conducting state. However, the above reflection is very small and does not substantially affect the signal transmission.

Further, according to the sixth embodiment of the present invention, it is possible to reduce power consumption because no current flows in the termination unit 241 as long as no signal is transmitted via the bus line 240.

In addition, the input/output circuits of the sixth embodiment of the present invention are configured in the same way as those of the first embodiment thereof, and the output driving circuits and the output circuits 110–114 are driven by the power supply voltage VCCQ equal to 1.2 V lower than the power supply voltage VCC equal to 3.3 V used to drive the main body circuit. In this regard, it is also possible to reduce power consumption.

In the sixth embodiment of the present invention, the termination unit 241 is open when viewed from the output circuit 236 at the time of inputting or outputting a signal. Hence, the voltage of the bus line 240 is changed rapidly and thereafter the termination is added. As a result, in a case where a large number of loads are connected to the bus line 240 and the effective impedance of the bus line 240 is small, it is possible to obtain a sufficient amplitude even when the resistors 244 and 245 are designed to have reduced resistance values in order to establish the impedance match.

Figure 28:
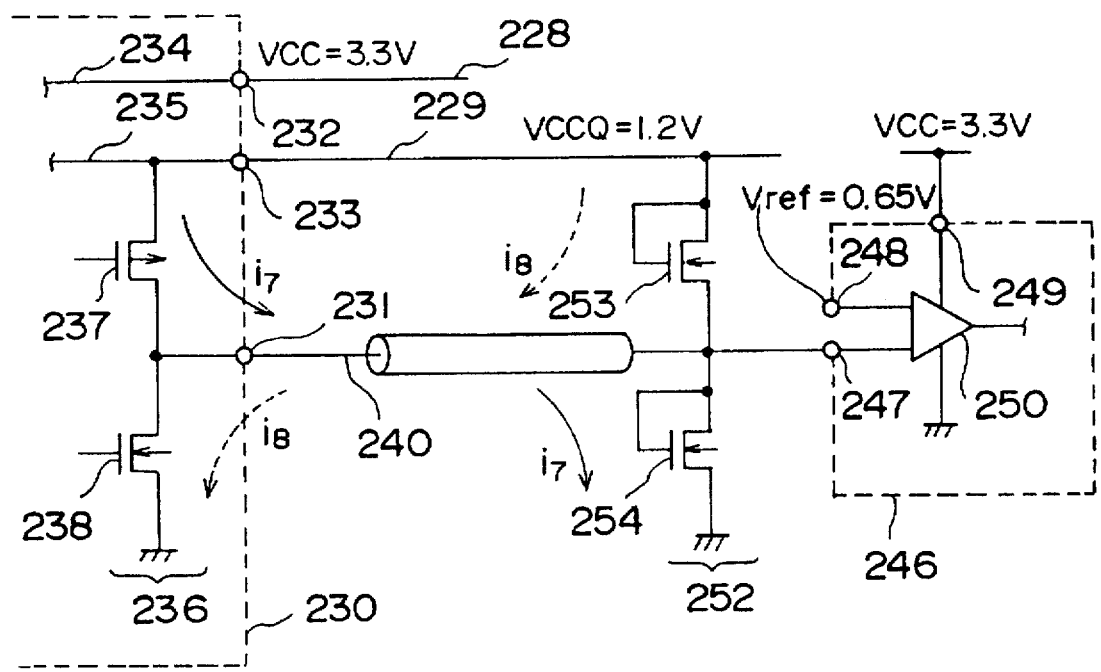
FIG. 28 is a circuit diagram of an essential part of a seventh embodiment of the present invention.

A description will now be given, with reference to FIGS. 28 through 30, of an electronic system according to a seventh embodiment of the present invention. In the seventh embodiment, a termination unit 252 has a configuration different from that of the termination unit 241. The other parts of the seventh embodiment of the present invention are the same as those of the sixth embodiment thereof shown in FIG. 26.

The termination unit 252 has a diode-connected enhancement type nMOS transistor 253 provided between the VCCQ power supply line 229 and the bus line 240 instead of the diode 242 and the resistor 244 shown in FIG. 26, and a diode-connected nMOS transistor 254 provided between the bus line 240 and the ground instead of the diode 243 and the resistor 245 shown in FIG. 26.

The relationship between the voltage V applied across the drain and source of each of the diode-connected nMOS transistors 253 and 254 and the current flowing between the drain and source thereof is written as follows:

$$I=\beta(V-VTH)^2/2$$

where $\beta$ denotes the gain constant.

When the high-level and low-level voltages of the transmitted signals are respectively set equal to 0.8 V and 0.4 V, the voltage V applied across the drain and source of each of the nMOS transistors 253 and 254 becomes equal to 0.8 V. Hence, when the driving currents of the pMOS transistor 237 and the nMOS transistor 238 are 10 mA, $\beta$ becomes equal to 0.44 from $10\times10^{-3}=\beta(0.8-0.65)^2$ in which $\beta$ can be written as $\beta=\mu C_{OX}W/L$ where $\mu$ is the effective mobility approximately equal to 400 cm/Vs, and $C_{OX}$ is the gate capacitance per unit area.

Figure 29:
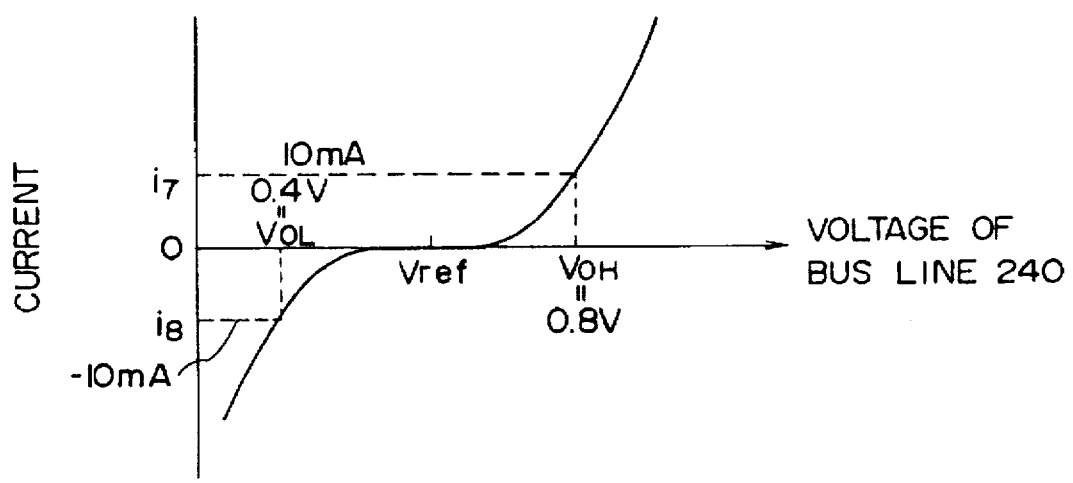
FIG. 29 is a graph of the characteristic of a termination unit shown in FIG. 28.

Hence, when the gate oxidation film is 10 nm and W/L=3300 in each of the nMOS transistors 253 and 254, the characteristic of the termination unit 252 as shown in FIG. 29 can be obtained. In FIG. 29, the horizontal axis denotes the voltage of the bus line 240, and the positive side of the vertical axis denotes the magnitude of a current $i_7$ flowing from the VCCQ power supply line 235 to the nMOS transistor 254 via the pMOS transistor 237 and the bus line 240. The negative side of the vertical axis denotes the magnitude of a current $i_8$ flowing from the VCCQ power supply line 229 to the nMOS transistor 238 via the nMOS transistor 253 and the bus line 240.

In the seventh embodiment of the present invention, when the pMOS transistor 237 is turned ON and the nMOS transistor 238 is turned OFF, the current $i_7$ flows to the bus line 240 from the VCCQ power supply line 235 via the pMOS transistor 237, so that the voltage of the bus line 240 is increased. Then, the when the voltage of the bus line 240 exceeds the threshold voltage VTH of the nMOS transistor 254 equal to 0.65 V, the nMOS transistor 254 is turned ON, and hence the current $i_7$ starts to flow to the nMOS transistor 254. Thereafter, the voltage of the bus line 240 is increased to 0.8 V equal to (the ON resistance of the nMOS transistor 254)×0.01 mA (the current driving ability of the pMOS transistor 237).

When the pMOS transistor 237 is turned OFF and the nMOS transistor 238 is turned ON, the current $_8$ flows to the ground from the bus line 240 via the nMOS transistor 238, so that the voltage of the bus line 240 is decreased. Then, when the voltage of the bus line 240 becomes lower than the threshold voltage VTH of the nMOS transistor 253 equal to 0.65 V, the nMOS transistor 253 is turned ON, so that the current $i_8$ starts to flow in the nMOS transistor 253. Then, the voltage of the bus line 240 decreases to 0.4 V equal to 1.2 V−(the ON resistance of the nMOS transistor 253)×0.01 mA (the current driving ability of the nMOS transistor 238).

As described above, according to the seventh embodiment of the present invention, it is possible to ensure the stability of the termination voltage VTT=VCCQ=1.2 V because no current flows to the VCCQ power supply line 229 even when the high-level output is output by the output circuit 236.

At the time when the signal from the output circuit 236 is input or output, the nMOS transistors 253 and 254 are in the non-conducting state. Hence, the reflection of transmitted signals may take place until the nMOS transistor 253 or 254 is switched to the conducting state. However, the above reflection is very small and does not substantially affect the signal transmission.

Further, according to the seventh embodiment of the present invention, it is possible to reduce power consumption because no current flows in the termination unit 252 as long as no signal is transmitted via the bus line 240.

In addition, the output circuit is driven by the power supply voltage VCCQ equal to 1.2 V lower than the power supply voltage VCC equal to 3.3 V used to drive the main body circuit. In this regard, it is also possible to reduce power consumption.

In the seventh embodiment of the present invention, the termination unit 252 is open when viewed from the output circuit 236 at the time of inputting or outputting a signal. Hence, the voltage of the bus line 240 is changed rapidly and thereafter the termination is added. As a result, in a case where a large number of loads are connected to the bus line 240 and the effective impedance of the bus line 240 is small, it is possible to obtain a sufficient amplitude.

Furthermore, since the inner resistances of the nMOS transistors 253 and 254 are greater than those of the diodes, the resistors 244 and 245 shown in FIG. 26 can be omitted. Hence, a simpler circuit configuration can be provided.

Figure 30:
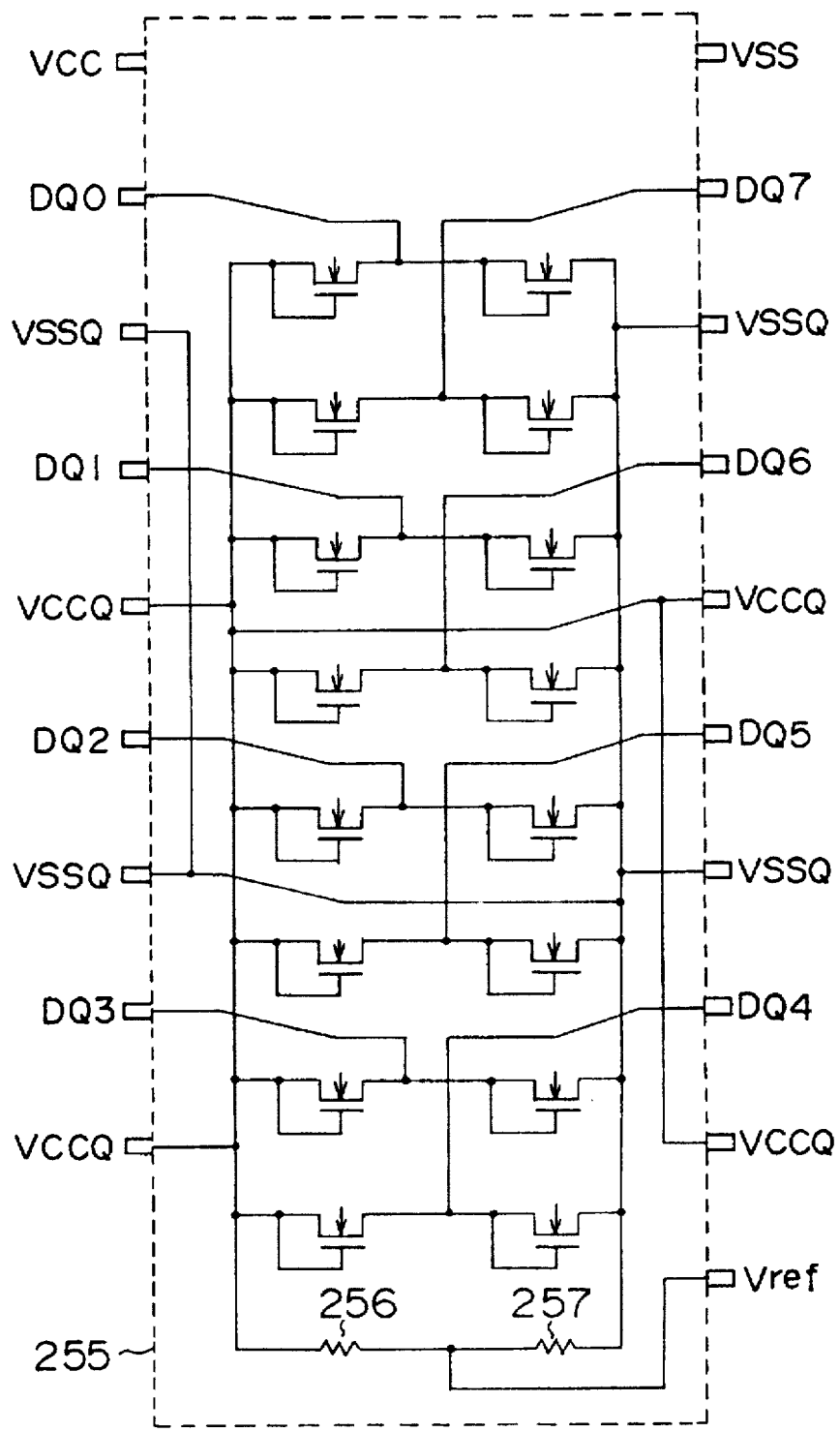
FIG. 30 is a circuit diagram of a termination module used in the seventh embodiment of the present invention.

In a case that the termination unit 252 is used as one which terminates the bus connected to a DRAM device capable of inputting and outputting eight-bit data, as shown in FIG. 30, the parts can be suitably integrated so as to form a termination module. In FIG. 30, there are provided a termination module main body 255, and resistors 256 and 257 used to produce the reference voltage Vref.

A description will now be given, with reference to FIGS. 31 through 35, of an electronic system according to an eighth embodiment of the present invention.

Figure 31:
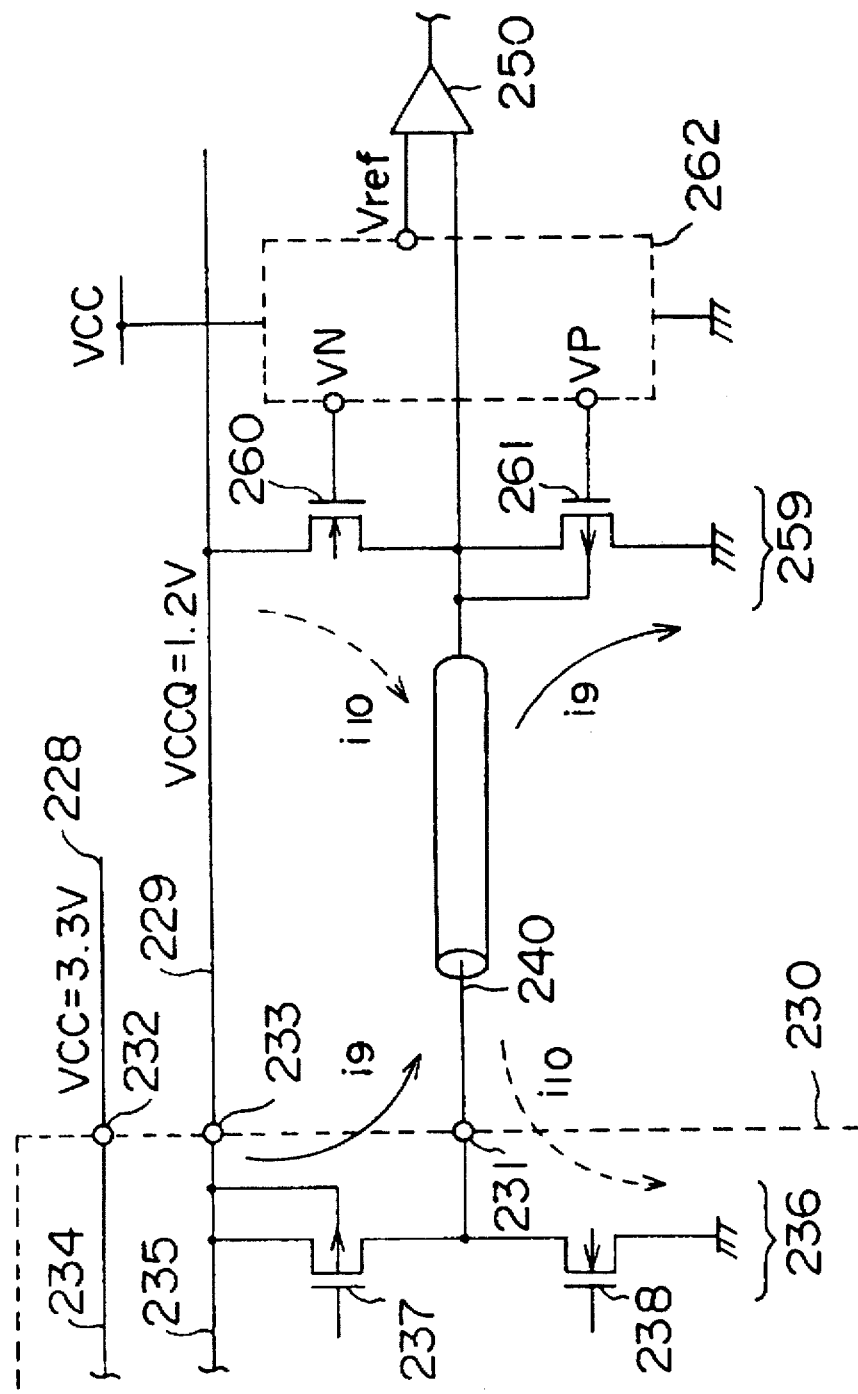
FIG. 31 is a circuit diagram of an essential part of an eighth embodiment of the present invention.

FIG. 31 is a circuit diagram of the essential part of the electronic system according to the eighth embodiment of the present invention. The electronic system shown in FIG. 31 has a termination unit 259 having a structure different from that of the termination unit 241 shown in FIG. 26. The termination unit 259 includes an enhancement type nMOS transistor 260 connected between the VCCQ power supply line 229 and the bus line 240 instead of the diode 242 and the resistor 244 shown in FIG. 26, and an enhancement type pMOS transistor 261 provided between the bus line 240 and the ground instead of the diode 243 and the resistor 245. The transistors 260 and 261 respectively form a source-follower circuit. That is, the termination unit 259 is formed of a complementary source-follower circuit made up of the nMOS transistor 260 and the pMOS transistor 261.

Further, the electronic system of the eighth embodiment of the present invention is equipped with a bias voltage generating circuit 262 for supplying bias voltages VN and VP to the termination unit 259. The other parts of the eighth embodiment of the present invention are the same as corresponding ones of the sixth embodiment thereof.

The relationship among the bias voltages VN and VP, the threshold voltage $V_{TH-n}$ of the nMOS transistor 260 and the threshold voltage $V_{TH-p}$ of the pMOS transistor 261 is as follows:

$$VN-VP<V_{TH-n}+|V_{TH-p}|$$

That is, when no signal is transmitted via the bus line 240, the nMOS transistor 260 and the pMOS transistor 261 are set in the non-conducting state.

Figure 32:
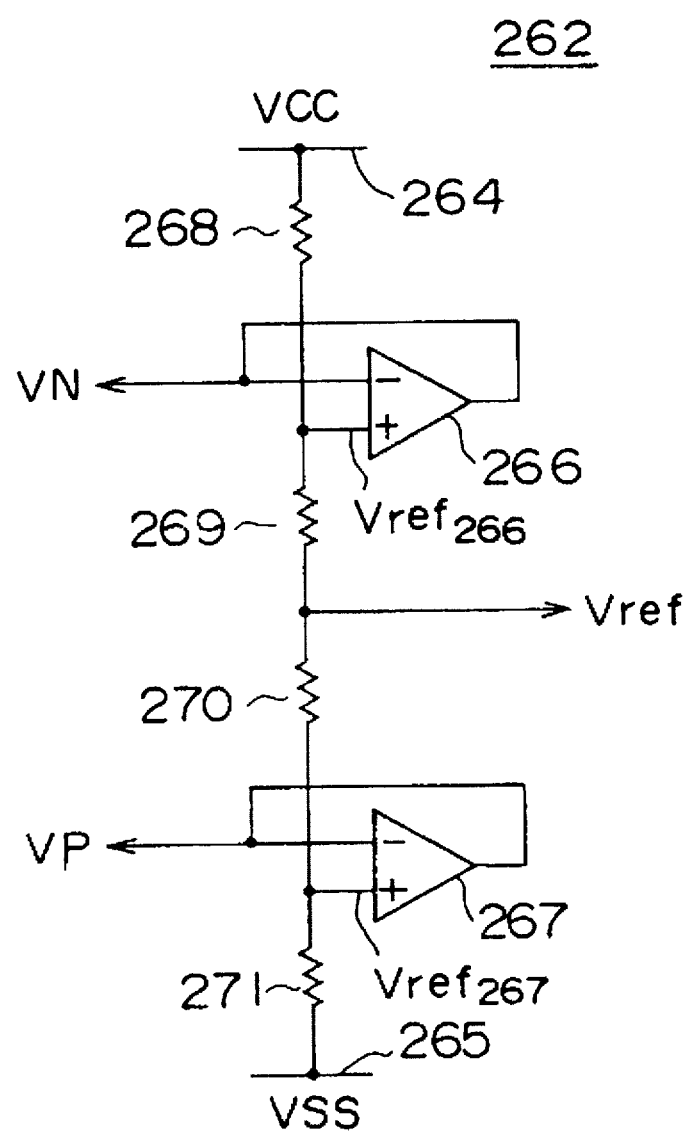
FIG. 32 is a circuit diagram of a bias voltage generating circuit shown in FIG. 31.

The bias voltage generating circuit 262 is configured as shown in FIG. 32. In FIG. 32, there are provided a VCC power supply line 264 via which the power supply voltage VCC is supplied, and a VSS power supply line 265 via which the power supply voltage VSS is supplied. The circuit 262 further includes an operational amplifier 266 for generating the bias voltage VN to be supplied to the nMOS transistor 260, and an operational amplifier 267 for generating the bias voltage VP to be supplied to the pMOS transistor 261. Further, there are resistors 268–271 used to provide the operational amplifier 266, the input circuit 250 (FIG. 31) and the operational amplifier 267 with a reference voltage $Vref_{266}$, the reference voltage Vref and a reference voltage $Vref_{267}$, respectively.

Figure 33:
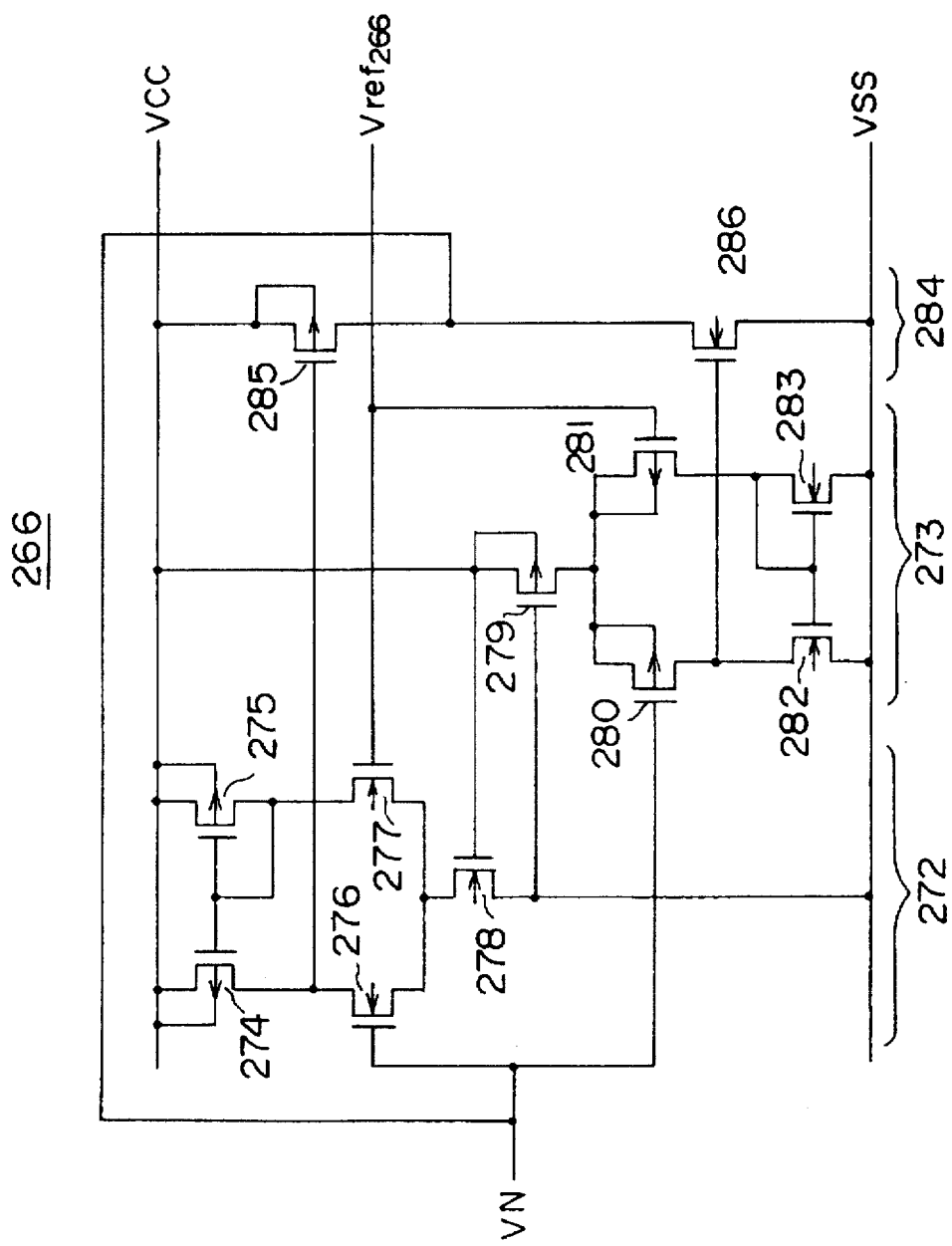
FIG. 33 is a circuit diagram of an operational amplifier shown in FIG. 32.

The operational amplifier 266 is configured as shown in FIG. 33. The operational amplifier 266 includes differential amplifier circuits 272 and 273. The differential amplifier circuit 272 includes enhancement type pMOS transistors 274 and 275 forming a current-mirror circuit which functions as a load. The operational amplifier 266 further includes enhancement type nMOS transistors 276 and 277 functioning as driving transistors, and an enhancement type nMOS transistor 278 functioning as a resistor.

The differential amplifier 273 includes an enhancement type pMOS transistor 279 functioning as a resistor, enhancement type pMOS transistors 280 and 281 functioning as driving transistors, and enhancement type nMOS transistors 282 and 283 functioning as loads. The operational amplifier 266 includes an output circuit 284, which has an enhancement type pMOS transistor 285 functioning as a pull-up element, and an enhancement type nMOS transistor 286 functioning as a pull-down element.

The operational amplifier 266 thus formed is capable of providing the bias voltage VN kept constant immune to variations in the power supply voltage VCC.

Figure 34:
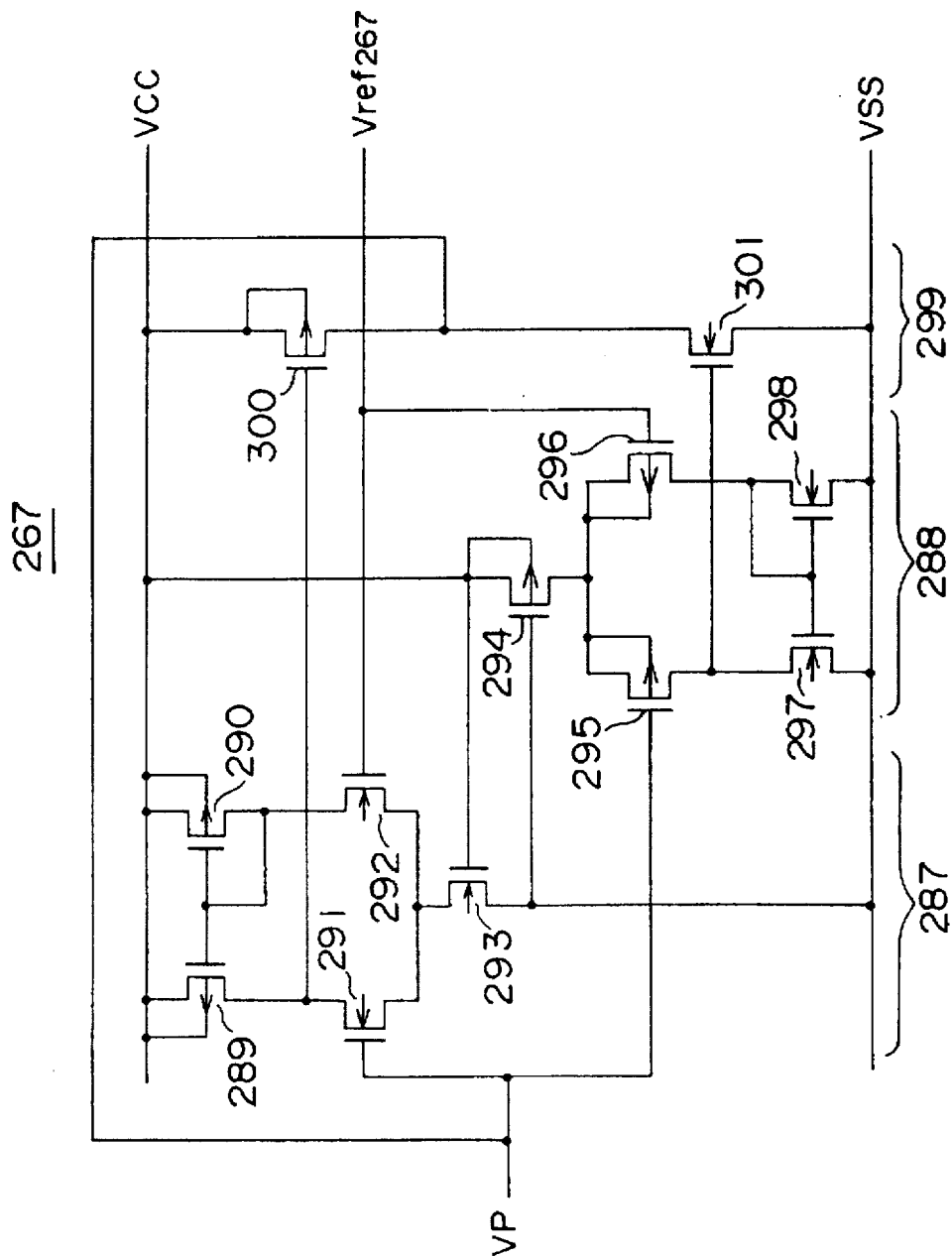
FIG. 34 is a circuit diagram of another operational amplifier shown in FIG. 32.

The operational amplifier 267 is configured as shown in FIG. 34. The operational amplifier 267 includes differential amplifier circuits 287 and 288. The operational amplifier 287 includes enhancement type pMOS transistors 289 and 290 forming a current-mirror circuit functioning as a load. The operational amplifier 287 further includes enhancement type nMOS transistors 291 and 292 functioning as driving transistors, and an enhancement type nMOS transistor 293 functioning as a resistor.

The differential amplifier 288 includes an enhancement type pMOS transistor 294 functioning as a resistor, enhancement type pMOS transistors 295 and 296 functioning as driving transistors, and enhancement type nMOS transistors 297 and 298 functioning as loads. The operational amplifier 267 further includes an output circuit 299, which is made up of an enhancement type pMOS transistor 300 functioning as a pull-up element, and an enhancement type nMOS transistor 301 functioning as a pull-down element.

The operational amplifier 267 thus formed is capable of providing the bias voltage VP kept constant immune to variations in the power supply voltage VCC.

Figure 35:
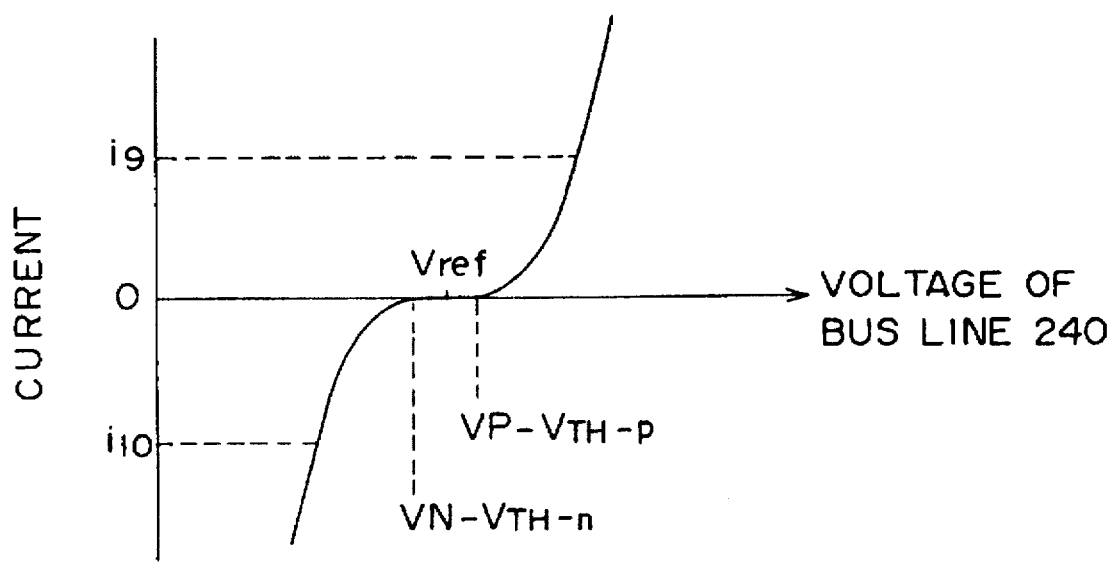
FIG. 35 is a graph of the characteristic of a termination unit used in the eighth embodiment of the present invention.

FIG. 35 is a graph of a characteristic of the termination unit 259, in which the horizontal axis thereof denotes the voltage of the bus line 240, and the positive side of the vertical axis denotes the magnitude of a current $i_9$, which flows from the VCCQ power supply line 235 to the pMOS transistor 261 via the pMOS transistor 237 and the bus line 240 when the pMOS transistor 237 is turned ON and the nMOS transistor 238 is turned OFF. The negative side of the vertical axis of the graph denotes the magnitude of a current $i_{10}$, which flows from the VCCQ power supply line 229 to the nMOS transistor 238 via the nMOS transistor 260 and the bus line 240 when the pMOS transistor 237 is OFF and the nMOS transistor 238 is ON.

According to the eighth embodiment of the present invention, the current $i_9$ flows from the VCCQ power supply line 235 to the bus line 240 via the pMOS transistor 237 when the pMOS transistor 237 is turned ON and the nMOS transistor 238 is turned OFF. Hence, the voltage of the bus line 240 is increased. Then, when the voltage of the bus line 240 exceeds the voltage $VP-V_{TH-p}$, the pMOS transistor 261 is turned ON, so that the current is allowed to flow in the pMOS transistor 261 and the voltage of the bus 240 is increased to the high-level voltage equal to, for example, 0.8 V.

When the pMOS transistor 237 is turned OFF and the nMOS transistor 238 is turned ON, the current $i_{10}$ flows from the bus line 240 to the ground via the nMOS transistor 238, so that the voltage of the bus line 240 is decreased. Thereafter, when the voltage of the bus line 240 becomes lower than $VN-V_{TH-n}$, the nMOS transistor 260 is turned ON, so that the current can flow in the nMOS transistor 260 and the voltage of the bus line 240 is decreased to the low-level voltage equal to, for example, 0.4 V.

As described above, according to the eighth embodiment of the present invention, it is possible to ensure the stability of the termination voltage VTT=VCCQ=1.2 V because no current flows to the VCCQ power supply line 229 even when the high-level output is output by the output circuit 236.

At the time when the signal from the output circuit 236 is input or output, the nMOS transistors 260 and 261 are in the non-conducting state. Hence, the reflection of transmitted signals may take place until the nMOS transistor 260 or the pMOS transistor 261 is switched to the conducting state. However, the above reflection is very small and does not substantially affect the signal transmission.

Further, according to the eighth embodiment of the present invention, it is possible to reduce power consumption because no current flows in the termination unit 259 as long as no signal is transmitted via the bus line 240.

The bias voltages VN and VP to be supplied to the nMOS transistor 260 and the pMOS transistor 261, respectively, are not generated by voltage dividing by means of a resistor network, but are generated by the bias voltage generating circuit 262 which includes the differential amplifier circuits. With the above structure, it becomes possible to prevent the gate voltage from being modulated due to the parasitic capacitance between the gate and the source when the current draws from the source side.

A description will now be given, with reference to FIG. 36, of an electronic system according to a ninth embodiment of the present invention. The system shown in FIG. 36 includes an input circuit 303 of a microprocessor, and a VCC power supply line 304 via which the power supply voltage VCC equal to 3.3 V is supplied. The system includes an output circuit 305 of the microprocessor. The output circuit 305 is made up of a VCCQ power supply line 306 via which the power supply voltage VCCQ equal to 1.2 V is supplied, a depletion type nMOS transistor 307 functioning as a pull-up element, and an enhancement type nMOS transistor 308 functioning as a pull-down element.

Figure 36:
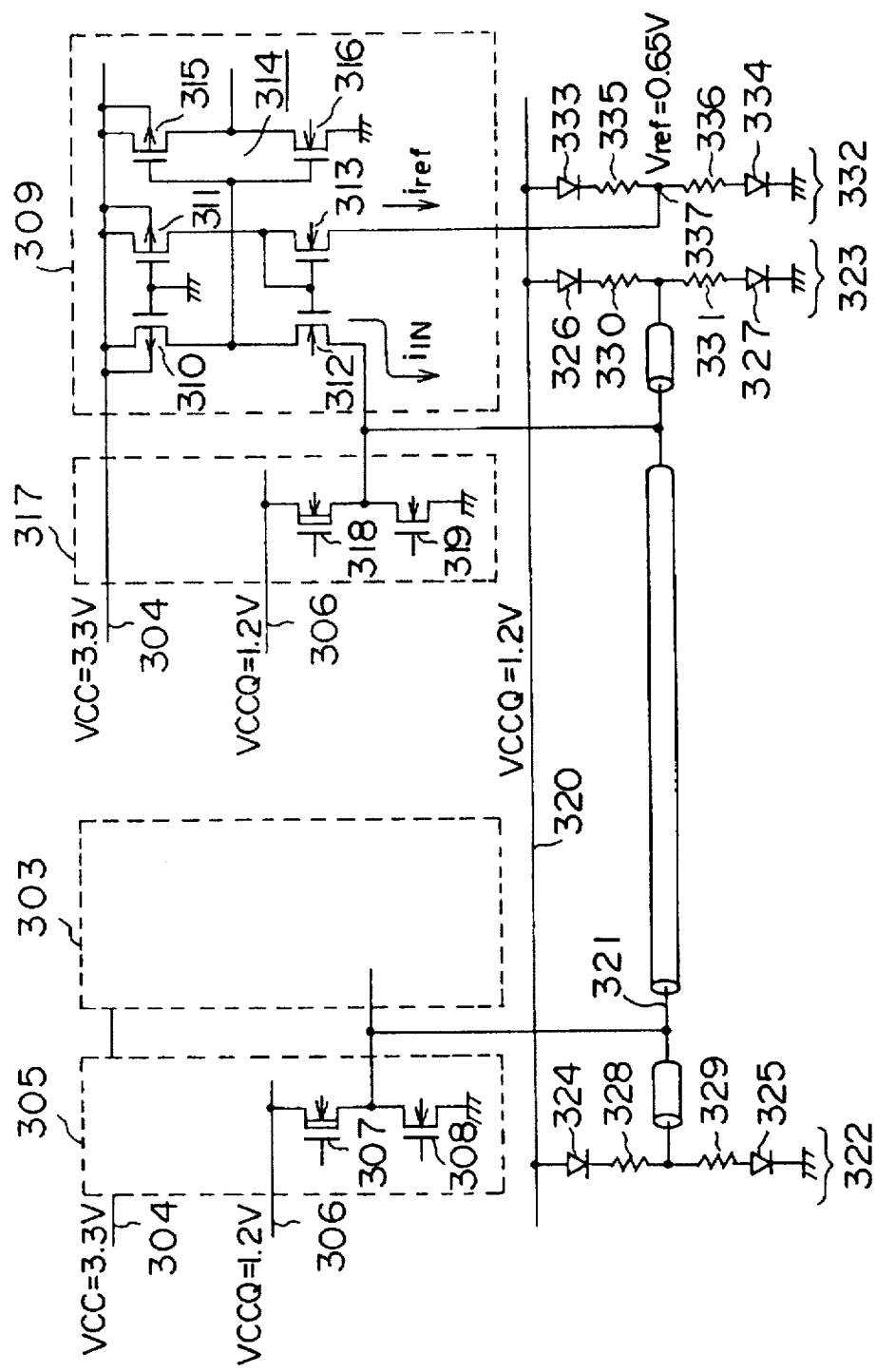
FIG. 36 is a circuit diagram of an essential part of a ninth embodiment of the present invention.

Further, the system shown in FIG. 36 includes an input circuit 309 of an SDRAM device. The input circuit 309 includes enhancement type pMOS transistors 310 and 311 functioning as loads, and enhancement type nMOS transistors 312 and 313 forming a current-mirror circuit. Further, the input circuit 309 includes an inverter 314 for shaping the signal waveform, an enhancement type pMOS transistor 315, and an enhancement type nMOS transistor 316.

The system shown in FIG. 36 includes an output circuit 317, which has a depletion type nMOS transistor 318 functioning as a pull-up element, and an enhancement type nMOS transistor 319 functioning as a pull-down transistor. As shown in FIG. 36, there are provided a VCCQ power supply line 320, a bus line 321 functioning as a signal transmission path, termination units 322 and 323 for terminating the bus line 321, diodes 324 through 327 each having a forward voltage of 0.65 V, and resistors 328–331 each having a resistance value of 15 Ω.

The system shown in FIG. 36 includes a reference voltage generating circuit 332, which generates the reference voltage Vref. The circuit 332 includes diodes 333 and 334 each having a forward voltage 0.65 V, and resistors 335 and 336.

In the ninth embodiment of the present invention, a current $i_{ref}$ flows from the pMOS transistor 311 to the ground via the nMOS transistor 313, the resistor 336 and the diode 334 in this order. Hence, the voltage of a node 337, that is, the reference voltage Vref is set to 0.65 V which is the forward voltage of the diode 334. As a result, when no signal is transmitted via the bus line 321, a current $i_{IN}$ flows from the pMOS transistor 310 to the ground via the nMOS transistor 312, the bus line 321, the resistors 329 and 331 and the diodes 325 and 327. Hence, the voltage of the bus line 321 is set to 0.65 V as in the case of the reference voltage Vref.

When the nMOS transistor 307 is turned OFF and the nMOS transistor 308 is turned ON in the output circuit 305, the current flows in the VCCQ power supply line 320, the diodes 324 and 326, the resistors 328 and 330, the bus line 321, the nMOS transistor 308 and the ground. Hence, the voltage of the bus line 321 is decreased to, for example, 0.4 V. Hence, the level of the drain of the nMOS transistor 312 becomes low, and the output level of the inverter 314 becomes high.

When the nMOS transistor 307 is turned ON and the nMOS transistor 308 is turned OFF in the output circuit 305, the current flows in the VCCQ power supply line 306, the nMOS transistor 307, the bus line 321, the resistors 329 and 331, the diodes 325 and 327 and the ground. Hence, the voltage of the bus line 321 is increased to, for example, 0.8 V. Hence, the level of the drain of the nMOS transistor 312 becomes high and the output of the inverter 314 becomes low.

In the ninth embodiment of the present invention, since the reference voltage Vref=0.65 V, the time necessary for the bus line 321 to decrease to 0.4 V when the low-level signal is transmitted via the bus line 321 may be longer than that necessary for the bus line 321 to increase to 0.8 V when the high-level signal is transmitted via the bus line 321.

However, this can be avoided by increasing the driving abilities of the nMOS transistors 308 and 319 serving as the pull-down elements of the output circuit.

According to the ninth embodiment of the present invention, the current cannot flow to the VCCQ power supply line 320 even when the output circuits 305 and 317 output the high-level signals. Hence, it is possible to ensure the stability in which the termination voltage VTT is equal to VCCQ equal to 1.2 V.

At the time when the signals are input to or output from the output circuits 305 and 317, the diodes 324–327 are in the non-conducting state. Hence, the reflection of transmitted signals may take place until the diodes 324 and 325 or the diodes 326 and 327 are switched to the conducting state. However, the above reflection is very small and does not substantially affect the signal transmission.

According to the ninth embodiment of the present invention, the power reduction can be achieved because the output circuits 305 and 317 are driven by the power supply voltage VCCQ equal to 1.2 V, which is lower than the power supply voltage of 3.3 V used to drive the input circuits 303 and 309 and the main body circuit.

A description will be given of improvements in input circuits of devices connected to bus lines.

Figure 37:
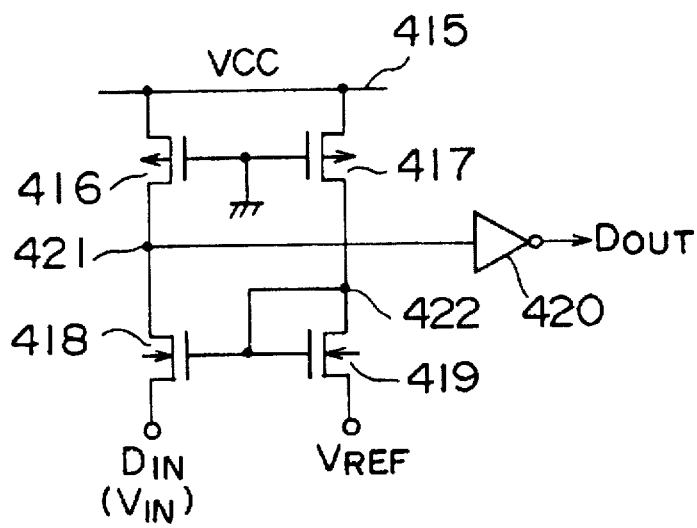
FIG. 37 is a circuit diagram of an input circuit different from the input circuits disclosed in the previous figures.

FIG. 37 is a circuit diagram of a part of the input circuit, which includes pMOS transistors 416 and 417, nMOS transistors 418 and 419 and an inverter 420. The pMOS transistors 416 and 417 respectively correspond to the pMOS transistors 310 and 311 shown in FIG. 36, and the nMOS transistors 418 and 419 respectively correspond to the nMOS transistors 312 and 313 shown therein. The inverter 420, which shapes the signal waveform, corresponds to the inverter 314 shown in FIG. 36. The nMOS transistors 418 and 419 form a current-mirror circuit. The transmission signal $D_{IN}$ is applied to the source of the nMOS transistor 418, and the reference voltage $V_{REF}$ is applied to the source of the nMOS transistor 419. The inverter 420 is connected to the drain (node 421) of the nMOS transistor 418, and shapes the waveform of the signal obtained at the node 421.

Figure 38:
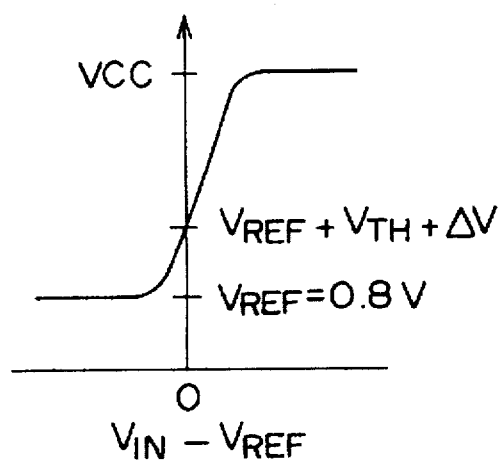
FIG. 38 is a graph of the characteristic of the input circuit shown in FIG. 37.

FIG. 38 is a graph of the relationship between the difference $V_{IN}-V_{REF}$ (that is, the difference between the voltage $V_{IN}$ of the transmission signal $D_{IN}$ input to the source of the nMOS transistor 418 and the reference voltage $V_{REF}$ applied to the source of the nMOS transistor 419) and the drain voltage of the nMOS transistor 418. That is, since the nMOS transistors 418 and 419 form the current-mirror circuit, the drain voltage of the nMOS transistor 418 becomes equal to the drain voltage of the nMOS transistor 419 (the voltage of a node 422) and is thus equal to $V_{REF}+V_{TH}+\Delta V_{TH}$ when $V_{IN}=V_{REF}$, where $V_{TH}$ denotes the threshold voltages of the nMOS transistors 418 and 419, and $\Delta V_{TH}$ denotes a voltage for correcting the threshold voltage $V_{TH}$ taking into consideration the sub-threshold currents of the nMOS transistors 418 and 419.

When $V_{IN}>V_{REF}$, that is, $V_{IN}-V_{REF}>0$, the gate-source voltage of the nMOS transistor 418 is reduced, while the inner resistance thereof is increased. Hence, the drain current of the nMOS transistor 418 is decreased, and the drain voltage thereof becomes higher than $V_{REF}+V_{TH}+\Delta V_{TH}$.

When $V_{IN}<V_{REF}$, that is, $V_{IN}-V_{REF}<0$, the gate-source voltage of the nMOS transistor 418 is increased, while the inner resistance thereof is decreased. Hence, the drain current of the nMOS transistor 418 is increased, and the drain voltage thereof becomes lower than $V_{REF}+V_{TH}+\Delta V_{TH}$.

The gate-source voltage of the nMOS transistor 419 is set to, for example, 1 V, and the drain voltage of the nMOS transistor 418 is set so that it swings about VCC/2 equal to 1.65 V. Further, the nMOS transistor 418 is set so that it operates in the so-called pentode operation range, that is, in a range in which a large mutual conductance is available. With the above arrangements, it becomes possible to obtain high-gain, high-bandwidth product characteristics.

The input circuit shown in FIG. 37 is provided for each of the bits. Generally, due to a restriction on the number of external terminals of a semiconductor integrated circuit device, it is impossible to provide the input circuits with respective reference voltage input terminals.

Figure 39:
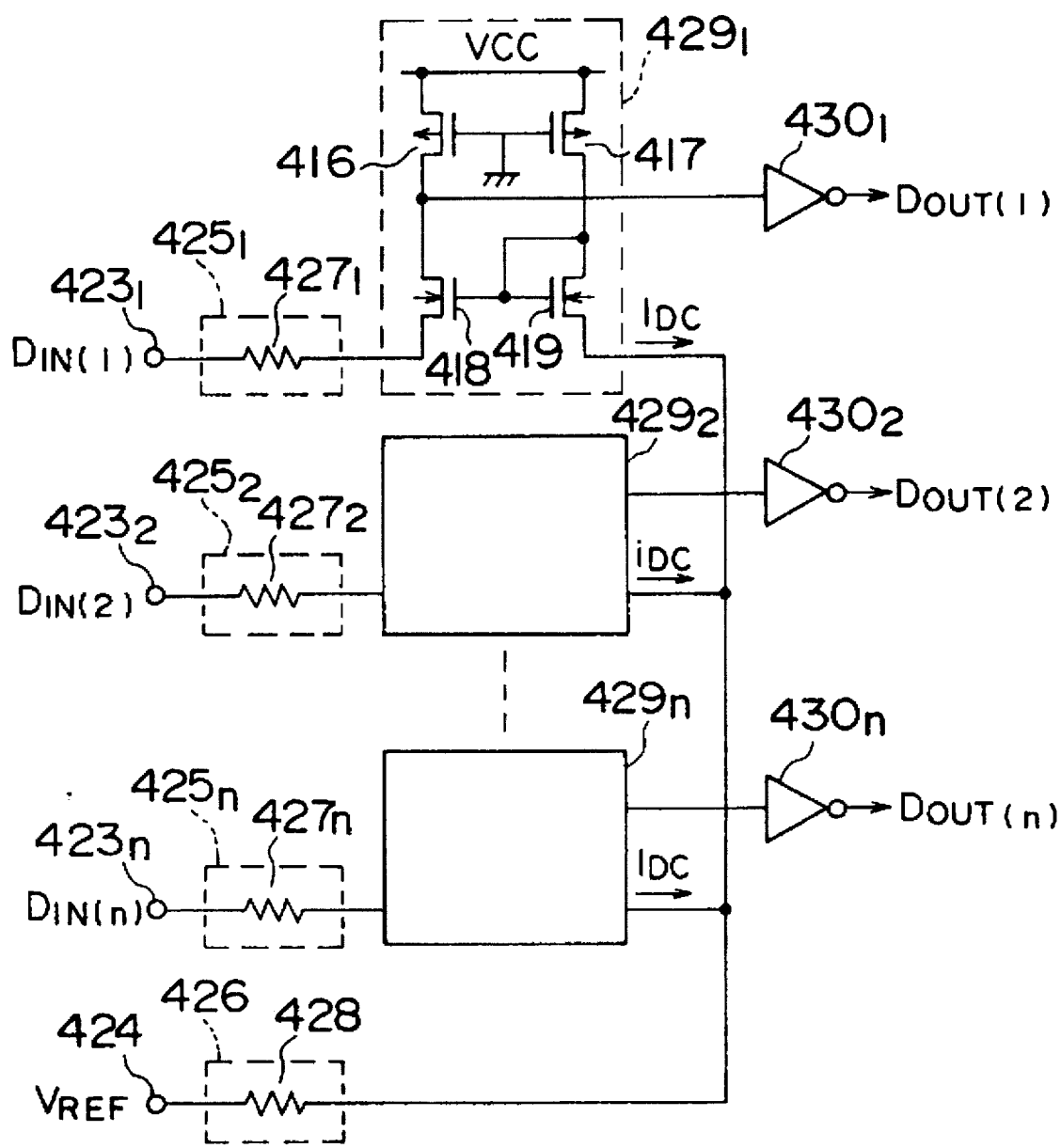
FIG. 39 is a block diagram of an input circuit unit of a multi-input semiconductor integrated circuit device having a plurality of input circuits, each having the structure shown in FIG. 38.

With the above in mind, as shown in FIG. 39, a single reference voltage input terminal to which the reference voltage $V_{REF}$ is provided in common for a plurality of input circuits. In FIG. 39, $D_{IN(1)}$, $D_{IN(2)}$, ..., $D_{IN(n)}$ denote transmission signals, which are respectively applied to input circuits $429_1$, $429_1$, ..., $429_n$ received via input terminals $423_1$, $423_2$, ..., $423_n$ and input protection circuits $425_1$, $425_2$, ..., $425_n$, which provide output signals $D_{OUT(1)}$, $D_{OUT(2)}$, ..., $D_{OUT(n)}$ via inverters $430_1$, $430_2$, ..., $430_n$ used for shaping the waveforms of the output signals. The input protection circuits $425_1$, $425_2$, ..., $425_n$ function to protect the circuits from electrostatic discharge.

However, in the structure shown in FIG. 39, there is a possibility that a large offset may occur in the reference voltage $V_{REF}$ due to a voltage drop developing across an inner resistor 428 of the input protection circuit 426 caused by the dc bias current flowing in the reference voltage input terminal 424 because the reference voltage input terminal 424 is used common to the input circuits $429_1$, $429_2$, ..., $429_n$.

Assuming that the dc bias current of the single nMOS transistor 419 is denoted by $i_{DC}$ and n=8, the current having the magnitude equal to $8 \times i_{DC}$ flows in the input protection circuit 426. Assuming that the inner resistance 428 of the input protection circuit 426 is denoted by $R_{426}$, the voltage drop $\Delta V_{428}$ developing across the inner resistance 428 of the input protection circuit 426 is equal to $8 \times i_{DC} \times R_{426}$. For example, when eight bits are input (N=8), $i_{DC}$=0.1 mA and $R_{428}$=500 Ω, the voltage drop $\Delta V_{428}$ developing across the inner resistance 428 of the input protection circuit 426 is equal to $8 \times 0.1 \times 10^{-3} \times 500$=0.4 V.

In the aforementioned GTL standard, the reference voltage $V_{REF}$ applied to the reference voltage input terminal 424 is equal to 0.8 V. Hence, the voltage of the other terminal of the input protection circuit 426 (inner reference voltage) becomes equal to 1.2 V (=0.8+0.4). However, the input high-level voltage $V_{IH}$ defined in the GTL standard is 0.8 V+50 mV and the input low-level voltage $V_{IL}$ defined therein is 0.8 V−50 mV. Hence, the inner reference voltage equal to 1.2 V cannot be utilized, and the offset of the inner reference voltage is limited to 5 mV.

Figure 40:
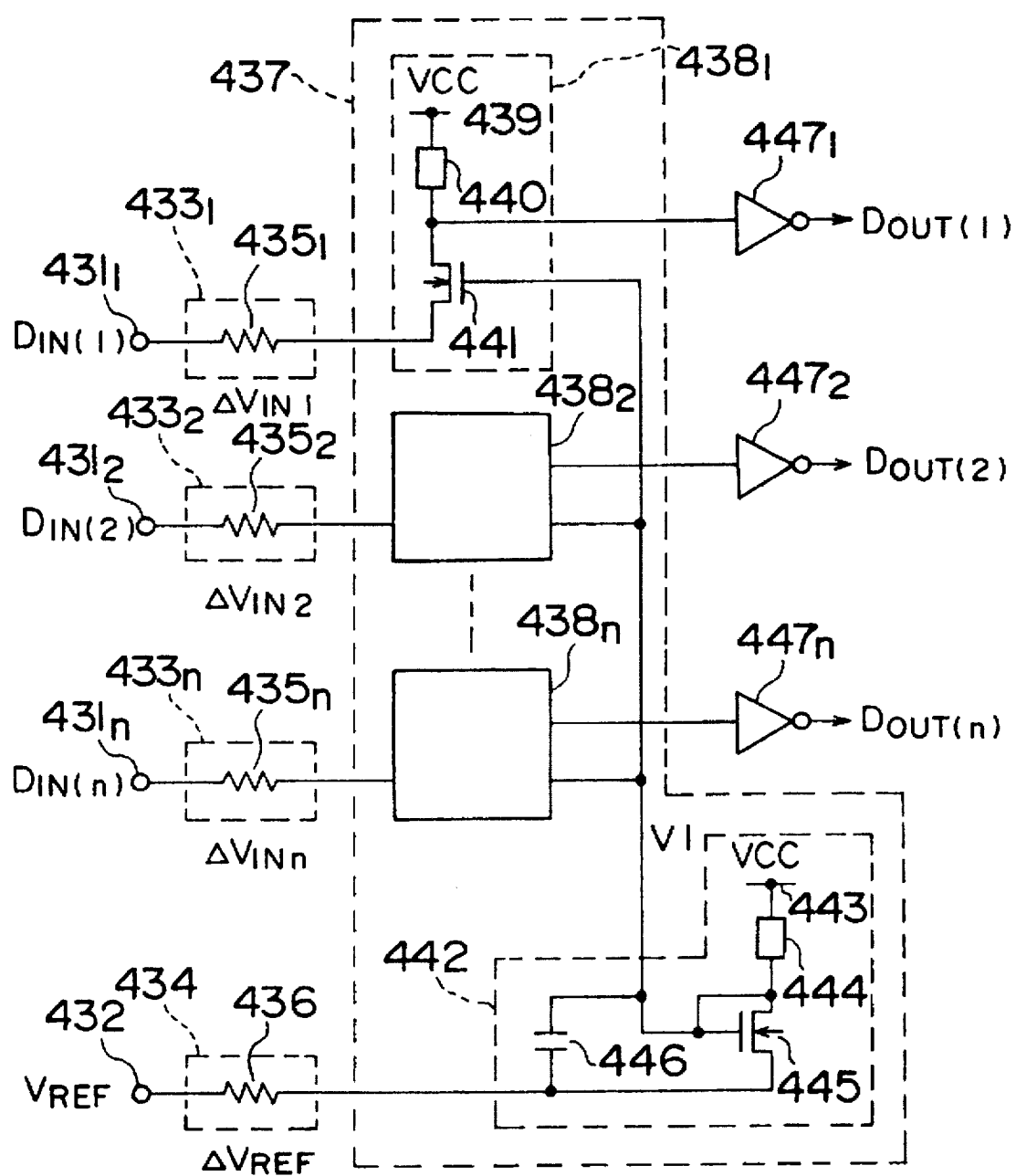
FIG. 40 is a circuit diagram of an input circuit according to a tenth embodiment of the present invention.

FIG. 40 is a circuit diagram of an input circuit according to a tenth embodiment of the present invention, which is an improvement in the input circuit taking into consideration the above matters. The input circuit shown in FIG. 40 includes transmitted signal input terminals $431_1$, $431_2$, ..., $431_n$, a reference voltage input terminal 432, input protection circuits $433_1$, $433_2$, ..., $433_n$ and 434, and inner resistors $435_1$, $435_2$, ..., $435_n$ and 436. An input circuit 437 includes logic decision circuits $438_1$, $438_2$, ..., $438_n$, which make logic decisions on the transmitted signals $D_{IN(1)}$, $D_{IN(2)}$, ..., $D_{IN(n)}$. The logic decision circuit $438_1$ includes a power supply line 439 via which the power supply voltage VCC is supplied, a load element 440 and an n-channel insulation gate type field effect transistor 441 functioning as an input transistor. Further, the input circuit 437 includes an inner reference voltage generating circuit 442, which generates the inner reference voltage V1 to be supplied to the gates of the n-channel insulation gate type field effect transistors of the logic decision circuits $438_1$, $438_2$, ..., $438_n$.

The inner reference voltage generating circuit 442 includes a power supply line 443 via which the power supply voltage VCC is supplied, a load element 444, and n-channel insulation gate type field effect transistor 45, which forms a current-mirror circuit in cooperation with the transistor 41 of each of the logic decision circuits $438_1$, $438_2$, ..., $438_n$. Further, a capacitor 446 is provided between the gate of the transistor 441 and the inner end of the input protection circuit 434.

Further, there are provided inverters $447_1$, $447_2$, ..., $447_n$, which shape the waveforms of the signals obtained at the drains of the transistors 441 of the logic decision circuits $438_1$, $438_2$, ..., $438_n$. The transmitted signal input terminals $431_1$, $431_2$, ..., $431_n$ are connected to the sources of the transistors 441 via the input protection circuits $433_1$, $433_2$, ..., $433_n$. The reference voltage input terminal 432 is connected to the source of the transistor 445 of the inner reference voltage generating circuit 442.

The n-channel insulation gate type field effect transistors 441 which receive the transmitted signals $D_{IN}$ have a large mutual conductance gm and a high cutoff frequency. These transistors 441 can be operated in the pentode operation range in the same way as the nMOS transistors 418 of the input circuit shown in FIG. 37. Further, the single inner reference voltage generating circuit 442 is commonly provided to the logic decision circuits $438_1$, $438_2$, ..., $438_n$. Hence, the dc bias currents flowing in the logic decision circuits $438_1$, $438_2$, ..., $438_n$ are the same as the dc bias current flowing in the inner reference voltage generating circuit 442.

Hence, when the inner resistances $435_1$, $435_2$, ..., $435_n$ and 436 of the input protection circuits $433_1$, $433_2$, ..., $433_n$ and 434 are the same as each other, the voltage drop $\Delta V_{REF}$ developing across the inner resistance 436 of the input protection circuit 434 becomes equal to the voltage drops $\Delta V_{IN}1$, $\Delta V_{IN2}$, ..., $\Delta V_{INn}$ respectively developing the inner resistances $435_1$, $435_2$, ..., $435_n$ in which the dc bias currents flow.

That is, according to the tenth embodiment of the present invention, the voltage drop developing across the inner resistance 436 of the input protection circuit 434 becomes identical to the voltage drops developing across the inner resistances $435_1$, $435_2$, ..., $435_n$ of the input protection circuits $433_1$, $433_2$, ..., $433_n$ when the voltages of the transmitted signals $D_{IN(1)}$, $D_{IN(2)}$, ..., $D_{IN(n)}$ become equal to 0.8 V which is the logic decision reference voltage $V_{REF}$. Hence, it becomes possible to maintain the dc balance between the logic decision circuits $438_1$, $438_2$, ..., $438_n$ and the inner reference voltage generating circuit 442.

Figure 41:
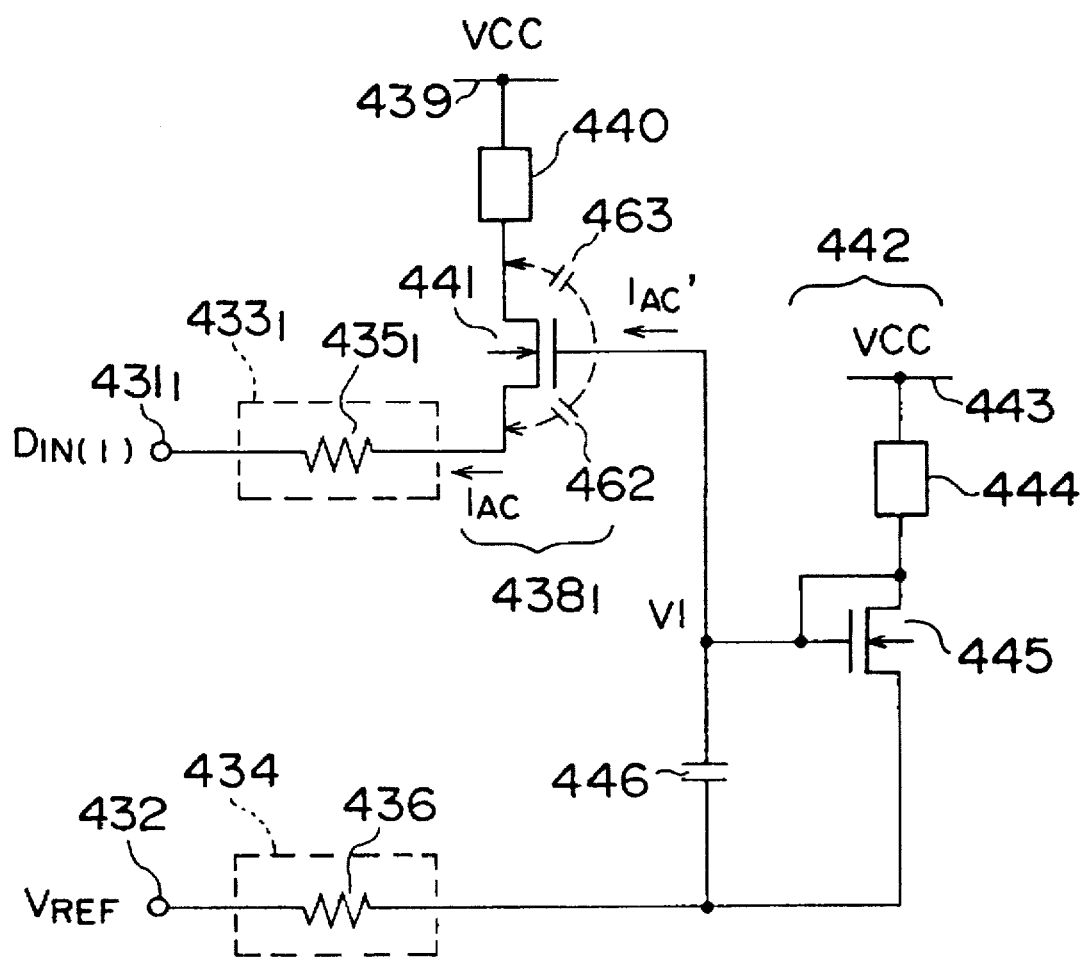
FIG. 41 is a circuit diagram of the operation of the input circuit shown in FIG. 40.

Further, according to the tenth embodiment of the present invention, if the transmitted signal $D_{IN(1)}$ applied to the logic decision circuit $438_1$ switches from the high level to the low level, the current flowing in the transistor 441 is increased. In this case, as shown in FIG. 41, an ac component (a fine component) $i_{AC}$ in the above increase in the current is supplied via a parasitic capacitance 462 between the gate and source of the n-channel insulation gate type field effect transistor 441.

Further, in the above case, the drain voltage of the transistor 441 is decreased, while a parasitic capacitance 463 between the drain and gate of the transistor 441 is substantially increased due to the mirror effect. Hence, a current flows from the gate of the transistor 441 to the drain thereof, and hence a current $i_{AC}$, flowing to the gate of the transistor 441 becomes greater than the current $i_{AC}$ flowing to the source thereof.

If a capacitance 446 is not provided between the gate of the transistor 445 and the output terminal of the input protection circuit 434, the gate voltage of the transistor 445 of the inner reference voltage generating circuit 442 will be greatly decreased when the transmitted signals $D_{IN(1)}$, $D_{IN(2)}$, ..., $D_{IN(N)}$ simultaneously change from the high level to the low level. If such a change is allowed, the diode-connected transistor 445 of the inner reference voltage generating circuit 442 is cut off, and the gate voltage of the transistor 445, that is, the inner reference voltage V1, is maintained at a low level. If noise is superimposed on any of the transmitted signal input terminals $431_1$, $431_2$, ..., $431_n$, the above noise is mistakenly determined as a high-level signal.

However, the capacitor 446 is provided between the gate of the transistor 445 and the output end of the input protection circuit 434. Hence, it is possible to supply, via the capacitor 446, the current $i_{AC}$, flowing in the gate of the transistor 441. Hence, it is also possible to suppress an ac offset which transiently takes place.

As described above, the structure shown in FIG. 40 is capable of operating in the pentode operation range, balancing the dc offset and suppressing the ac offset. Thus, high-gain, high-bandwidth product characteristics can be obtained in the high-speed, very small signal transmissions. The structure shown in FIG. 40 can meet the aforementioned GTL standard.

Figure 42:
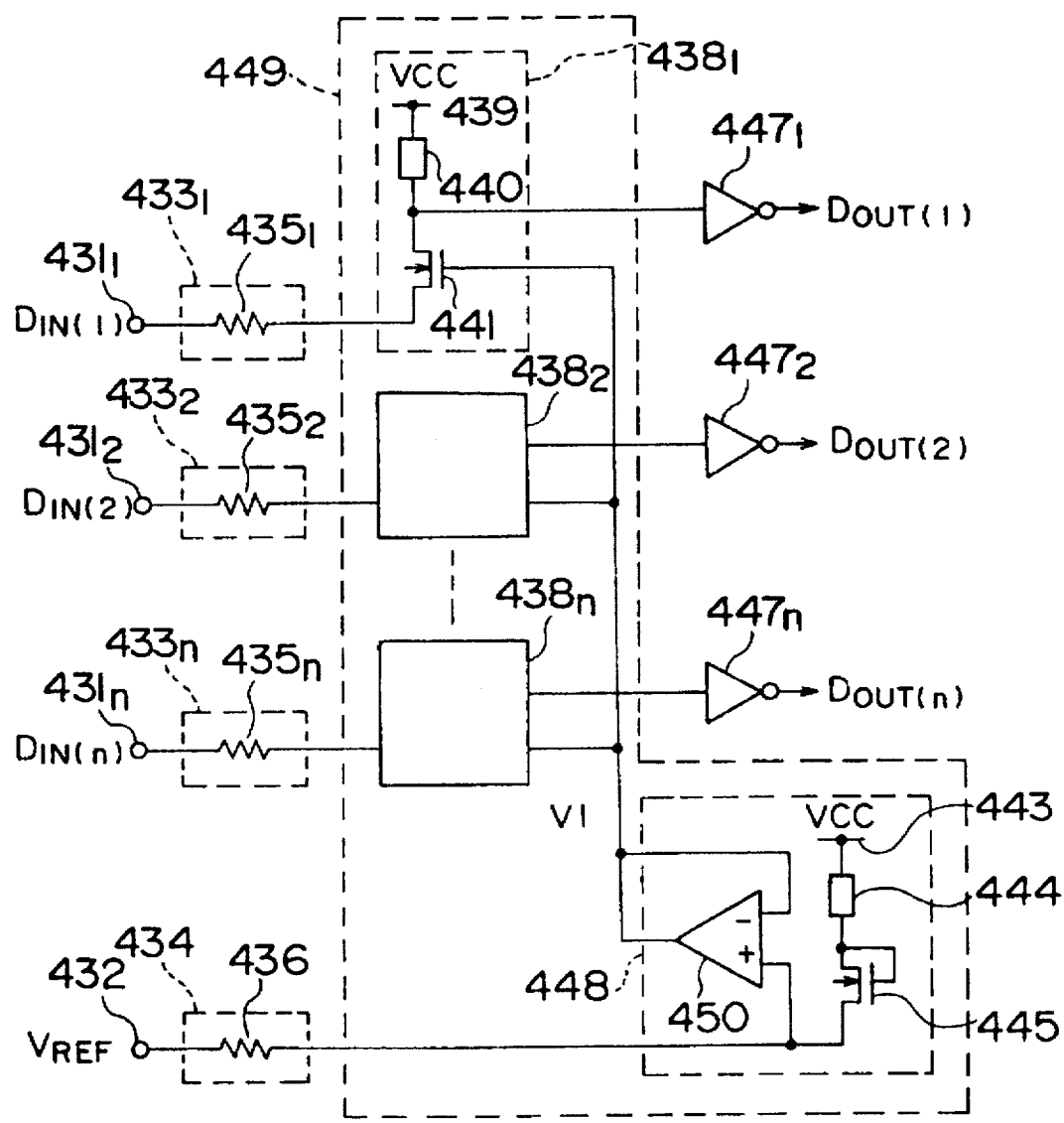
FIG. 42 is a block diagram of an input circuit according to an eleventh embodiment of the present invention.

FIG. 42 is a circuit diagram of an eleventh embodiment of the present invention, which is another improvement in the aforementioned input circuit. An inner reference voltage generating circuit 448 shown in FIG. 42 has a structure different from that of the circuit 442 shown in FIG. 40. The other parts of the structure shown in FIG. 42 are the same as corresponding ones of the structure shown in FIG. 40. The inner reference voltage generating circuit 448 includes an operational amplifier 450, which forms a voltage follower circuit.

As in the case of the tenth embodiment of the present invention, n-channel insulation gate type field effect transistors 441 which receive the transmitted signals $D_{IN}$ have a large mutual conductance gm and a high cutoff frequency. These transistors 441 can be operated in the pentode operation range in the same way as the nMOS transistors 418 of the input circuit shown in FIG. 37. Further, the single inner reference voltage generating circuit 448 is commonly provided for the logic decision circuits $438_1$, $438_2$, ..., $438_n$. Hence, the dc bias currents flowing in the logic decision circuits $438_1$, $438_2$, ..., $438_n$ are the same as the dc bias current flowing in the inner reference voltage generating circuit 448.

Hence, when the inner resistances $435_1$, $435_2$, ..., $435_n$ and 436 of the input protection circuits $433_1$, $433_2$, ..., $433_n$ and 434 are the same as each other, the voltage drop $\Delta V_{REF}$ developing across the inner resistance 436 of the input protection circuit 434 becomes equal to the voltage drops $\Delta V_{IN}1$, $\Delta V_{IN2}$, ..., $\Delta V_{INn}$ respectively developing across the inner resistances $435_1$, $435_2$, ..., $435_n$ in which the dc bias currents flow. In the eleventh embodiment of the present invention, the inner reference voltage V1 is equal to $V_{REF}$+$\Delta V_{REF}$.

That is, according to the eleventh embodiment of the present invention, the voltage drop developing across the inner resistance 436 of the input protection circuit 434 becomes identical to the voltage drops developing across the inner resistances $435_1$, $435_2$, ..., $435_n$ of the input protection circuits $433_1$, $433_2$, ..., $433_n$ when the voltages of the transmitted signals $D_{IN(1)}$, $D_{IN(2)}$, ..., $D_{IN(n)}$ become equal to 0.8 V which is the logic decision reference voltage $V_{REF}$. Hence, it becomes possible to maintain the dc balance between the logic decision circuits $438_1$, $438_2$, ..., $438_n$ and the inner reference voltage generating circuit 448.

The operational amplifier 450 is feed-back controlled so that the voltage of the non-inverting input terminal thereof is equal to that of the inverting input terminal thereof. Hence, the voltage of the output terminal of the operational amplifier 450, that is, the inner reference voltage V1 is controlled so as to be always equal to $V_{REF}$+$\Delta V_{REF}$. Hence, even if the transmission signals $D_{IN(1)}$, $D_{IN(2)}$, ..., $D_{IN(n)}$ simultaneously switch from the high level to the low level, the currents flowing in the gate of the transistors 441 are supplied by the operational amplifier 450 without any decrease in the inner reference voltage V1. Hence, it is also possible to suppress an ac offset which transiently takes place in the same way as the structure shown in FIG. 40. In addition, the circuit shown in FIG. 42 cannot be affected by simultaneous switching noises.

As described above, the structure shown in FIG. 42 is capable of operating in the pentode operation range, balancing the dc offset and suppressing the ac offset. Thus, high-gain, high-bandwidth product characteristics can be obtained in the high-speed, very small signal transmissions. The structure shown in FIG. 42 can meet the aforementioned GTL standard.

In the structure shown in FIG. 40, it is necessary to study whether an ac offset can be permitted for each different system because the ac component current flows in the input protection circuit 434 when the transmitted signals $D_{IN(1)}$, $D_{IN(2)}$, ..., $D_{IN(n)}$ simultaneously change from the high level to the low level. On the other hand, in the structure shown in FIG. 42, even when the transmitted signals $D_{IN(1)}$, $D_{IN(2)}$, ..., $D_{IN(n)}$ concurrently change from the high level to the low level, a current due to the above change does not flow in the input protection circuit 434. Hence, it is not necessary to study, for each different system, whether or not an ac offset can be permitted. In this regard, the design of the structure shown in FIG. 42 is simpler than that of the structure shown in FIG. 40.

Figure 43:
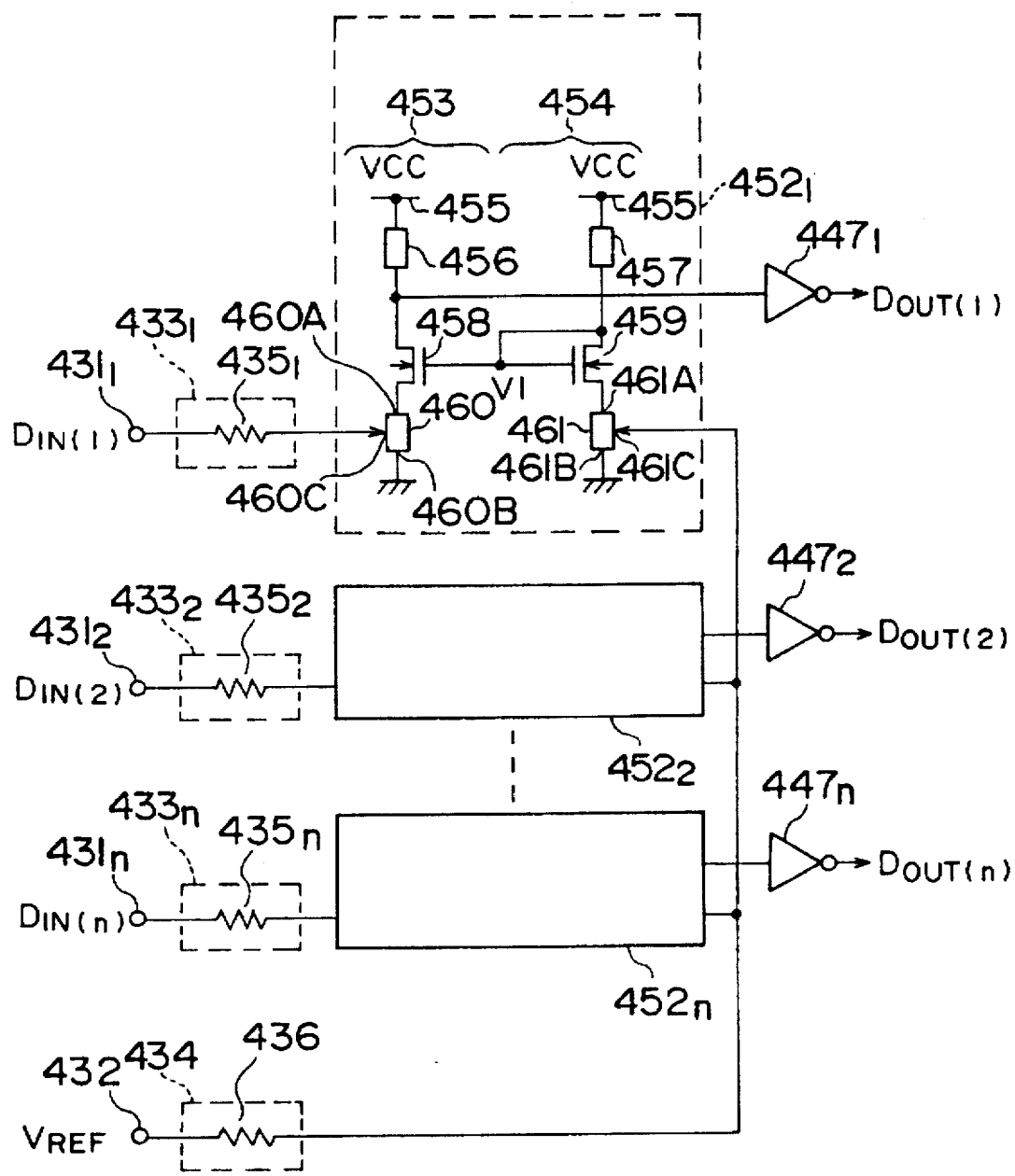
FIG. 43 is a block diagram of an input circuit according to a twelfth embodiment of the present invention.

FIG. 43 is a circuit diagram of a twelfth embodiment of the present invention, which is yet another improvement in the aforementioned input circuit. The circuit shown in FIG. 43 includes input circuits $452_1$, $452_2$, ..., $452_n$ each having the same structure. For example, the input circuit $452_1$ has a logic decision circuit 453 making a logic decision on the transmitted signal $D_{IN(1)}$, and an inner reference voltage generating circuit 454 for generating the inner reference voltage V1 to be supplied to the logic decision circuit 453.

In the circuits 453 and 454, there are provided a power supply line 455 via which the power supply voltage VCC is supplied, load elements 456 and 457, and n-channel insulation gate type field effect transistors 458 and 459 forming a current-mirror circuit. Further, there are provided variable impedance elements 460 and 461, current input terminals 460A and 461A, current output terminals 460B and 461B, and control terminals 460C and 461C via which the impedance values of the elements 460 and 461 are controlled.

The transferred signal input terminals $431_1$, $431_2$, ..., $431_n$ are respectively connected to control terminals 460C of the variable impedance elements 460 of the input circuits $452_1$, $452_2$, ..., $452_n$ via the input protection circuits $433_1$, $433_2$, ..., $433_n$. The reference voltage input terminal 432 is connected to control terminals 461C of the variable impedance elements 461 of the input circuits $452_1$, $452_2$, ..., $452_n$ via the input protection circuit 434. The inverters $447_1$, $447_2$, ..., $447_n$ for shaping the waveforms of the respective input signals receive the signals obtained at the drains of the transistors 458 of the input circuits $452_1$, $452_2$, ..., $452_n$.

The dc bias currents of the logic decision circuits 453 of the input circuits $452_1$, $452_2$, ..., $452_n$ do not flow in the input protection circuits $433_1$, $433_2$, ..., $433_n$, and no voltage drops develop across the inner resistors $435_1$, $435_2$, ..., $435_n$. This is because the transferred signal input terminals $431_1$, $431_2$, ..., $431_n$ are respectively connected to control terminals 460C of the variable impedance elements 460 of the input circuits $452_1$, $452_2$, ..., $452_n$ via the input protection circuits $433_1$, $433_2$, ..., $433_n$.

The reference voltage input terminal 432 is connected to the control terminals 461C of the variable impedance elements 461 of the inner reference voltage generating circuits 454 via the input protection circuit 434. Hence, the dc bias currents of the inner reference circuits 454 do not flow in the input protection circuit 434, and no voltage drop develops across the inner resistance 436 of the input protection circuit 434 due to the dc bias currents of the inner reference voltage generating circuits 454. Hence, the offset caused by the dc bias currents is not superimposed on the inner reference voltages V1 generated by the inner reference voltage generating circuits 454 of the input circuits $452_1$, $452_2$, ..., $452_n$.

Further, according to the embodiment of the present invention being considered, the logic decision circuits 453 are equipped with the respective inner reference voltage generating circuits 454. Hence, the inner reference voltages V1 are not decreased even if the transmitted signals $D_{IN(1)}$, $D_{IN(2)}$, ..., $D_{IN(n)}$ concurrently change from the high level to the low level. It is also possible to suppress an ac offset which transiently takes place in the same way as the first structure shown in FIG. 40. In addition, the circuit shown in FIG. 43 cannot be affected by simultaneous switching noises.

As described above, the structure shown in FIG. 43 is capable of operating in the pentode operation range, balancing the dc offset and suppressing the ac offset. Thus, high-gain, high-bandwidth product characteristics can be obtained in the high-speed, very small signal transmissions. The structure shown in FIG. 43 can meet the aforementioned GTL standard.

Figure 44:
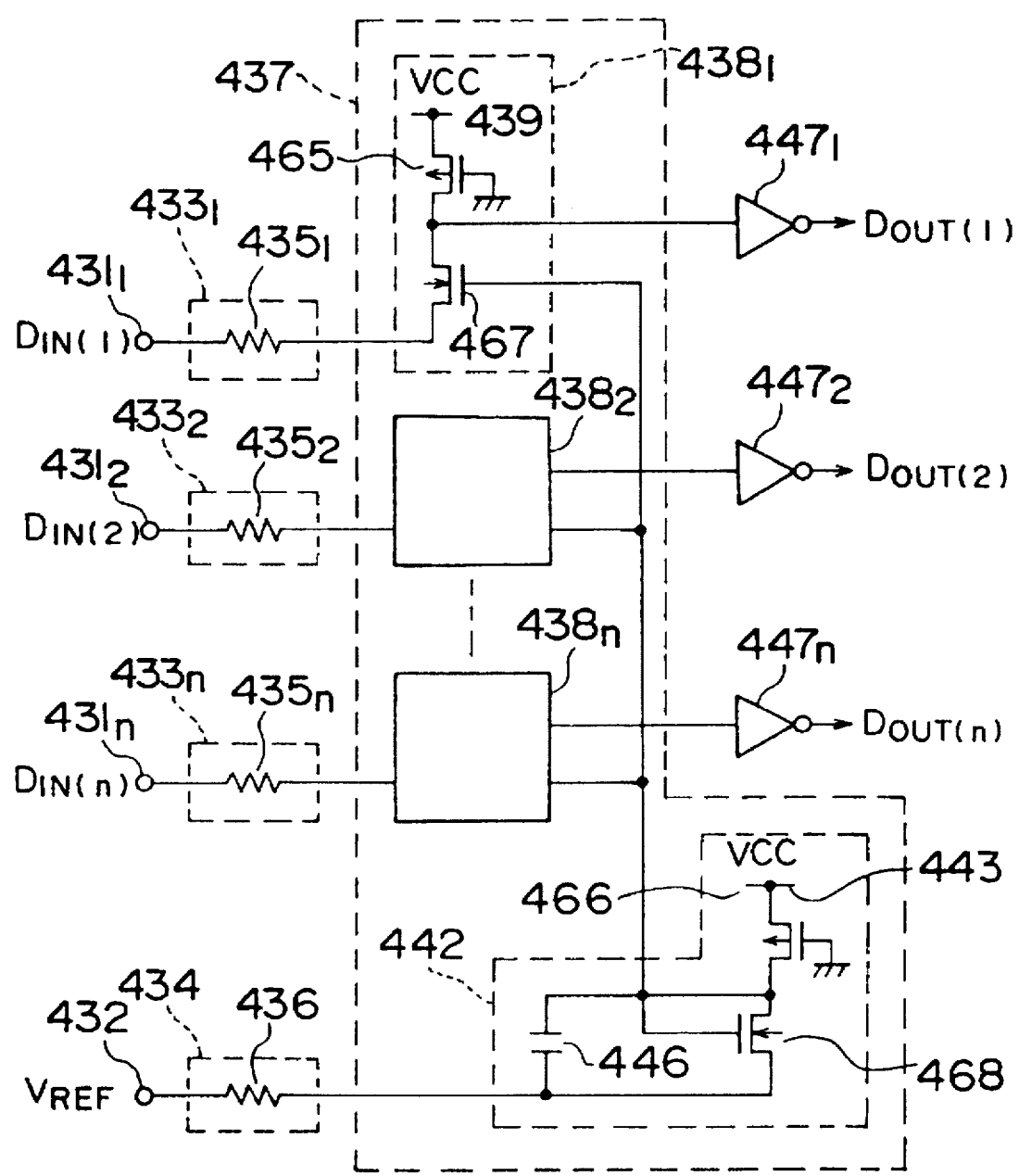
FIG. 44 is a block diagram of the detailed structure of the input circuit shown in FIG. 40.

A description will now be given, with reference to FIG. 44, of details of the tenth embodiment of the present invention. In FIG. 44, parts that are the same as those shown in FIG. 40 are given the same reference numbers.

The load elements 440 and 444 shown in FIG. 40 are respectively formed of enhancement type pMOS transistors 465 and 466. Further, the n-channel insulation gate field effect transistors 441 and 445 are formed of enhancement type nMOS transistors 467 and 468, respectively. The gates of the pMOS transistors 465 and 466 are grounded and used as resistors. If the gates of the pMOS transistors 465 and 466 are supplied with the bias voltages enabling these pMOS transistors to operate in the pentode operation range and operate as constant-current sources, it is possible to increase the bandwidth product, as compared with that used when these transistors are used as resistors.

Figure 45:
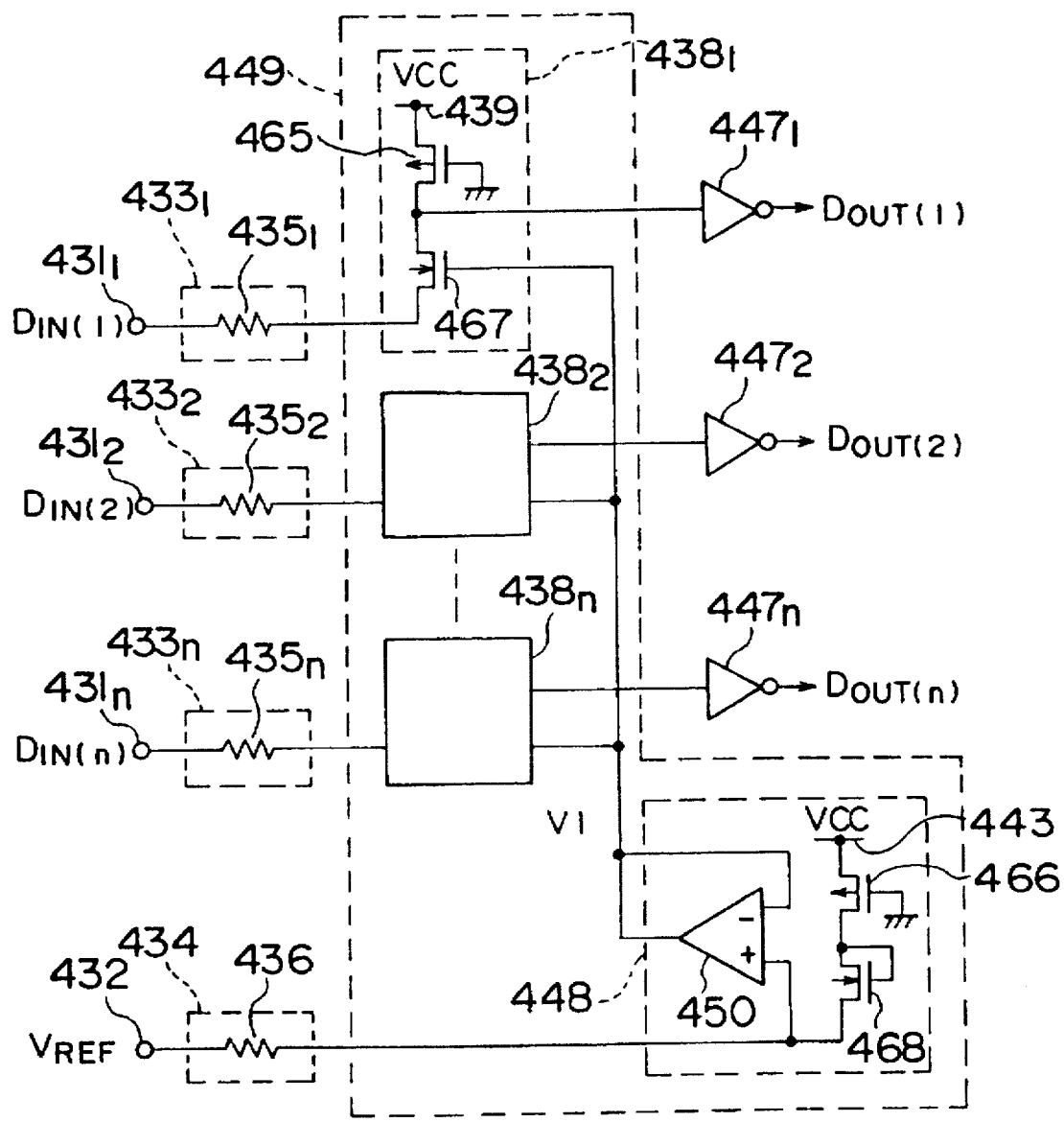
FIG. 45 is a block diagram of the detailed structure of the input circuit shown in FIG. 41.

A description will now be given, with reference to FIG. 45, of details of the eleventh embodiment of the present invention shown in FIG. 42. In FIG. 45, parts that are the same as those shown in FIGS. 42 and 44 are given the same reference numbers.

The load elements 440 and 444 shown in FIG. 42 are respectively formed of the enhancement type pMOS transistors 465 and 466. Further, the n-channel insulation gate field effect transistors 441 and 445 are formed of the enhancement type nMOS transistors 467 and 468, respectively.

Figure 46:
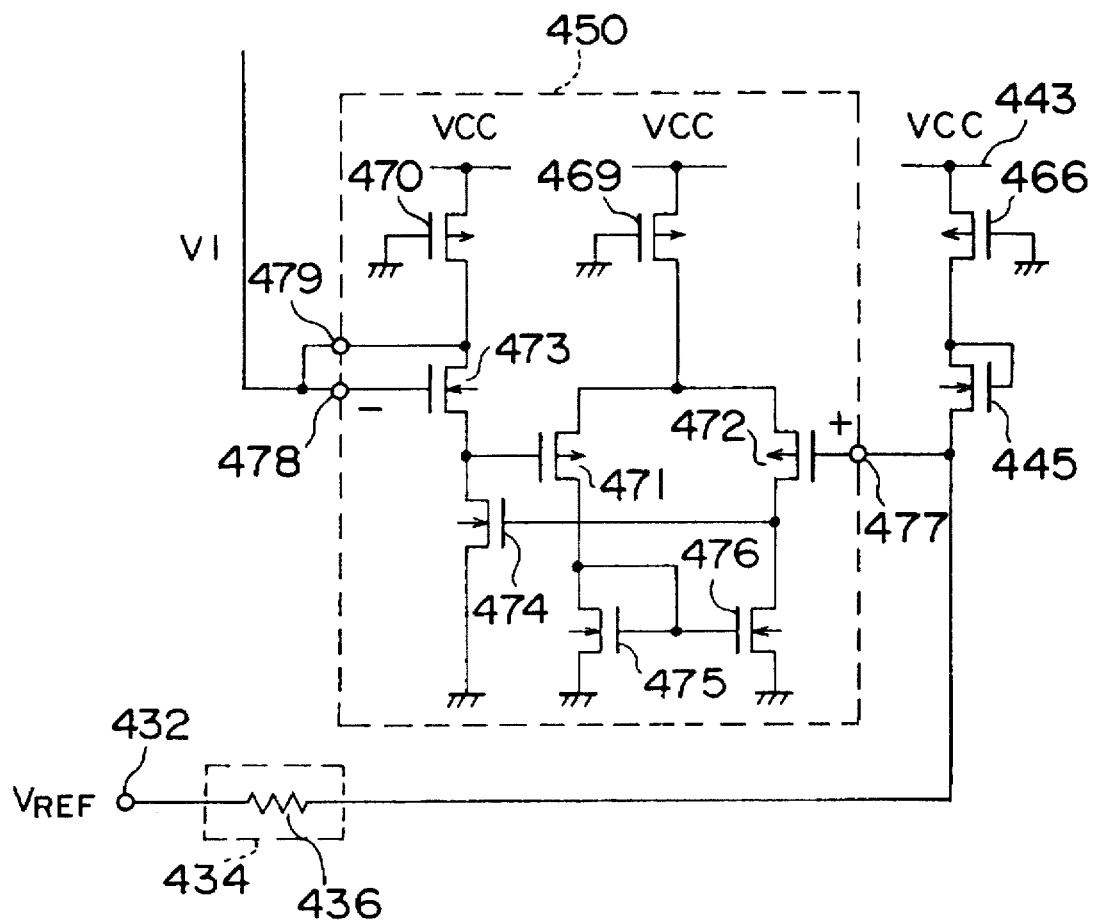
FIG. 46 is a circuit diagram of an inner reference voltage generating circuit shown in FIG. 45.

The operational amplifier 450 shown in FIG. 45 is configured as shown in FIG. 46. The operational amplifier 450 is made up of enhancement type pMOS transistors 469–472, enhancement type nMOS transistors 473–476, a non-inverting input terminal 477, an inverting input terminal 478, and an output terminal 479. As in the case of the tenth embodiment of the present invention, the gates of the pMOS transistors 465 and 466 are grounded and used as resistors. However, if the gates of the pMOS transistors 465 and 466 are supplied with the bias voltages enabling these pMOS transistors to operate in the pentode operation range and operate as constant-current sources, it is possible to increase the bandwidth product, as compared with that used when these transistors are used as resistors.

A description will now be given, with reference to FIG. 47, of details of the twelfth embodiment of the present invention shown in FIG. 43. In FIG. 47, parts that are the same as those shown in FIG. 43 are given the same reference numbers.

The load elements 456 and 457 shown in FIG. 43 are formed of enhancement type pMOS transistors 480 and 481, respectively. The variable impedance elements 460 and 461 are respectively formed of enhancement type pMOS transistors 482 and 483. Enhancement type nMOS transistors 484 and 485 are used as the n-channel insulation gate type field effect transistors 458 and 459, respectively. The variable impedance elements 460 and 461 can be formed of enhancement type nMOS transistors rather than the enhancement type pMOS transistors. However, when the reference voltage is as low as 0.8 V, it is suitably possible to use depletion type nMOS transistors having a threshold voltage equal to or lower than 0 V in order to obtain high-gain, high-bandwidth product characteristics.

Figure 48:
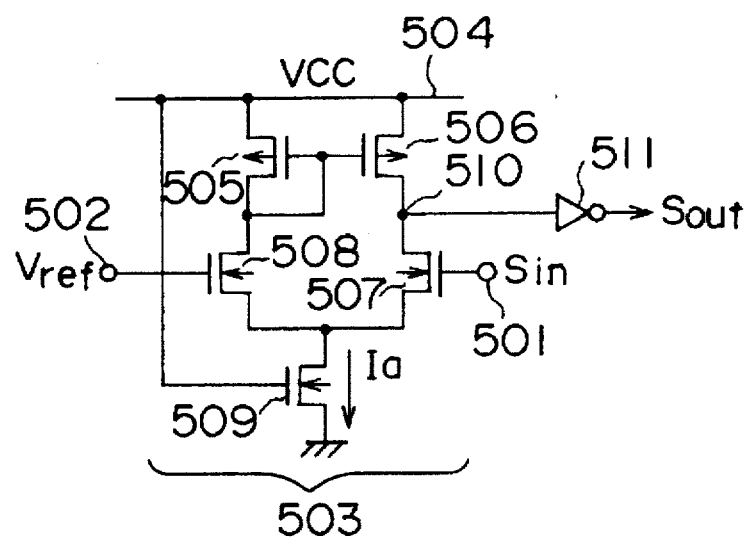
FIG. 48 is a circuit diagram of an input circuit different from the input circuits shown in the previously described figures.

FIG. 48 is a circuit diagram of another conventional input circuit different from the input circuit shown in FIG. 37. The input circuit has a signal input terminal 501 receiving a transmitted signal Sin transmitted via a bus line from an external circuit, and a reference voltage input terminal 502 receiving the reference voltage Vref used to make a logic decision on the transmitted signal Sin. The input circuit further includes a differential amplifier circuit 503, which has a VCC power supply line 504 via which the power supply voltage equal to, for example, 3.3 V is carried. The differential amplifier circuit 503 further includes enhancement type pMOS transistors 505 and 506 forming a current-mirror circuit functioning as a load. Furthermore, the circuit 503 includes enhancement type nMOS transistors 507 and 508 functioning as driving transistors. The transmitted signal Sin is applied to the gate of the nMOS transistor 507, and the reference voltage Vref is applied to the gate of the nMOS transistor 508. There is also provide an enhancement type nMOS transistor 509 functioning as a resistor, a node 510 serving as the output terminal of the differential amplifier circuit, and an inverter 511 for shaping the waveform of the output signal of the circuit 503. The inverter 511 provides an output signal Sout of the input circuit.

When the level of the transmitted signal Sin is high, the nMOS transistor 507 is ON and the nMOS transistor 508 is OFF. Hence, the voltage of the node 510 is low, and the output signal Sout is at the high level. When the level of the transmitted signal Sin is low, the nMOS transistor 507 is OFF and the nMOS transistor 508 is ON. Hence, the voltage of the node 510 is high, and the output signal Sout is at the low level.

Figure 49:
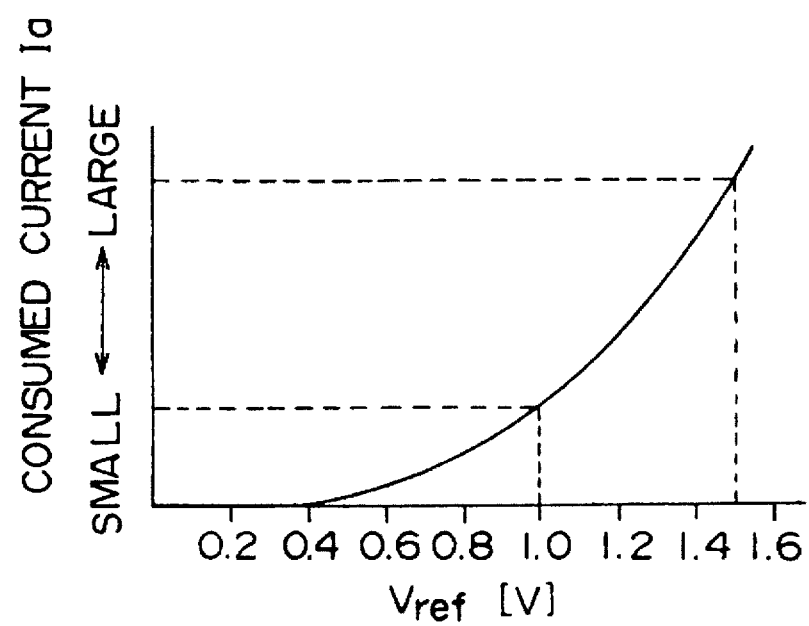
FIG. 49 is a graph of the relationship between a current consumed in a differential amplifier circuit shown in FIG. 48 and a reference voltage applied thereto.

FIG. 49 is a graph of the relationship between the reference voltage Vref and the current flowing in the nMOS transistor 509, that is, the current Ia flowing (consumed) in the differential amplifier circuit 503. It can be seen from FIG. 49 that in the case where the differential amplifier circuit 503 is designed so that the reference voltage Vref is equal to, for example, 1.0 V, if the circuit 503 is used with the reference voltage equal to 1.5 V, the gate-source bias voltages of the nMOS transistors 507 and 508 are increased, and hence the current Ia consumed in the operational amplifier circuit 503 is also increased. The reference voltage Vref equal to 1.0 V is needed to transmit small-amplitude signals. When the center voltage is set equal to 1.0 V, the reference voltage Vref is needed to transmit the small-amplitude signal Sin having the amplitude within the range of ±0.4 V. The reference voltage Vref equal to 1.5 V is needed to transmit the small-amplitude signal Sin based on the LVTTL (low voltage TTL) standard or transmit the small-amplitude signal Sin based on the CTT (Center Tapped Termination) with the center voltage equal to 1.5 V.

Conventionally, there is no single input circuit capable of processing small-amplitude signals Sin based on different standards needing different levels of the reference voltage Vref. That is, the input circuit is designed to be specifically suitable for the specific reference voltage.

However, it is very convenient to provide an input circuit capable of processing small-amplitude signals Sin having the different levels of the reference voltage Vref. In this regard, the circuit shown in FIG. 48 has a disadvantage in that the current Ia consumed in the operational amplifier circuit 503 is greatly varied when changing the reference voltage Vref. This disadvantage is serious in LSI logic circuits ?in having 200 input circuits or more. For example, it will now be assumed that a current of 500 µA is basically designed to be consumed in one differential amplifier circuit in the input circuit. If the current consumed in one operational amplifier circuit is increased to 1 mA, the current consumed in 200 input circuits is increased by 100 mA.

Taking into account the above, if the LSI devices are equipped with input circuits having operational amplifier circuits which do not consume currents very much even when processing small-amplitude signals Sin based on the different levels of the reference voltage Vref, it will be possible to increase the degree of freedom in setting of the reference voltage Vref and increase the applications of LSI devices. Further, if the LSI devices are equipped with output circuits which do not need an increased driving ability even when processing small-amplitude signals Sin based on the different levels of the reference voltage Vref, it will also be possible to increase the degree of freedom in setting the reference voltage Vref and increase the applications of LSI devices.

Figure 50:
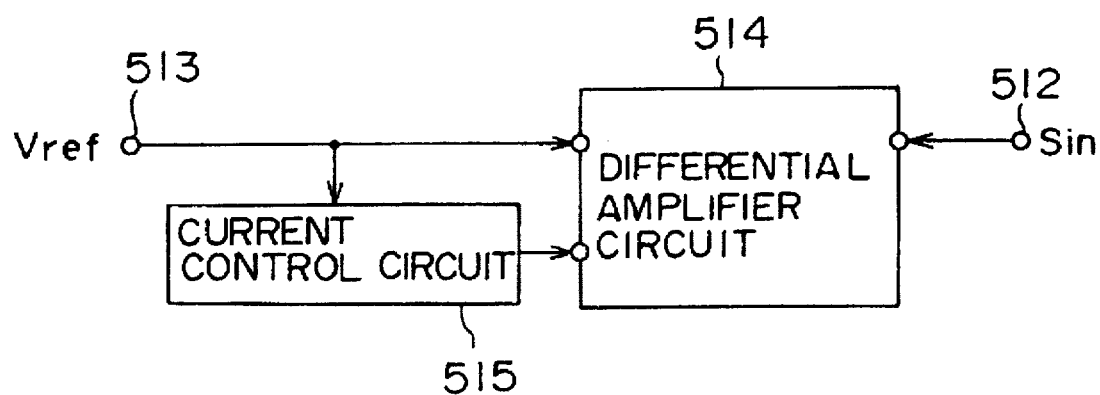
FIG. 50 is a block diagram of a first aspect of the input circuit according to the present invention.

FIG. 50 is a block diagram of first aspect of the present invention regarding an input circuit. The input circuit can be provided in a semiconductor circuit, a semiconductor device or the like connected to a bus. The input circuit includes a differential amplifier circuit 514 and a current control circuit 515. The input signal Sin on which the differential amplifier circuit 514 makes a logic decision is applied to an input terminal 512. The reference voltage Vref, which is used to make a logic decision on the input signal Sin, is applied to a reference voltage input terminal 513. The current control circuit 515 controls the current flowing in the differential amplifier circuit 514 so that a variation in the above current is suppressed in response to a change of the reference voltage Vref within a definite range. Hence, it is possible to prevent an increase in the current consumed in the differential amplifier circuit 514 caused by a change of the reference voltage Vref within the definite range. Accordingly, it becomes possible to process the input signals Sin based on the different standards utilizing the different levels of the reference voltage Vref within the definite range. In addition, it becomes possible to suppress variations in the current consumed in the differential amplifier circuit 514 and improve the production yield even when there are transistors having different gate lengths caused by dispersions in the production process.

Figure 51:
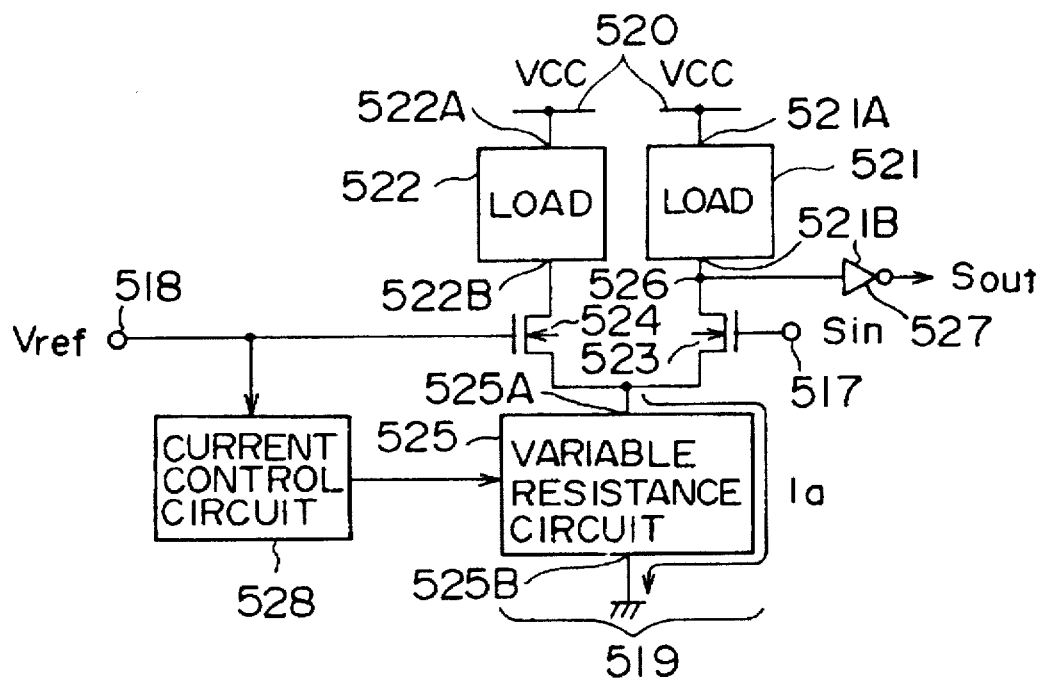
FIG. 51 is a block diagram of a second aspect of the input circuit according to the present invention.

FIG. 51 is a block diagram of a second aspect of the present invention regarding the input circuit. The input circuit has a signal input terminal 517 to which the input signal Sin is applied, and a reference voltage input terminal to which the reference voltage Vref is applied. The input circuit includes a differential amplifier circuit 519, which has a VCC power supply line 520, and loads 521 and 522 respectively having first ends 521A and 522A and second ends 521B and 522B.

Further, there are provided n-channel insulation gate type field effect transistors 523 and 524 functioning as driving transistors. The input signal Sin is applied to the gate of the transistor 523, and the reference voltage Vref is applied to the transistor 524. The input circuit includes a variable resistor circuit 525 having a first end 525A and a second end 525B, a node 526 functioning as the output terminal of the differential amplifier circuit 519, a waveform-shaping inverter 527 via which the output signal Sout of the input circuit is output.

Furthermore, the input circuit includes a current control circuit 528, which controls the variable resistor circuit 525 so that it has a relatively large resistance value when the reference voltage Vref is relatively high. The circuit 528 controls the variable resistor circuit 525 so that it has a relatively small resistance value when the reference voltage Vref is relatively low. In this way, the current control circuit 528 controls the current Ia flowing in the variable resistor circuit 525.

When the transmitted input signal Sin is at the high level, the transistor 523 is ON and the transistor 524 is OFF. Hence, the node 526 is at the low level and the output signal Sout is at the high level. When the level of the input signal Sin is low, the transistors 523 and 524 are respectively ON and OFF. Hence, the level of the node 526 is low, and the level of the output signal Sout is high.

The current control circuit 528 controls the current Ia flowing in the variable resistance circuit 525 as described above. Hence, it is possible to prevent an excessive variation in the current Ia consumed in the differential amplifier circuit 519, and to process the different levels of the input signal Sin based on the different values of the reference voltage Vref.

Figure 52:
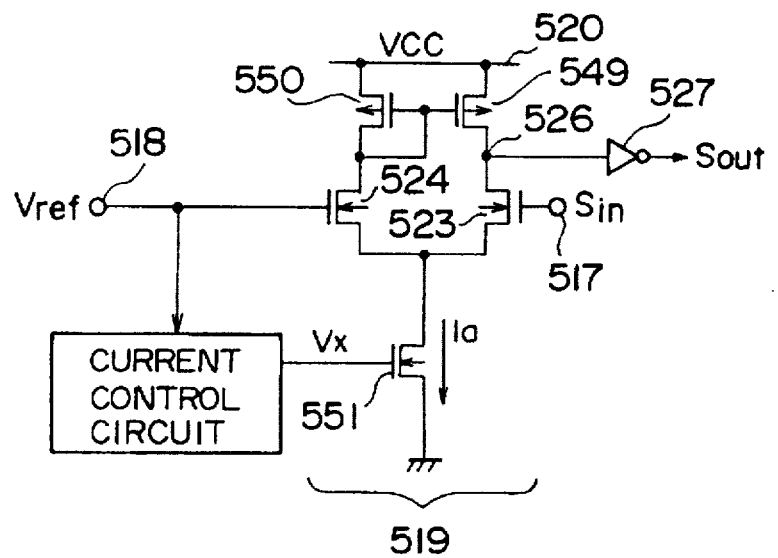
FIG. 52 is a circuit diagram of the detailed structure of the configuration shown in FIG. 51.
Figure 53:
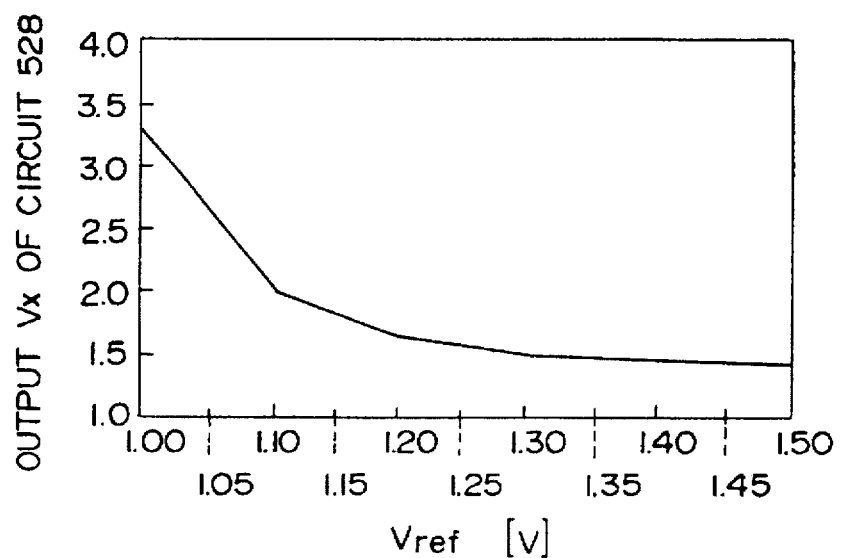
FIG. 53 is a graph of the output of a current control circuit shown in FIG. 51 and the reference voltage.

As shown in FIG. 52, the loads 521 and 522 can be respectively formed of p-channel insulation gate field effect transistors 549 and 550, which forms a current-mirror circuit. The variable resistor circuit 525 can be formed of an n-channel insulation gate field effect transistor 515. In this case, if the current control circuit 528 has an input/output characteristic (the relationship between the reference voltage Vref and the output Vx of the current control circuit 528) as shown in FIG. 53, it is possible to maintain the current Ia consumed in the differential amplifier circuit 519 at a constant level within the range of the reference voltage between 1.0 V and 1.5 V.

Further, the current control circuit 528 contributes to suppressing variations in the current consumed in the differential amplifier circuit 519 and improve the production yield even when there are transistors having different gate lengths caused by dispersions in the production process.

Figure 54:
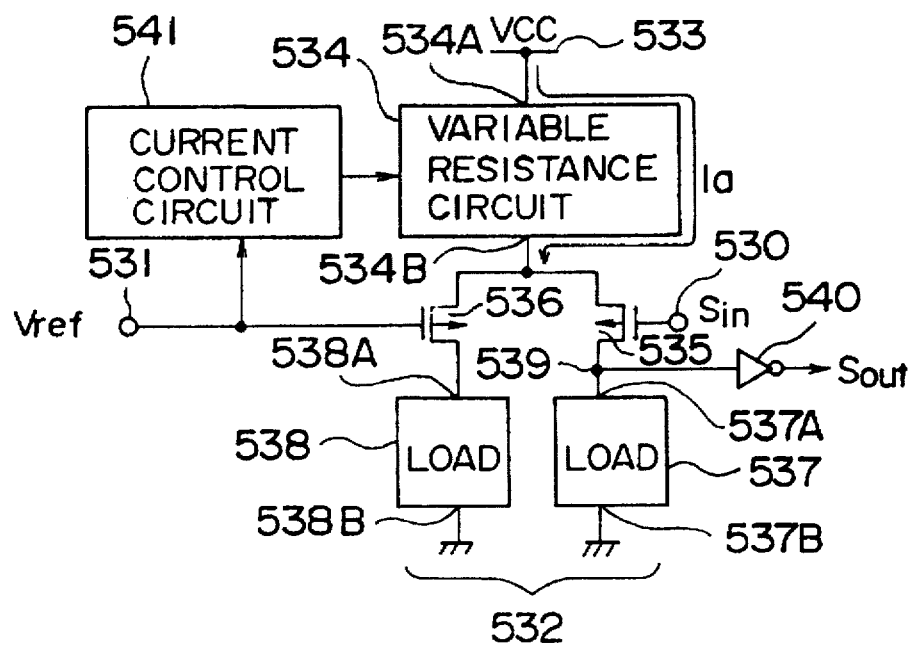
FIG. 54 is a block diagram of a third aspect of the input circuit according to the present invention.

FIG. 54 is a block diagram of a third aspect of the input circuit according to the present invention. The input circuit shown in FIG. 54 includes a signal input terminal 530 to which the transmitted input signal Sin is applied, and a reference voltage input terminal 531 which receives the reference voltage used to make a logic decision on the input signal Sin. The input circuit includes a differential amplifier circuit 532, which has a VCC power supply line 533, a variable resistance circuit 534 having a first end 534A and a second end 534B.

Further, there are provided p-channel insulation gate type field effect transistors 535 and 536 functioning as driving transistors. The input signal Sin is applied to the gate of the transistor 535, and the reference voltage Vref is applied to the transistor 536. The input circuit further includes loads 537 and 538 respectively having first ends 537A and 538A and second ends 537B and 538B, a node 539 corresponding to the output terminal of the differential amplifier circuit 532, and a waveform shaping inverter 540, via which the output signal Sout of the input circuit is output.

A current control circuit 541 controls the variable resistor circuit 534 so that it has a relatively small resistance when the reference voltage Vref is relatively high within the predetermined range. The current control circuit 541 controls the variable resistor circuit 534 so that it has a relatively large resistance when the reference voltage Vref is relatively low within the predetermined range. In this way, the current Ia flowing in the variable resistor circuit 534 is controlled.

When the level of the input signal Sin is high, the transistors 535 and 536 are respectively OFF and ON. Hence, the level of the node 539 is low and the output signal Sout is at the high level. When the level of the input signal Sin is low, the transistors 535 and 536 are respectively ON and OFF. Hence, the level of the node 539 is high, and the output signal Sout is at the low level.

The current control circuit 541 controls the current Ia flowing in the variable resistor circuit 534 as described above. Hence, it is possible to prevent an excessive variation in the current Ia consumed in the differential amplifier circuit 532 and to process the different levels of the input signal Sin based on the different values of the reference voltage Vref within the definite range. Further, the current control circuit 541 contributes to suppressing variations in the current consumed in the differential amplifier circuit 532 and improve the production yield even when there are transistors having different gate lengths caused by dispersions in the production process.

Figure 55:
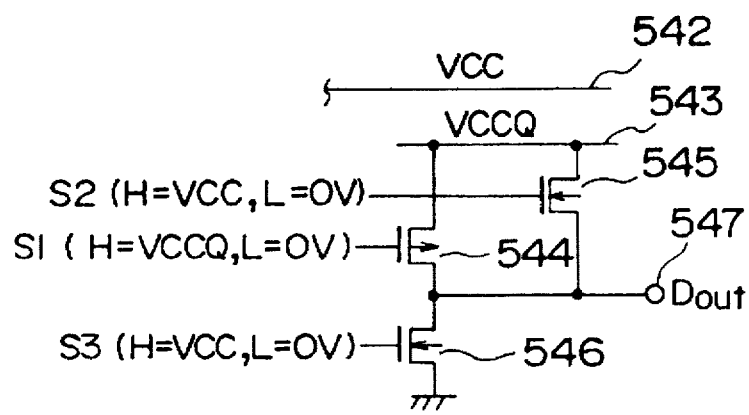
FIG. 55 is a circuit diagram of an aspect of the output circuit according to the present invention.

FIG. 55 is a circuit diagram of a first aspect of the output circuit according to the present invention. The output circuit shown in FIG. 55 can be provided in a semiconductor circuit, a semiconductor device or the like connected to a bus. The output circuit includes a VCC power supply line 542 via which the power supply voltage VCC is supplied to a main body circuit (not shown). A VCCQ power supply line 543 supplies the power supply voltage VCCQ equal to or lower than the power supply voltage VCC. The output circuit includes a p-channel insulation gate type field effect transistor 544, n-channel insulation gate type field effect transistors 545 and 546, and an output terminal 547.

The source of the transistor 544 is connected to the VCCQ power supply line 543, and the drain thereof is connected to the output terminal 547. The gate of the transistor 544 is supplied with a signal S1, which has a logic-high level equal to the power supply voltage VCCQ and a logic-low level equal to the ground potential 0 V. The drain of the transistor 545 is connected to the VCCQ power supply line 543, and the source thereof is connected to the output terminal 547. The gate of the transistor 545 is supplied with a signal S2, which has a logic-high level equal to the power supply voltage VCC and a logic-low level equal to the ground potential 0 V. The drain of the transistor 546 is connected to the output terminal 547, and the source thereof is grounded. The gate of the transistor 546 is supplied with a signal S3, which has a logic-high level equal to the power supply voltage VCC and a logic-low level equal to the ground voltage 0 V.

When the signals S1, S2 and S3 are respectively at the low, high and low levels, the transistors 544, 545 and 545 are respectively ON, ON and OFF. Hence, the output signal Dout is at the high level. When the signals S1, S2 and S3 are respectively at the high, low and high levels, the transistors 544, 545 and 546 are respectively OFF, OFF and ON. Hence, the output signal Dout is at the low level. When the signals S1, S2 and S3 are at the high, low and low levels, the transistors 544, 545 and 546 are respectively OFF, OFF and OFF. Hence, the output terminal 547 is in the high-impedance state. Hence, the destination of the output signal Dout is terminated at the termination voltage VTT equal to VCCQ/2, and the reference voltage Vref for a differential amplifier circuit of the first-stage circuit of the input signal of the destination is equal to VCCQ/2.

If the power supply voltage VCCQ is equal to or close to the power supply voltage VCC, the pull-up operation at the output terminal is actively performed by the transistor 544. This is because the transistor 545 performs the source-follower operation, and does not provide a sufficient driving ability due to a voltage loss equal to its threshold voltage with respect to the output signal Dout close to the power supply voltage VCC. However, if the power supply voltage VCCQ is set approximately equal to 1.0 V, a voltage as low as approximately 1.0 V is applied across the gate and source of the transistor 544. Hence, only 1.0 V or a voltage close thereto is applied in the pull-up operation, and a sufficient driving ability is not exhibited.

The transistor 545 is supplied with the power supply voltage VCC via the gate in the pull-up operation, and is therefore capable of providing a sufficient driving ability. Hence, the transistor 545 actively perform the pull-up operation.

As described above, the output circuit shown in FIG. 55 does not increase the driving ability even in the case where the power supply voltage VCCQ is changed within a definite range or the different levels of the output signal Dout based on the different values of the reference voltage Vref are output. That is, the output circuit shown in FIG. 54 is capable of providing the output signal Dout which can have different levels based on the different levels of the reference voltage Vref within the predetermined range.

Further, the output circuit shown in FIG. 55 has the following advantage. If the operation temperature changes and the threshold voltages of the transistors 544 and 545 are increased, the ON resistance of the transistor 544 is decreased, while the ON resistance of the transistor 545 is increased. If the threshold voltages of the transistors 544 and 545 are decreased, the ON resistance of the transistor 544 is increased, while the ON resistance of the transistor 545 is decreased. In the above way, it is possible to maintain the fixed amplitude of the output signal Dout even when the operation temperature changes.

A description will now be given, with reference to FIGS. 56 and 57, of an input circuit according to a thirteenth embodiment of the present invention based on the aforementioned structure shown in FIG. 51. Basically, the input circuit shown in FIG. 56 corresponds to one bus line. A current control circuit 553 shown in FIG. 56 corresponds to the current control circuit 528 shown in FIG. 51, and the other parts of the input circuit shown in FIG. 56 are the same as corresponding ones shown in FIG. 51.

The current control circuit 553 includes an enhancement type pMOS transistor 554 having a gate connected to the VCC power supply line 504, a gate connected to the reference voltage input terminal 502. The transistor 554 functions as a variable resistance element controlled by the reference voltage Vref. A fixed resistor 555 has one end connected to the drain of the transistor 554, and the other end grounded. A connection node 556 at which the drain of the transistor 554 is connected to the resistor 555 is connected to the gate of the nMOS transistor 509.

When the reference voltage Vref is relatively high within a predetermined range, the ON resistance of the pMOS transistor 554 is relatively large, and the voltage of the node 556 is relatively low. Hence, the ON resistance of the nMOS transistor 509 is relatively large. When the reference voltage Vref is relatively, the ON resistance of the pMOS transistor 554 is relatively small, and the voltage of the node 556 is relatively high. Hence, the ON resistance of the nMOS transistor 509 is relatively small.

Figure 56:
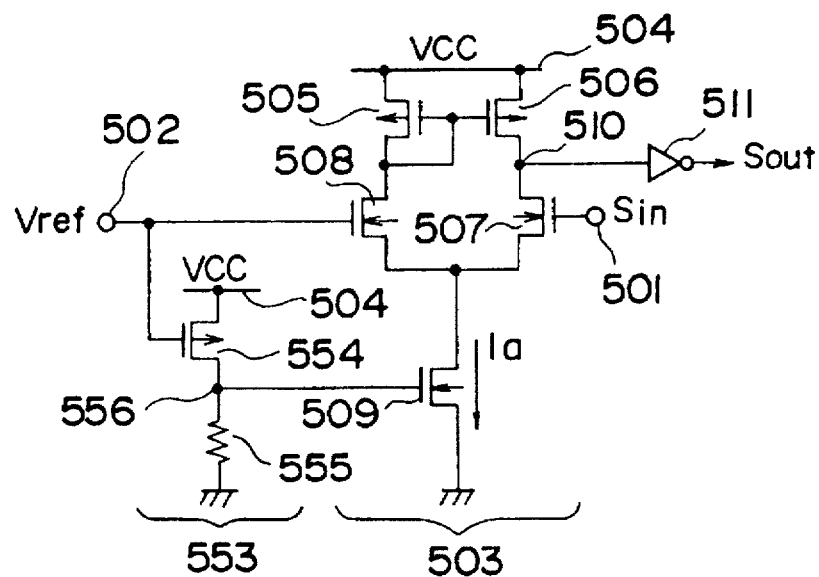
FIG. 56 is a circuit diagram of an input circuit according to a thirteenth embodiment of the present invention.
Figure 57:
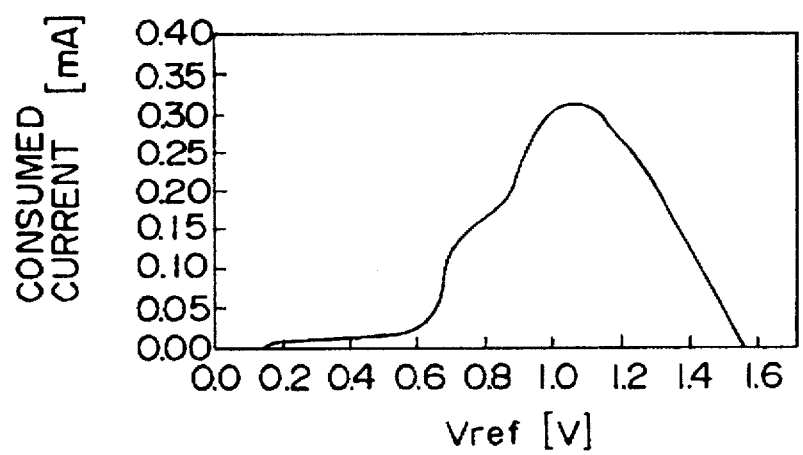
FIG. 57 is a graph of the relationship between the current consumed in a differential amplifier circuit shown in FIG. 56 and the reference voltage.

The simulation result shows the relationship between the reference voltage Vref and the current Ia consumed in the differential amplifier circuit 503 shown in FIG. 56, as shown in FIG. 57. It can be seen from the graph of FIG. 57 that the current Ia consumed in the differential amplifier circuit 503 is fixed to an approximately constant level while the reference voltage Vref is present in the range between 0.9 V and 1.2 V.

When the reference voltage Vref is equal to or lower than 0.8 V, the current Ia consumed in the differential amplifier circuit 503 is drastically decreased. This is because the voltage of the small-amplitude signal Sin becomes close to the threshold voltages of the nMOS transistors 507 and 508.

According to the configuration shown in FIG. 56, the current Ia consumed in the differential amplifier circuit 503 can be fixed to an approximately constant level as long as the reference voltage Vref is between 0.9 V and 1.2 V. Hence, it becomes possible to process, within the range of the reference voltage Vref between 0.9 V and 1.2 V, the different levels of the small-amplitude signal Sin based on the different levels of the reference voltage Vref. As a result, the input circuit shown in FIG. 56 has improved convenience. In addition, it becomes possible to suppress variations in the current consumed in the differential amplifier circuit 503 and improve the production yield even when there are transistors having different gate lengths caused by dispersions in the production process.

The current control circuit 553 can be shared by first-stage differential amplifier circuits in a plurality of input circuits.

Figure 58:
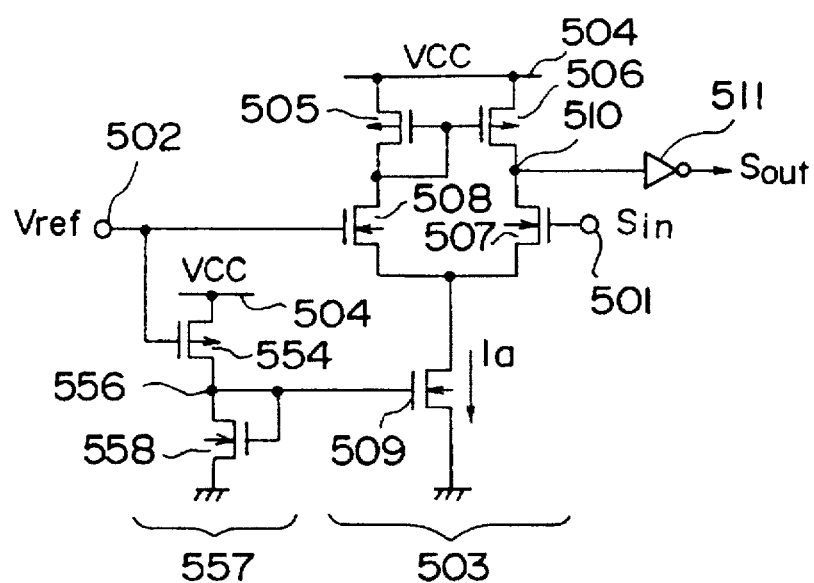
FIG. 58 is a circuit diagram of an input circuit according to a fourteenth embodiment of the present invention.

FIG. 58 is a circuit diagram of an input circuit according to a fourteenth embodiment of the present invention. In FIG. 58, parts that are the same as those shown in FIG. 56 are given the same reference numbers. The input circuit shown in FIG. 58 has a current control circuit 557 having a structure different from that of the current control circuit 553 shown in FIG. 56. The other parts of the input circuit shown in FIG. 58 are the same as corresponding ones of the input circuit shown in FIG. 56.

The current control circuit 557 has an enhancement type nMOS transistor 558 substituted for the resistor 555 shown in FIG. 56. The other parts of the current control circuit 557 are the same as corresponding ones of the current control circuit 553 shown in FIG. 56. The gate of the nMOS transistor 558 is connected to the drain thereof, and the drain thereof is connected to the drain of the pMOS transistor 554. The source of the nMOS transistor 558 is grounded.

Figure 59:
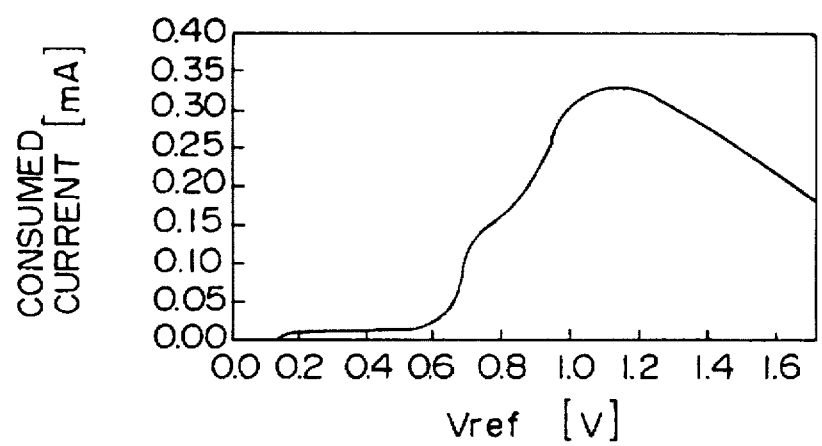
FIG. 59 is a graph of the relationship between the current consumed in a differential amplifier circuit shown in FIG. 58 and the reference voltage.

FIG. 59 shows the relationship between the reference voltage Vref and the current Ia consumed in the differential amplifier circuit 503. It is possible to maintain the current Ia consumed in the differential amplifier circuit 503 at an approximately constant level within the range of the reference voltage Vref between 0.9 V and 1.4 V, which range is wider than that obtained in the circuit shown in FIG. 56.

According to the circuit shown in FIG. 58, it becomes possible to process, within the range of the reference voltage Vref between 0.9 V and 1.4 V, the different levels of the small-amplitude signal Sin based on the different levels of the reference voltage Vref. As a result, the input circuit shown in FIG. 58 has improved convenience. In addition, it becomes possible to suppress variations in the current consumed in the differential amplifier circuit 503 and improve the production yield even when there are transistors having different gate lengths caused by dispersions in the production process.

The current control circuit 557 can be shared by first-stage differential amplifier circuits in a plurality of input circuits.

Figure 60:
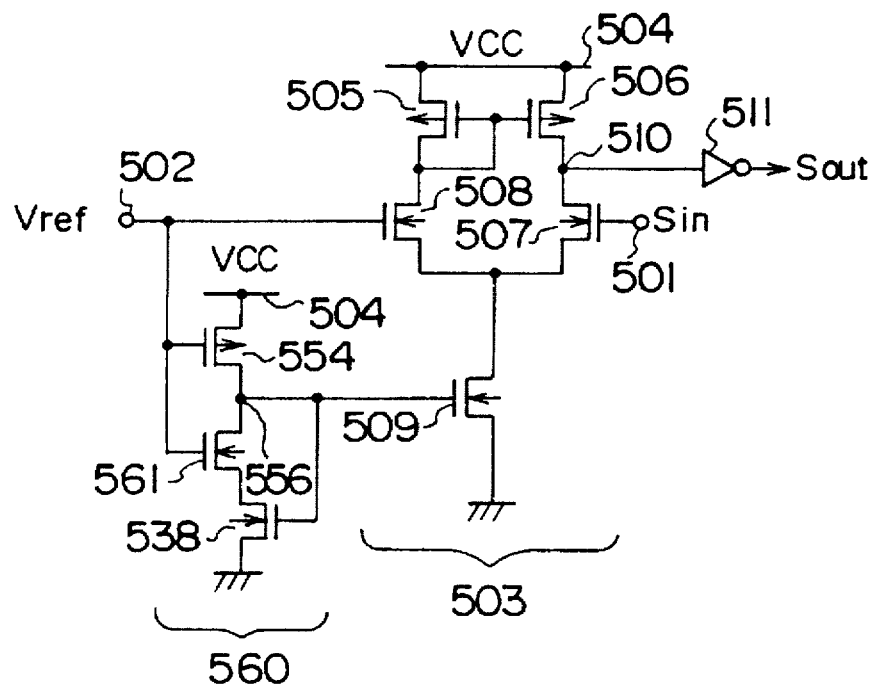
FIG. 60 is a circuit diagram of an input circuit according to a fifteenth embodiment of the present invention.

A description will now be given, with reference to FIGS. 60 through 63, of an input circuit according to a fifteenth embodiment of the present invention. Basically, the input circuit shown in FIG. 60 relates to one bus line. The input circuit shown in FIG. 60 has a current control circuit 560 having a structure different from that of the current control circuit 557 shown in FIG. 58. The other parts of the input circuit shown in FIG. 60 are the same as corresponding ones of the input circuit shown in FIG. 58.

The current control circuit 560 includes an enhancement type nMOS transistor 561. The node 556 and the drain of the nMOS transistor 538 are connected to each other via the drain and source of the nMOS transistor 561. The other parts of the current control circuit 560 are the same as corresponding ones of the current control circuit 557 shown in FIG. 58. The gate of the nMOS transistor 561 is connected to the reference voltage input terminal 502, is thus made to function as a variable resistance element controlled by the reference voltage Vref.

In the current control circuit 560, when the reference voltage Vref is relatively high, the ON resistance of the pMOS transistor 554 is relatively large, and the ON resistance of the nMOS transistor 561 is relatively small. When the reference voltage Vref is relatively low, the ON resistance of the pMOS transistor 554 is relatively small, and the ON resistance of the nMOS transistor 561 is relatively large.

Figure 61:
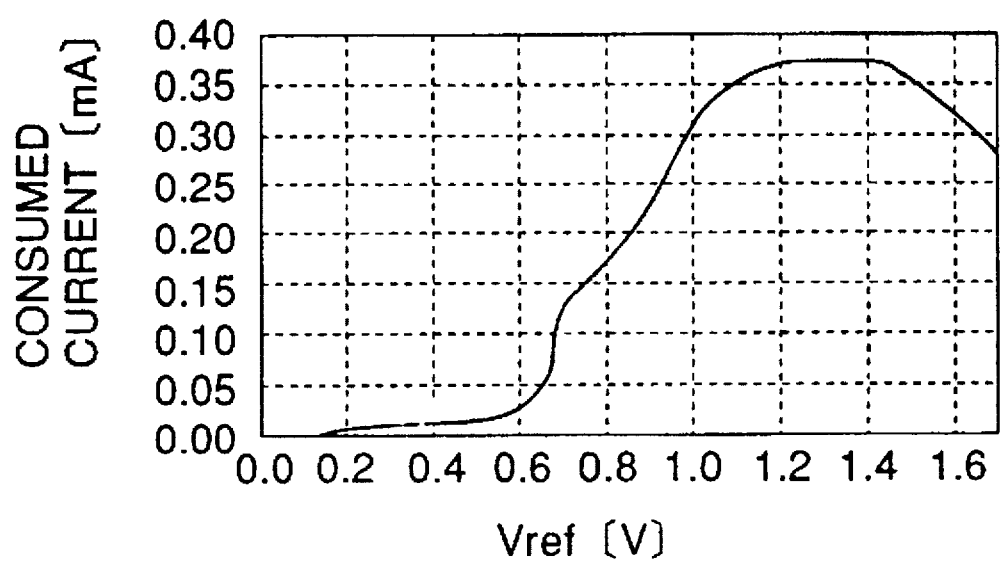
FIG. 61 is a graph of the relationship between the current consumed in a differential amplifier circuit shown in FIG. 60 and the reference voltage.

FIG. 61 is a graph of the relationship between the reference voltage Vref and the current Ia consumed in the differential amplifier circuit 503. It is possible to maintain the current Ia consumed in the differential amplifier circuit 503 at an approximately constant level within the range of the reference voltage Vref between 0.9 V and 1.6 V, which is wider than that obtained in the circuit shown in FIG. 58.

According to the circuit shown in FIG. 60, it becomes possible to process, within the range of the reference voltage Vref between 0.9 V and 1.6 V, the different levels of the small-amplitude signal Sin based on the different levels of the reference voltage Vref. As a result, the input circuit shown in FIG. 60 has improved convenience. In addition, it becomes possible to suppress variations in the current consumed in the differential amplifier circuit 503 and improve the production yield even when there are transistors having different gate lengths caused by dispersions in the production process.

Figure 62:
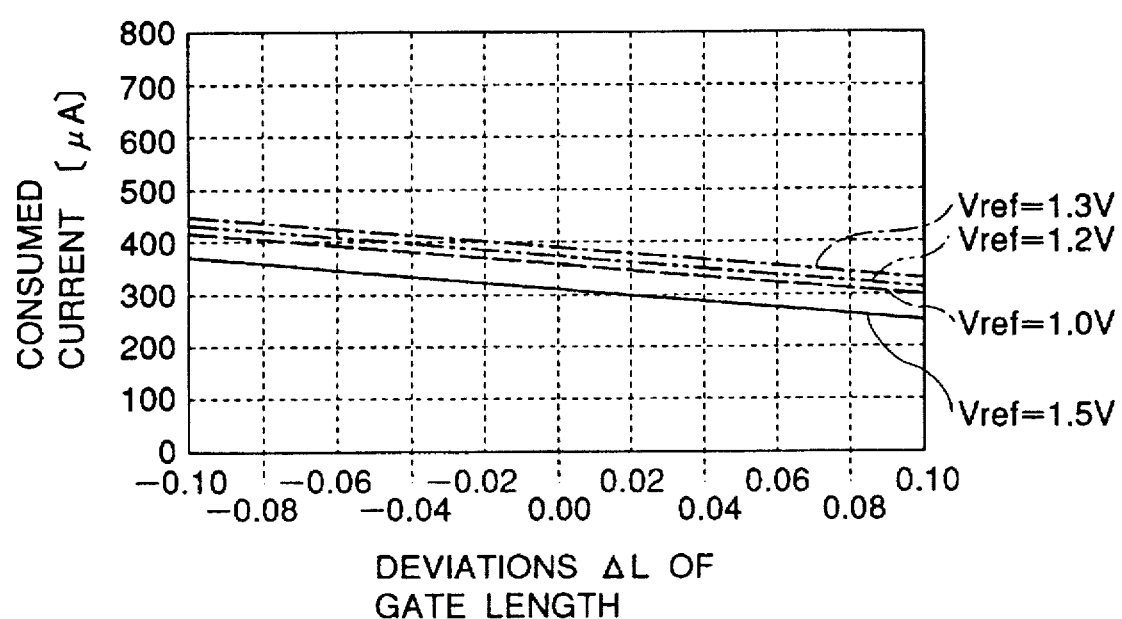
FIG. 62 is a graph of the relationship between the current consumed in the differential amplifier circuit shown in FIG. 60 and deviations in the gate length of a transistor used therein.
Figure 63:
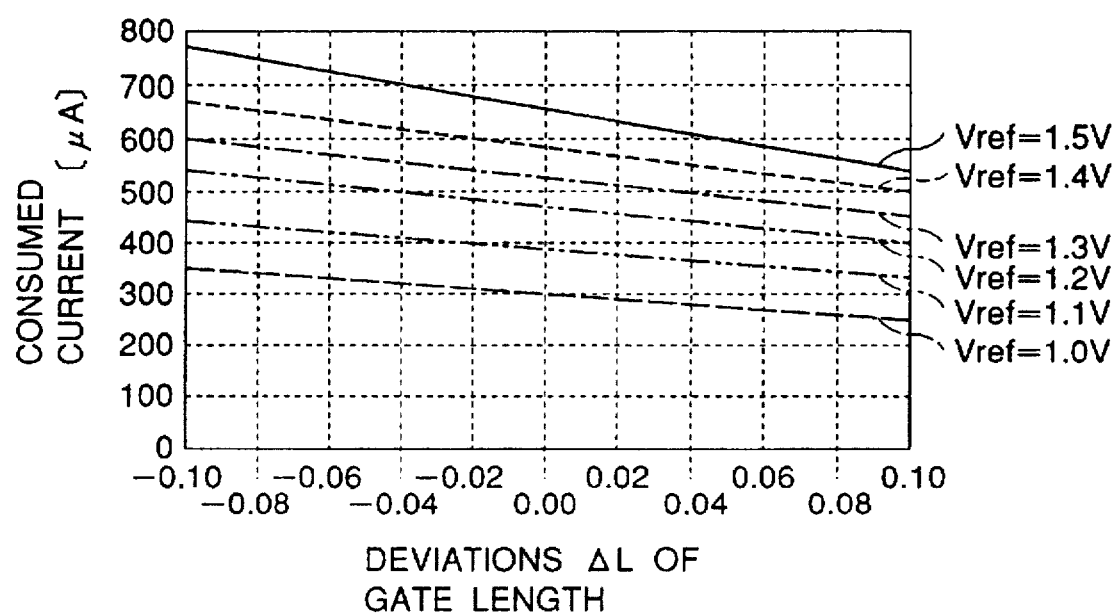
FIG. 63 is another graph of the relationship between the current consumed in the differential amplifier circuit shown in FIG. 48 and deviations in the gate length of the transistor.

FIG. 62 shows the relationship between deviations in the gate length of the transistor and the current Ia consumed in the differential amplifier circuit 503 used in the circuit shown in FIG. 60. FIG. 63 shows the relationship between deviations in the gate length of the transistor and the current Ia consumed in the differential amplifier circuit 503 in the circuit shown in FIG. 48.

The current control circuit 560 can be shared by first-stage differential amplifier circuits in a plurality of input circuits.

Figure 64:
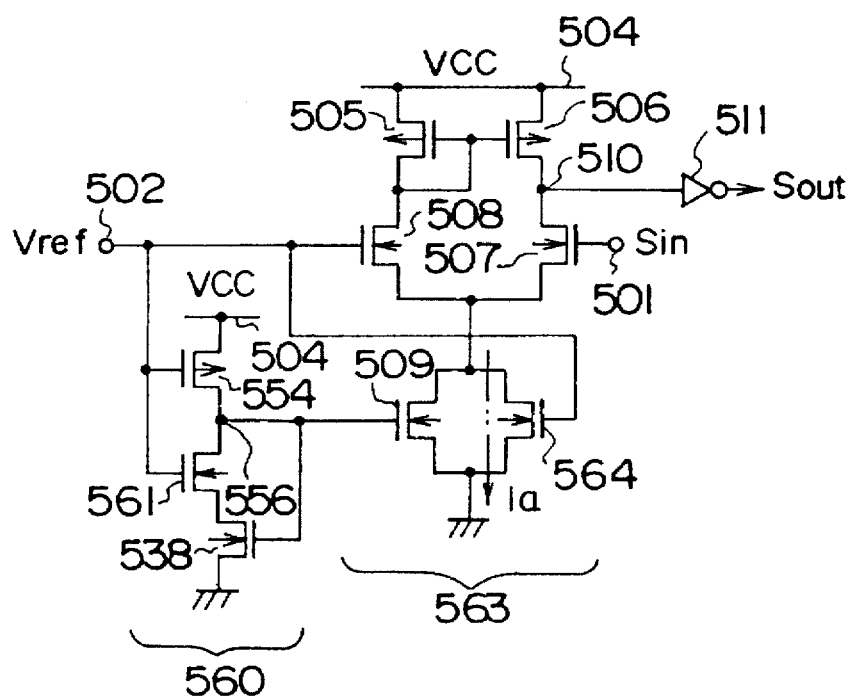
FIG. 64 is a circuit diagram of an input circuit according to a sixteenth embodiment of the present invention.

A description will now be given, with reference to FIGS. 64 and 65, of an input circuit according to a sixteenth embodiment of the present invention. Basically, the input circuit shown in FIG. 64 relates to one bus line, and has a differential amplifier circuit 563 having a structure different from that of the differential amplifier 503 shown in FIG. 60. The other parts of the input circuit shown in FIG. 64 are the same as corresponding ones of the input circuit shown in FIG. 60.

The differential amplifier circuit 563 has an enhancement type nMOS transistor 564. The other parts of the differential amplifier circuit 563 are the same as corresponding ones of the differential amplifier 503 shown in FIG. 60. The drain of the nMOS transistor 564 is connected to the source of the nMOS transistor 507, and the source thereof is grounded. The gate of the nMOS transistor 564 is connected to the reference voltage input terminal 502.

When the reference voltage Vref is relatively high, the ON resistance of the nMOS transistor 564 is relatively small. Hence, the current Ia consumed in the differential amplifier circuit 563 is relatively large. That is, the operation of the circuit shown in FIG. 64 differs from that of the circuit shown in FIG. 60.

Figure 65:
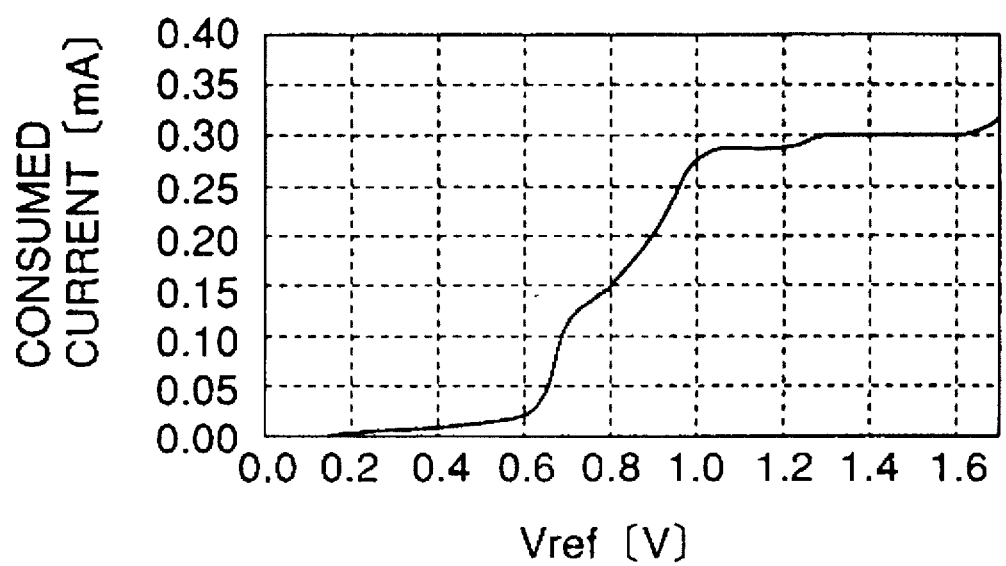
FIG. 65 is a graph of the relationship between the current consumed in a differential amplifier circuit shown in FIG. 64 and the reference voltage.

FIG. 65 is a graph of the relationship between the reference voltage Vref and the current Ia consumed in the differential amplifier circuit 503. It is possible to maintain the current Ia consumed in the differential amplifier circuit 503 at an approximately constant level within the range of the reference voltage Vref between 0.9 V and 1.7 V, which is wider than that obtained in the circuit shown in FIG. 60.

According to the circuit shown in FIG. 64, there are provided the current control circuit 560 and the nMOS transistor 564, and hence it becomes possible to process, within the range of the reference voltage Vref between 0.9 V and 1.7 V, the different levels of the small-amplitude signal Sin based on the different levels of the reference voltage Vref. As a result, the input circuit shown in FIG. 65 has improved convenience. In addition, it becomes possible to suppress variations in the current consumed in the differential amplifier circuit 503 and improve the production yield even when there are transistors having different gate lengths caused by dispersions in the production process.

The current control circuit 560 can be shared by first-stage differential amplifier circuits in a plurality of input circuits.

Figure 66:
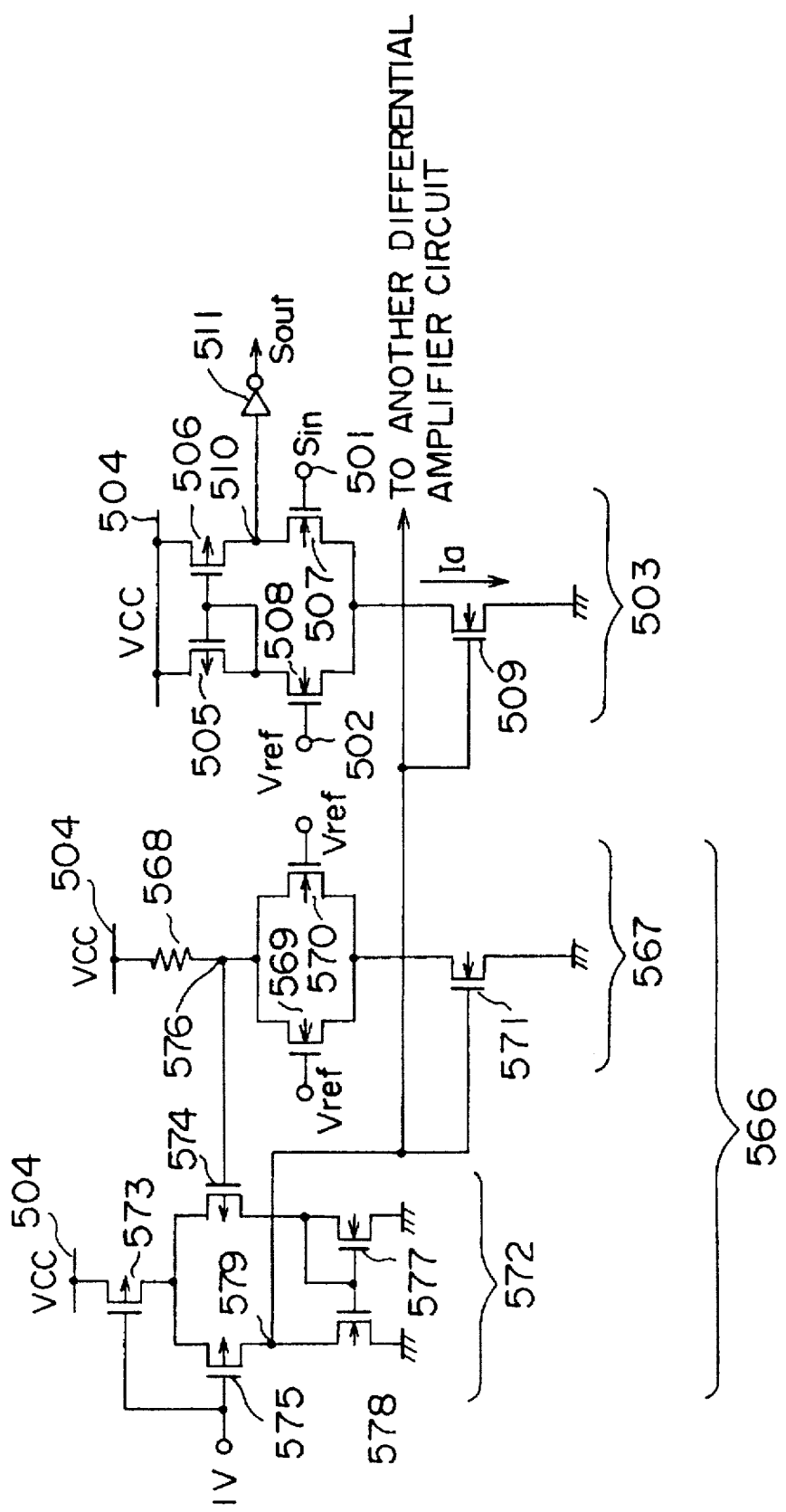
FIG. 66 is a circuit diagram of an input circuit according to a seventeenth embodiment of the present invention.

A description will now be given, with reference to FIGS. 66 through 68, of an input circuit according to a seventeenth embodiment of the present invention. Basically, the input circuit shown in FIG. 66 corresponds to one bus line. The input circuit shown in FIG. 66 has a current control circuit 566 having a structure different from that of the current control circuit 553 shown in FIG. 56. The other parts of the input circuit shown in FIG. 66 are the same as corresponding ones of the input circuit shown in FIG. 56.

The current control circuit 566 includes a monitor circuit 567, which monitors the current Ia consumed in the differential amplifier circuit 503. The monitor circuit 567 includes a resistor 568, and enhancement type nMOS transistors 569 and 570. Each of the transistors 569 and 570 has a gate width equal to 1/10 of that of the nMOS transistors 507 and 508. The reference voltage Vref is applied to the gates of the nMOS transistors 569 and 570. Further, the monitor circuit 567 includes an enhancement type nMOS transistor 571, which has a gate width equal to 1/10 of that of the nMOS transistor 509.

The current control circuit 566 includes a differential amplifier circuit 572 forming a feedback-control circuit. The circuit 572 includes an enhancement type pMOS transistor 573 functioning as a resistance element. The gate of the pMOS transistor 573 receives a constant voltage of 1 V. The differential amplifier circuit 572 includes enhancement type pMOS transistors 574 and 575 functioning as driving transistors. The gate of the pMOS transistor 574 receives the voltage of a node 576 of the monitor circuit 567. The gate of the pMOS transistor 575 receives the constant voltage equal to 1 V. The differential amplifier circuit 572 includes enhancement type nMOS transistors 577 and 578 forming a current-mirror circuit functioning as loads. A node 579 forms the output terminal of the differential amplifier circuit 572. The node 579 is connected to the gate of the nMOS transistor 571 of the monitor circuit 567 and the gate of the nMOS transistor 509 of the differential amplifier circuit 503. The node 579 is also connected to the nMOS transistor (not shown for the sake of convenience) corresponding to the nMOS transistor 509 of the differential amplifier circuit (not shown for the sake of convenience) corresponding to the differential amplifier circuit 503 of another input circuit (not shown for the sake of convenience).

The node 576 in the current control circuit 566 is feedback-controlled so that the voltage of the node 576 is fixed to 1 V by the differential amplifier circuit 572 within the definite range of the reference voltage Vref. The current flowing in the monitor circuit 567 is maintained at an approximately constant level. Hence, the current Ia consumed in the differential amplifier circuit 503 is also maintained an approximately constant level.

Figure 67:
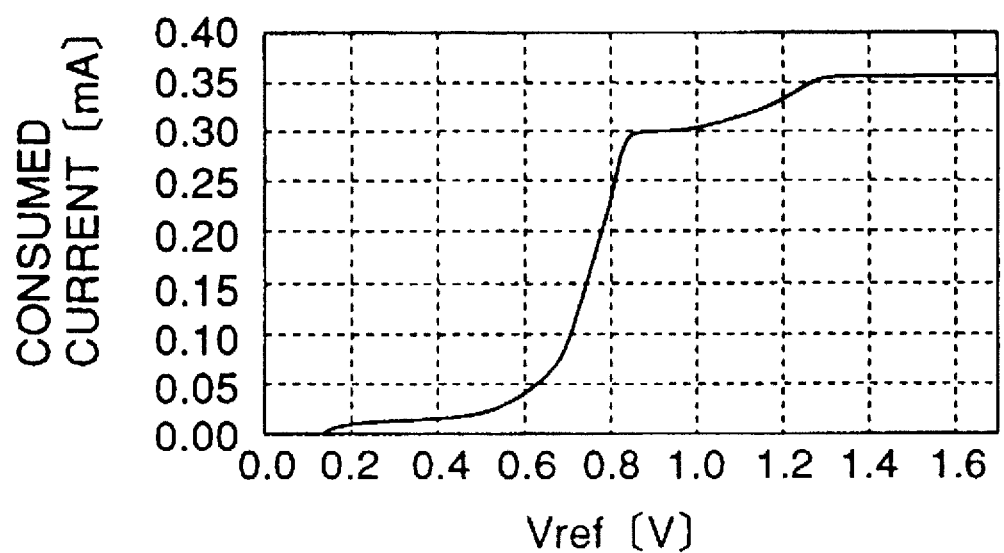
FIG. 67 is a graph of the relationship between the current consumed in a differential amplifier circuit shown in FIG. 66 and the reference voltage.

According to the simulation result, the relationship between the reference voltage Vref and the current Ia consumed in the differential amplifier circuit 503 is as shown in FIG. 67. It can be seen from FIG. 67 that the current Ia consumed in the differential amplifier circuit 503 can be maintained at an approximately constant level if the reference voltage Vref is between 0.9 V and 1.7 V.

According to the circuit shown in FIG. 66, it becomes possible to process, within the range of the reference voltage Vref between 0.9 V and 1.7 V, the different levels of the small-amplitude Signal Sin based on the different levels of the reference voltage Vref. As a result, the input circuit shown in FIG. 66 has improved convenience. In addition, it becomes possible to suppress variations in the current Ia consumed in the differential amplifier circuit 503 and improve the production yield even when there are transistors having different gate lengths caused by dispersions in the production process.

Figure 68:
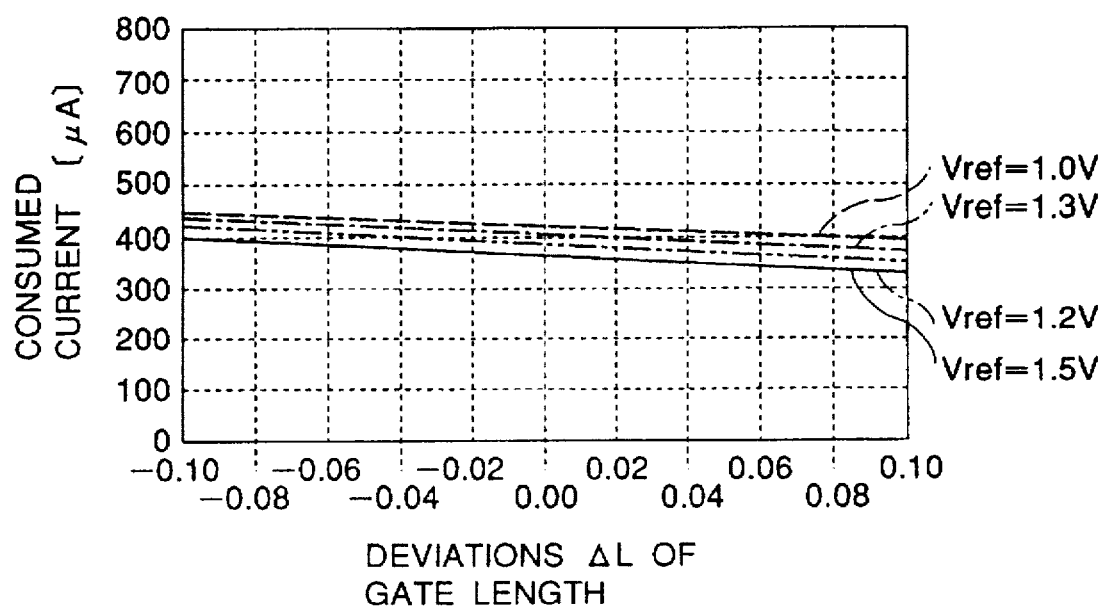
FIG. 68 is a graph of the relationship between the current consumed in the differential amplifier circuit shown in FIG. 66 and dispersions in the gate length of a transistor used therein.

FIG. 68 shows the relationship between deviations in the gate length of the transistor and the current Ia consumed in the differential amplifier circuit 503.

The current control circuit 566 can be shared by first-stage differential amplifier circuits in a plurality of input circuits. In general semiconductor devices, there are provided at least 20 input circuits or more. Hence, the current consumed in the current control circuit 566 is relatively negligible.

Figure 69:
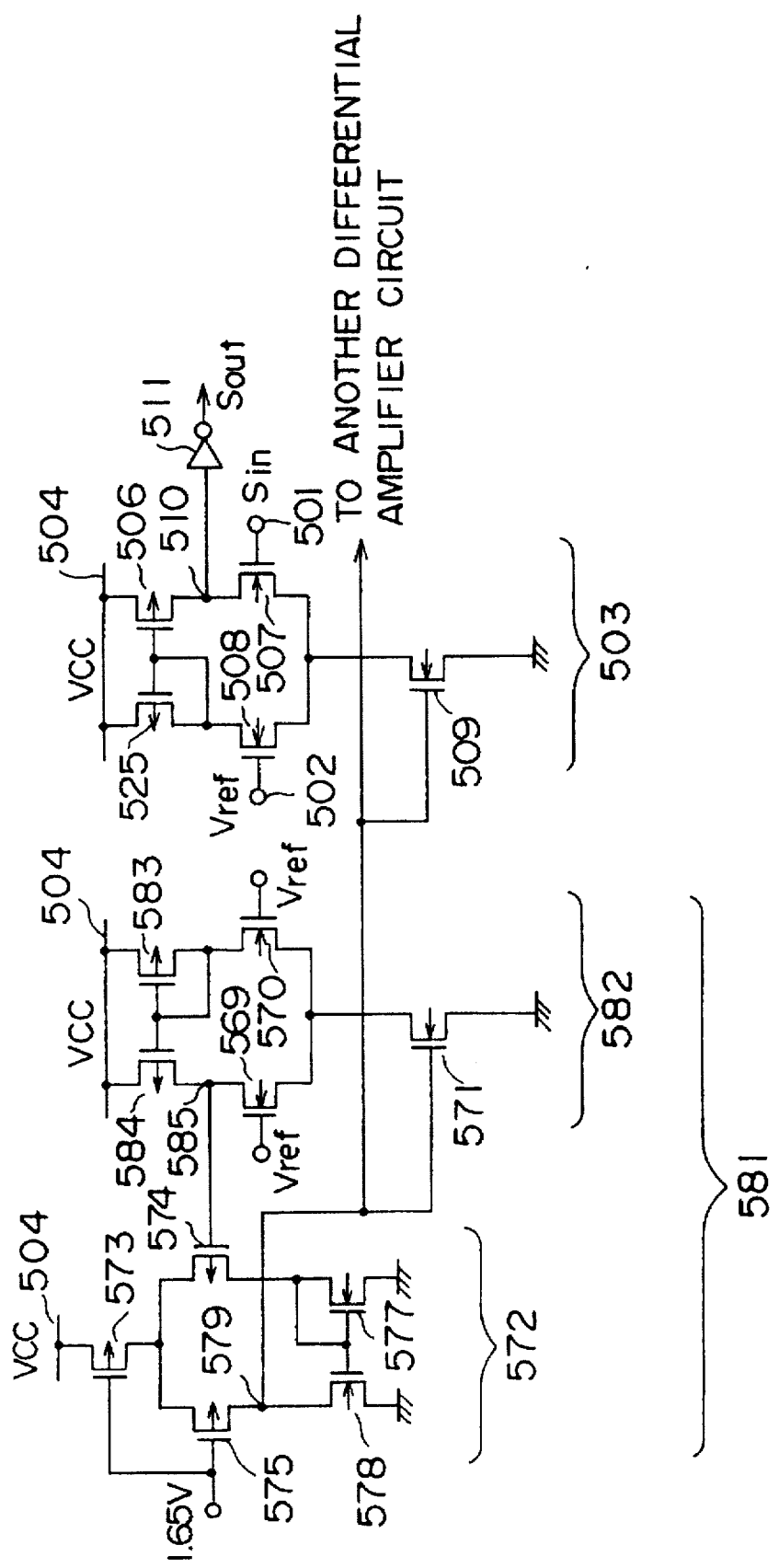
FIG. 69 is a circuit diagram of an input circuit according to an eighteenth embodiment of the present invention.

A description will now be given, with reference to FIGS. 69 and 70, of an input circuit according to an eighteenth embodiment of the present invention. Basically, the input circuit shown in FIG. 69 corresponds to one bus line. The input circuit shown in FIG. 69 includes a current control circuit 581 having a structure different from that of the current control circuit 566 shown in FIG. 66. The other parts of the input circuit shown in FIG. 69 are the same as corresponding ones of the input circuit shown in FIG. 66.

The current control circuit 581 has a monitor circuit 582 having a structure different from that of the monitor circuit 567 shown in FIG. 66. The other parts of the current control circuit 581 shown in FIG. 69 are the same as corresponding ones of the current control circuit 567 shown in FIG. 66. The current monitor circuit 582 includes enhancement type pMOS transistors 583 and 584 used instead of the resistor 568 shown in FIG. 66. The gate width of each of the pMOS transistors 583 and 584 is equal to 1/10 of that of each of the pMOS transistors 505 and 506. The pMOS transistors 583 and 584 form a current-mirror circuit. The drain of the pMOS transistor 583 is connected to the VCC power supply line 504, and the gate thereof is connected to the drain thereof. Further, the drain of the pMOS transistor 583 is connected to the drain of the nMOS transistor 570. The source of the pMOS transistor 584 is connected to the VCC power supply line 504, and the gate thereof is connected to the gate of the pMOS transistor 583. The drain of the pMOS transistor 584 is connected to the drain of the nMOS transistor 569. A connection node 585, at which the drains of the pMOS transistor 584 and nMOS transistors 569 are connected together, is connected to the gate of the pMOS transistor 574. The other parts of the monitor circuit 582 are the same as corresponding ones of the monitor circuit 567 shown in FIG. 66.

The gate of the pMOS transistor 575 is supplied to a constant voltage of 1.65 V. This method is different from that employed in the circuit shown in FIG. 66. The voltage of the node 585 is feedback-controlled so as to be maintained at 1.65 V by the differential amplifier circuit 572 within the definite range of the reference voltage Vref. Hence, the current flowing in the monitor circuit 582 is maintained at an approximately constant level, and thus the current consumed in the differential amplifier circuit 503 is also maintained at an approximately constant level.

Figure 70:
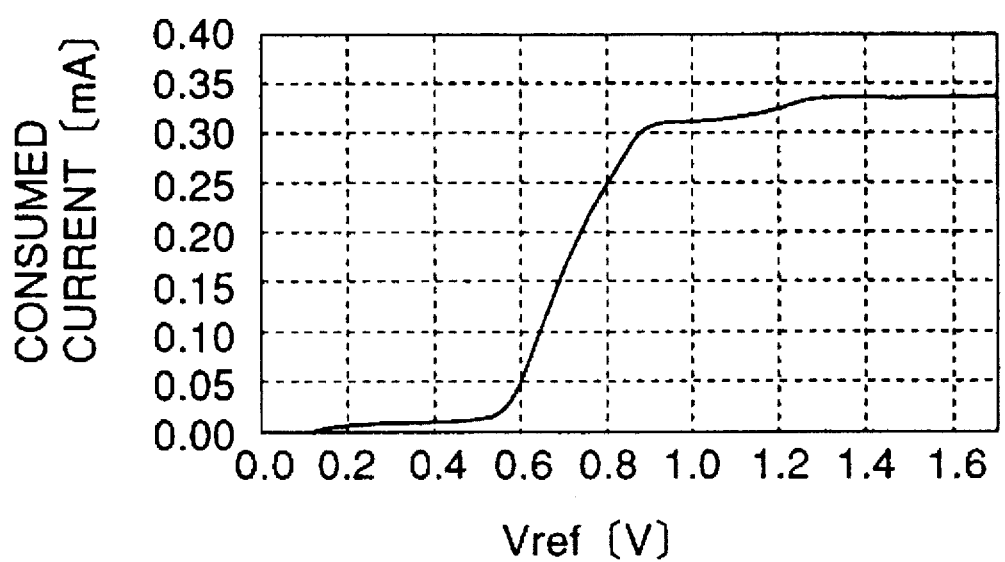
FIG. 70 is a graph of the relationship between the current consumed in a differential amplifier circuit shown in FIG. 69 and the reference voltage.

FIG. 70 is a graph of the relationship between the reference voltage Vref and the current Ia consumed in the differential amplifier circuit 503, the relationship being obtained by the simulation. It can be seen from FIG. 70 that the current consumed in the differential amplifier circuit 503 is maintained at an approximately constant level while the reference voltage Vref is between 0.9 V and 1.7 V.

Further, variation in the current Ia consumed in the differential amplifier circuit 503 used in the circuit shown in FIG. 69 is less than that in the current Ia consumed in the circuit 503 used in the circuit shown in FIG. 66. This is because the circuit shown in FIG. 69 utilizes the pMOS transistors 583 and 584 and the nMOS transistors 569, 570 and 571 obtained by reducing, at the same ratio, the gate widths of the pMOS transistors 505 and 506 and nMOS transistors 507, 508 and 509, and the same configuration as shown in FIG. 66.

According to the circuit shown in FIG. 69, it becomes possible to process, within the range of the reference voltage Vref between 0.9 V and 1.7 V, the different levels of the small-amplitude signal Sin based on the different levels of the reference voltage Vref. As a result, the input circuit shown in FIG. 69 has improved convenience. In addition, it becomes possible to suppress variations in the current Ia consumed in the differential amplifier circuit 503 and improve the production yield even when there are transistors having different gate lengths caused by dispersions in the production process.

The current control circuit 581 can be shared by first-stage differential amplifier circuits in a plurality of input circuits. In general semiconductor devices, there are provided at least 20 input circuits or more. Hence, the current consumed in the current control circuit 581 is relatively negligible.

A description will now be given, with reference to FIG. 71, of an input circuit according to a nineteenth embodiment of the present invention. Basically, the input circuit shown in FIG. 71 is provided for one bus line.

Figure 71:
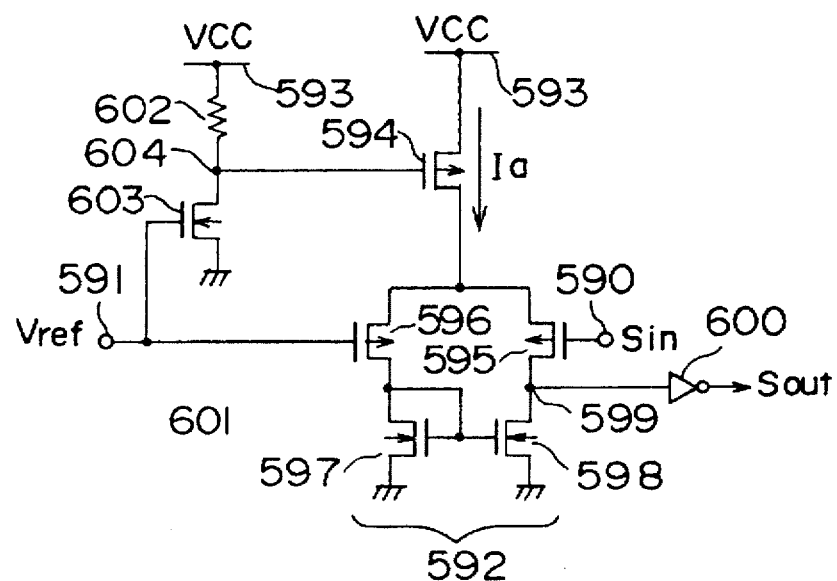
FIG. 71 is a circuit diagram of an input circuit according to a nineteenth embodiment of the present invention.

The input circuit shown in FIG. 71 has a signal input terminal 590 to which the input signal Sin transmitted via a bus line from an external circuit is applied, and a reference voltage input terminal 591 receiving the reference voltage Vref used to make a logic decision on the input signal Sin. The input circuit shown in FIG. 71 includes a differential amplifier circuit 592, which has a VCC power supply line 593 supplying the power supply voltage equal to, for example, 3.3 V, and an enhancement type pMOS transistor 594. Further, the input circuit has enhancement type pMOS transistors 595 and 596 respectively functioning as driving transistors. The small-amplitude signal Sin is applied to the gate of the nMOS transistor 595, and the reference voltage Vref is applied to the gate of the pMOS transistor 596. The input includes enhancement type pMOS transistors 597 and 598 forming a current-mirror circuit serving as a load, a node 599 corresponding to the output terminal of the differential amplifier circuit 592, a waveform shaping inverter 600 via which the output signal Sout of the input circuit is provided.

Further, there are provided a current control circuit 601 for controlling the current Ia consumed in the differential amplifier circuit 592, and a resistor 602 having one end connected to the VCC power supply line 593. The current control circuit 601 includes an enhancement type nMOS transistor 603. The drain of the transistor 603 is connected to the other end of the resistor 602, and the gate thereof is connected to the reference voltage input terminal 591. The source of the transistor 603 is grounded. With the above connections, the pMOS transistor 603 is made to function as a variable resistance element controlled by the reference voltage Vref. A node 104, at which the resistor 602 and the drain of the nMOS transistor 603 are connected together, is connected to the gate of the pMOS transistor 594.

When the transmitted signal Sin is at the high level, the nMOS transistor 595 is OFF and the nMOS transistor 596 is ON. Hence, the potential of the node 599 is low, and the level of the output signal Sout is high. When the transmitted signal Sin is at the low level, the nMOS transistor 595 is ON and the nMOS transistor 596 is OFF. Hence, the potential of the node 599 is high, and the output signal Sout is at the low level.

The ON resistance of the nMOS transistor 603 is relatively large when the reference voltage Vref is relatively high within the definite range. In this case, the voltage of the node 104 is relatively decreased, and the ON resistance of the pMOS transistor 594 is relatively small. When the reference voltage Vref is relatively low, the nMOS transistor 603 has a relative large ON resistance. Hence, the voltage of the node 604 is relatively increased, and the nMOS transistor 594 has an increased ON resistance.

According to the circuit shown in FIG. 71, it becomes possible to maintain the current Ia consumed in the differential amplifier 592 at a constant level within the definite range of the reference voltage Vref. Hence, it becomes possible to process, within the definite range of the reference voltage Vref, the different levels of the small-amplitude signal Sin based on the different levels of the reference voltage Vref. As a result, the input circuit shown in FIG. 71 has improved convenience. In addition, it becomes possible to suppress, by means of the current control circuit 601, variations in the current Ia consumed in the differential amplifier circuit 592 and improve the production yield even when there are transistors having different gate lengths caused by dispersions in the production process.

The current control circuit 601 can be shared by first-stage differential amplifier circuits in a plurality of input circuits.

Figure 72:
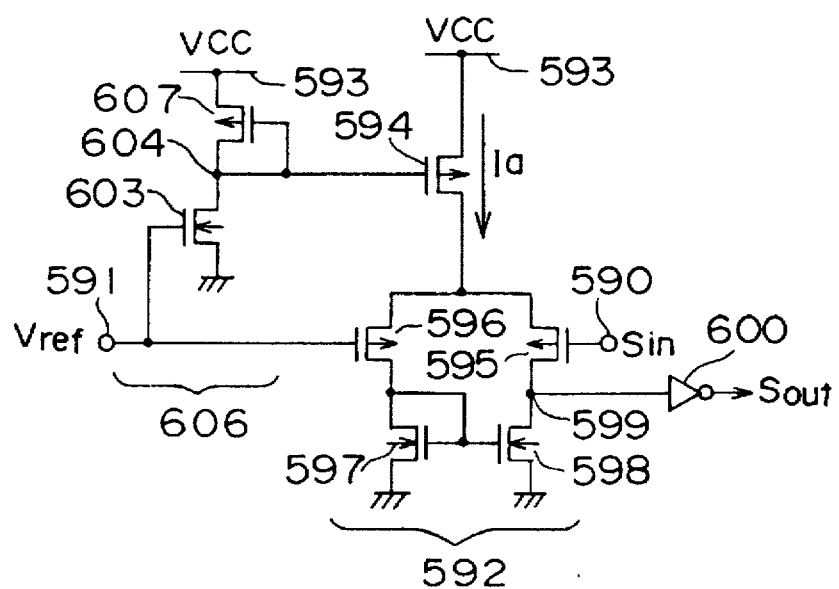
FIG. 72 is a circuit diagram of an input circuit according to a twentieth embodiment of the present invention.

A description will now be given, with reference to FIG. 72, of an input circuit according to a twentieth embodiment of the present invention. Basically, the input circuit shown in FIG. 72 is provided for one bus line. The input circuit has a current control circuit 606 having a structure different from that of the current control circuit 601 shown in FIG. 71. The other parts of the input circuit shown in FIG. 72 are the same as corresponding ones of the input circuit shown in FIG. 71.

The current control circuit 606 employs an enhacement type pMOS transistor 607 instead of the resistor 602 shown in FIG. 71. The other parts of the current control circuit 606 are the same as corresponding ones of the current control circuit 601 shown in FIG. 71. The source of the pMOS transistor 607 is connected to the VCC power supply line 593, and the gate thereof is connected to the drain thereof, which is connected to the drain of the nMOS transistor 603. The range of the reference voltage Vref within which the current Ia consumed in the differential amplifier circuit 592 is wider than that of the reference voltage Vref used in the circuit shown in FIG. 71 because the resistor 602 shown in FIG. 71 is replaced by the nMOS transistor 607.

According to the circuit shown in FIG. 72, it becomes possible to maintain the current Ia consumed in the differential amplifier 592 at a constant level within the definite range of the reference voltage Vref. Hence, it becomes possible to process, within the definite range of the reference voltage Vref, the different levels of the small-amplitude signal Sin based on the different levels of the reference voltage Vref. As a result, the input circuit shown in FIG. 72 has improved convenience. In addition, it becomes possible to suppress, by means of the current control circuit 606, variations in the current Ia consumed in the differential amplifier circuit 592 and improve the production yield even when there are transistors having different gate lengths caused by dispersions in the production process.

The current control circuit 606 can be shared by first-stage differential amplifier circuits in a plurality of input circuits.

Figure 73:
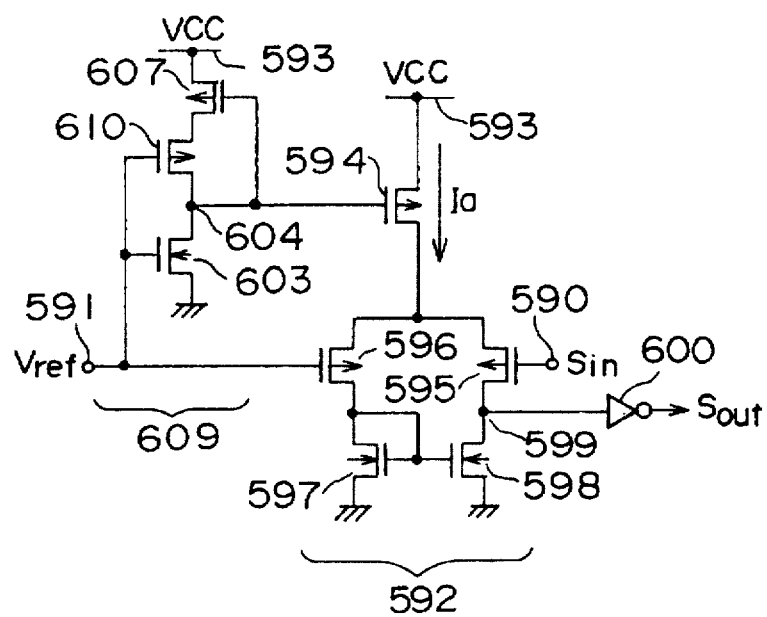
FIG. 73 is a circuit diagram of an input circuit according to a twenty-first embodiment of the present invention.

A description will now be given, with reference to FIG. 73, of an input circuit according to a twenty-first embodiment of the present invention. Basically, the input circuit shown in FIG. 73 is provided for one bus line. The input circuit has a current control circuit 609 having a structure different from that of the current control circuit 606 shown in FIG. 72.

The current control circuit 609 has an enhancement type pMOS transistor 610. The drain of the pMOS transistor 607 and the node 604 are connected together via the source and drain of the pMOS transistor 610. The other parts of the current control circuit 609 are the same as corresponding ones of the current control circuit 606 shown in FIG. 72. The gate of the pMOS transistor 610 is connected to the reference voltage input terminal 591, so that the transistor 610 can function as a variable resistance element controlled by the reference voltage Vref.

When the reference voltage Vref is relatively high, the nMOS transistor 603 has a relatively small ON resistance, and the pMOS transistor 610 has a relatively large ON resistance. When the reference voltage Vref is relatively low, the nMOS transistor 603 has a relatively large ON resistance, and the pMOS transistor 610 has a relatively small ON resistance.

The current control circuit 609 is equipped with the pMOS transistor 610. This differs from the current control circuit 606 shown in FIG. 72. Hence, the range of the reference voltage Vref within which the current Ia consumed in the differential amplifier circuit 592 can be maintained at an approximtely constant level is wider than of the reference voltage Vref employed in the circuit shown in FIG. 72. Hence, it becomes possible to process, within the definite range of the reference voltage Vref, the different voltages of the small-amplitude signal Sin based on the different values of the reference voltage Vref. As a result, the input circuit shown in FIG. 73 has improved convenience. In addition, it becomes possible to suppress, by means of the current control circuit 609, variations in the current Ia consumed in the differential amplifier circuit 592 and improve the production yield even when there are transistors having different gate lengths caused by dispersions in the production process.

The current control circuit 609 can be shared by first-stage differential amplifier circuits in a plurality of input circuits.

Figure 74:
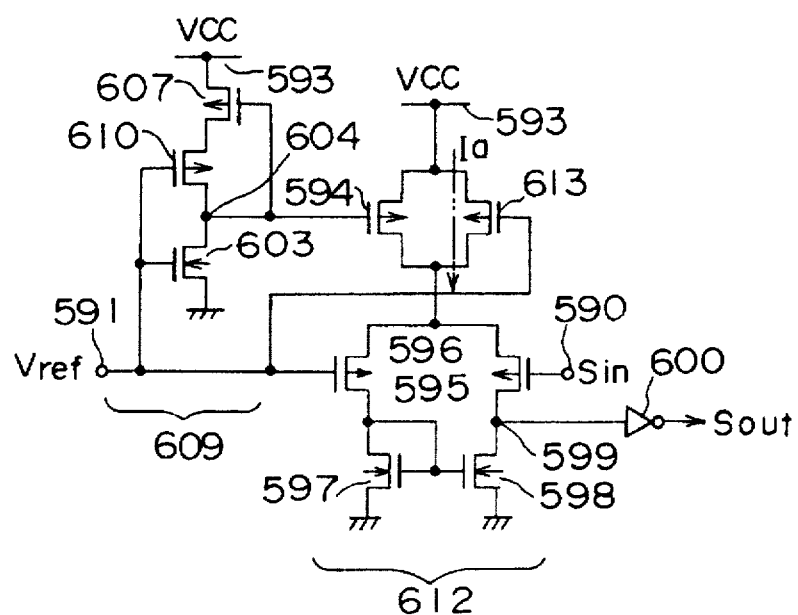
FIG. 74 is a circuit diagram of an input circuit according to a twenty-second embodiment of the present invention.

A description will now be given, with reference to FIG. 74, of an input circuit according to a twenty-second embodiment of the present invention. Basically, the input circuit shown in FIG. 74 is provided for one bus line. This input circuit has a differential amplifier circuit 612 having a structure different from that of the differential amplifier circuit 592 shown in FIG. 73. The other parts of the input circuit shown in FIG. 74 are the same as corresponding ones of the input circuit shown in FIG. 73.

The differential amplifier circuit 612 has an enhancement type pMOS transistor 613. The other parts of the differential amplifier circuit 612 are the same as corresponding ones of the differential amplifier circuit 592 shown in FIG. 73. The source of the pMOS transistor 613 is connected to the VCC power supply line 593, and the drain thereof is connected to the sources of the pMOS transistors 595 and 596. The gate of the pMOS transistor 613 is connected to the reference voltage input terminal 591.

Since the gate of the pMOS transistor 613 is connected to the reference voltage input terminal 591, when the reference voltage Vref is relatively high, the pMOS transistor 613 is made to have an increased ON resistance. Hence, the current Ia consumed in the differential amplifier circuit 612 is relatively decreased.

The input circuit shown in FIG. 74 has the pMOS transistor 613, which differs from the circuit shown in FIG. 73. Hence, the range of the reference voltage Vref within which the current Ia consumed in the differential amplifier circuit 612 can be maintained at an approximately constant level is wider than that of the reference voltage Vref employed in the circuit shown in FIG. 73. Hence, it becomes possible to process, within the definite range of the reference voltage Vref, the different voltages of the small-amplitude signal Sin based on the different values of the reference voltage Vref. As a result, the input circuit shown in FIG. 74 has improved convenience. In addition, it becomes possible to suppress, by means of the current control circuit 609 and the pMOS transistor 613, variations in the current Ia consumed in the differential amplifier circuit 592 and improve the production yield even when there are transistors having different gate lengths caused by dispersions in the production process.

The current control circuit 609 can be shared by first-stage differential amplifier circuits in a plurality of input circuits.

Figure 75:
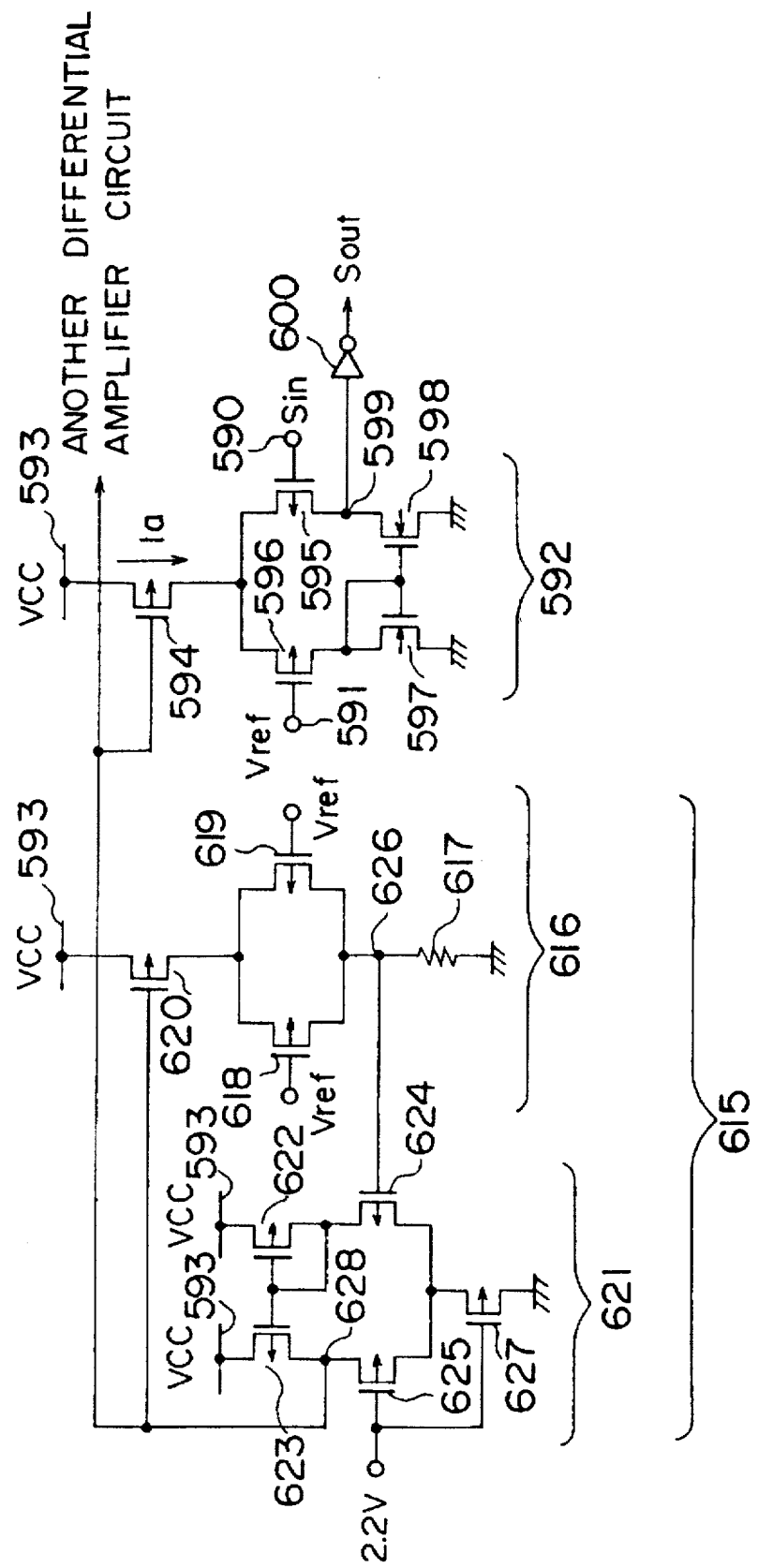
FIG. 75 is a circuit diagram of an input circuit according to a twenty-third embodiment of the present invention.

A description will now be given, with reference to FIG. 75, of an input circuit according to a twenty-third embodiment of the present invention. Basically, the input circuit shown in FIG. 75 is provided for one bus line. The input circuit has a different control circuit 615 having a structure different from that of the current control circuit 601 shown in FIG. 71. The other parts of the input circuit shown in FIG. 75 are the same as corresponding ones of the input circuit shown in FIG. 71.

The current control circuit 615 includes a monitor circuit 616 for monitoring the current Ia consumed in the differential amplifier circuit 592. The monitor circuit 616 has a resistor 617 having a resistance equal to, for example, 60 KΩ. The monitor circuit 616 includes enhancement type pMOS transistors 618 and 619, each having a gate width equal to 1/10 of that of each of the pMOS transistors 595 and 596. The reference voltage Vref is applied to the gates of the pMOS transistors 618 and 619. The monitor circuit 616 further includes an enhacement type pMOS transistor having a gate width equal to 1/10 of that of the pMOS transistor 594.

The input circuit shown in FIG. 75 includes a differential amplifier circuit 621 forming a feedback control circuit. The circuit 621 has enhancement type pMOS transistors 622 and 623 forming a current-mirror circuit serving as a load. The circuit 621 also includes enhacement type nMOS transistors 624 and 625. The gate of the nMOS transistor 624 is supplied with the voltage of a node 626 in the monitor circuit 616, and the gate of the nMOS transistor 625 is supplied with a constant voltage of 2.2 V. Further, there are provided an enhacement type nMOS transistor 627 functioning as a resistance element, and a node 628 forming the output terminal of the differential amplifier circuit 621. The node 628 is connected to the gate of the pMOS transistor 620 of the monitor circuit 626 and the gate of the pMOS transistor 594 of the differential amplifier circuit 592. Further, the node 628 is connected to a pMOS transistor (not shown for the sake of convenience) corresponding to the pMOS transistor 594 of a differential amplifier cirucit (not shown for the sake of convenience) corresponding to the differential amplifier circuit 592 of another input circuit.

The node 626 is feedback-controlled so as to be maintained at a voltage of 2.2 V within the definite range of the reference voltage Vref by means of the differential amplifier circuit 621. Hence, the current flowing in the monitor circuit 616 is maintained at an approximately constant level, and thus the current Ia consumed in the differential amplifier circuit 592 is also maintained at an approximately constant level.

According to the input circuit shown in FIG. 75, it is possible to maintain the current Ia consumed in the differential amplifier circuit 592 at an approximately constant level and to therefore process, within the definite range of the reference voltage Vref, the different voltages of the small-amplitude signal Sin based on the different values of the reference voltage Vref. As a result, the input circuit shown in FIG. 75 has improved convenience. In addition, it becomes possible to suppress, by means of the current control circuit 615, variations in the current Ia consumed in the differential amplifier circuit 592 and improve the production yield even when there are transistors having different gate lengths caused by dispersions in the production process.

The current control circuit 615 can be shared by first-stage differential amplifier circuits in a plurality of input circuits. In general semiconductor devices, there are provided at least 20 input circuits or more. Hence, the current consumed in the current control circuit 581 is relatively negligible.

Figure 76:
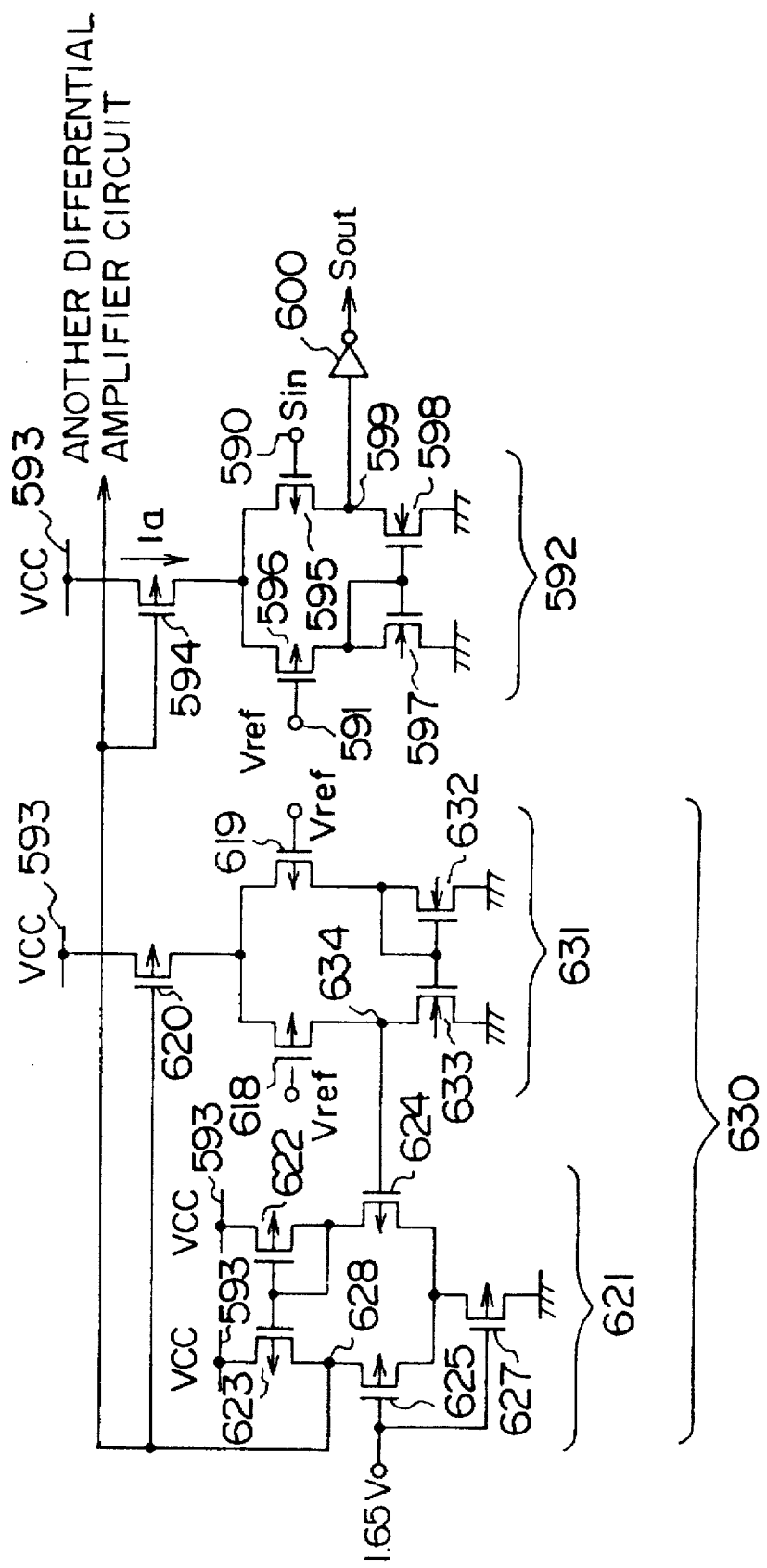
FIG. 76 is a circuit diagram of an input circuit according to a twenty-fourth embodiment of the present invention.

A description will now be given, with reference to FIG. 76, of an input circuit according to a twenty-fourth embodiment of the present invention. Basically, the input circuit shown in FIG. 76 is provided for one bus line. This input circuit has a current control circuit 630 having a structure different from that of the current control circuit 615 shown in FIG. 75. The other parts of the input circuit shown in FIG. 76 are the same as corresponding ones of the input circuit shown in FIG. 75.

The current control circuit 630 includes a monitor circuit 631 having a structure different from that of the monitor circuit 616 shown in FIG. 75. The other parts of the monitor circuit 631 are the same as corresponding ones of the monitor circuit 616 shown in FIG. 75. The monitor circuit 631 includes, instead of the resistor 617 shown in FIG. 75, enhancement type nMOS transistors 632 and 633, each having a gate width equal to 1/10 of that of each of the nMOS transistors 597 and 598. The nMOS transistors 632 and 633 form a current-mirror circuit. The gate of the nMOS transistor 632 is connected to the drain thereof, which is connected to the drain of the pMOS transistor 619. The source of the nMOS transistor 632 is grounded. The gate of the nMOS transistor 633 is connected to the gate of the nMOS transistor 632, and the drain thereof is connected to the drain of the pMOS transistor 618. The source of the nMOS transistor 633 is grounded. A connection node 634, at which the drains of the pMOS transistor 618 and the nMOS transistor 633 are connected together, is connected to the gate of the pMOS transistor 624. The other parts of the monitor circuit 632 are the same as corresponding ones of the monitor circuit 616 shown in FIG. 75.

A constant voltage of 1.65 V is applied to the pMOS transistor 625.

The voltage of the node 134 is feedback-controlled so as to be maintained at 1.65 V within the definite range of the reference voltage Vref by means of the differential amplifier circuit 621. Hence, the current flowing in the monitor circuit 631 is maintained at an approximately constant level, and hence the current Ia consumed in the differential amplifier circuit 592 is also maintained at an approximately constant level.

Variation in the current Ia consumed in the differential amplifier circuit 592 used in the circuit shown in FIG. 76 is less than that in the current Ia consumed in the circuit 592 used in the circuit shown in FIG. 65. This is because the circuit shown in FIG. 76 utilizes the pMOS transistors 620, 618 and 619 and the nMOS transistors 632 and 633 obtained by reducing, at the same ratio, the gate widths of the pMOS transistors 594, 595 and 596 and nMOS transistors 507, 597 and 598, and has the same circuit configuration as that of the differential amplifier circuit 592 shown in FIG. 75.

According to the input circuit shown in FIG. 76, it is possible to maintain the current Ia consumed in the differential amplifier circuit 592 at an approximately constant level and to therefore process, within the definite range of the reference voltage Vref, the different voltages of the small-amplitude signal Sin based on the different values of the reference voltage Vref. As a result, the input circuit shown in FIG. 76 has improved convenience. In addition, it becomes possible to suppress, by means of the current control circuit 630, variations in the current Ia consumed in the differential amplifier circuit 592 and improve the production yield even when there are transistors having different gate lengths caused by dispersions in the production process.

The current control circuit 630 can be shared by first-stage differential amplifier circuits in a plurality of input circuits.

In general semiconductor devices, there are provided at least 20 input circuits or more. Hence, the current consumed in the current control circuit 630 is relatively negligible.

Figure 77:
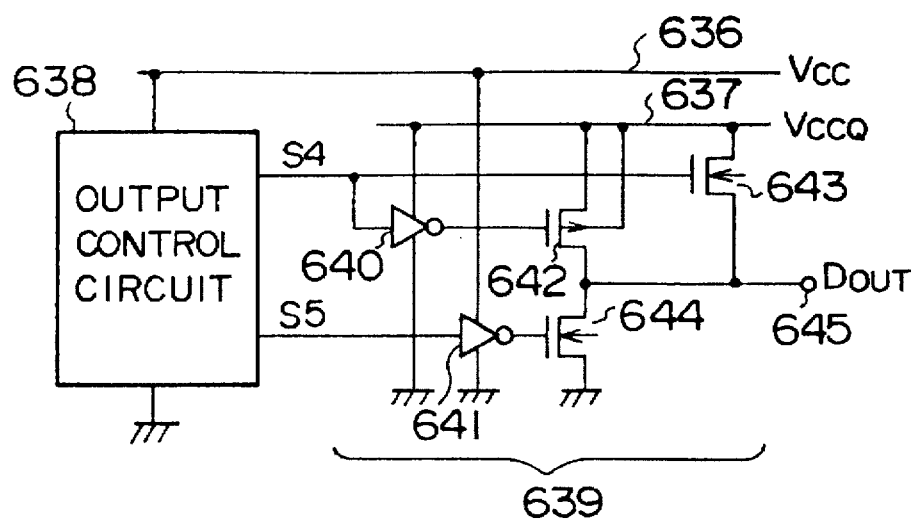
FIG. 77 is a circuit diagram of an output circuit according to a twenty-fifth embodiment of the present invention.

A description will now be given, with reference to FIGS. 77 through 81, of an output circuit according to a twenty-fifth embodiment of the present invention. Basically, the output circuit shown in FIG. 77 is provided for one bus line. The output circuit is connected to a VCC bus line 636 via which the power supply voltage VCC equal to, for example, 3.3 V is supplied, and a VCCQ power supply line 637 via which the power supply voltage VCCQ which falls within the range of, for example, 1.6 V and 3.3 V is supplied.

The output circuit shown in FIG. 77 includes an output control circuit 638 connected to the VCC power supply line 636 and the ground. In accordance with output data, the output control circuit 638 outputs signals S4 and S5 in which the high logic level thereof is set to the power supply voltage VCC and the low logic level thereof is set to the ground voltage 0 V.

The output circuit shown in FIG. 77 includes an output circuit unit 639 connected to the VCCQ power supply line 637. The output circuit unit 639 receives an input terminal receiving the signal S4, and is formed by a CMOS inverter, which outputs the high logic level equal to the power supply voltage VCCQ to its output terminal and the low logic level equal to the ground voltage thereto. The output circuit unit 639 includes a CMOS inverter 641 connected to the VCC power supply line 636. The CMOS inverter 641, receives an input terminal receiving the signal S5, outputs the high logic level equal to the power supply voltage VCCQ to its output terminal and outputs the low logic level equal to the ground voltage thereto.

Further, there are provided an enhancement type pMOS transistor 642 functioning as a pull-up element, an enhancement type nMOS transistor 643 functioning as a pull-down element, an enhancement type nMOS transistor 644 functioning as a pull-down element, and an output terminal 645. The source of the pMOS transistor 642 is connected to the VCCQ power supply line 637, and the drain thereof is connected to the output terminal 645. The gate of the pMOS transistor 642 is connected to the output terminal of the CMOS inverter 640. The drain of the nMOS transistor 643 is connected to the VCCQ power supply line 637, and the source thereof is connected to the output terminal 645. The gate of the nMOS transistor 643 receives the signal S4. The drain of the nMOS transistor 644 is connected to the output terminal 645, and the source thereof is grounded. The gate of the nMOS transistor 644 is connected to the output terminal of the CMOS inverter 641.

When the signal S4 is at the high level and the signal S5 is at the high level, the transistors 643, 643 and 644 are respectively ON, ON and OFF. Hence the output signal Dout is at the high level. When the signal S4 is at the low level and the signal S5 is at the low level, the transistors 642, 643 and 644 are respectively OFF, OFF and ON. Hence, the output signal Dout is at the low level. When the signal S4 is at the low level and the signal S5 is at the high level, the transistors 642, 643 and 644 are respectively OFF, OFF and OFF. Hence, the output circuit is switched to the high-impedance state. Hence, the destination of the output signal Dout is terminated at the termination voltage VTT equal to VCCQ/2 (equal to, for example, 0.8 V to 1.65 V), and the reference voltage Vref for a differential amplifier circuit of the first-stage circuit of the input signal of the destination is equal to VCCQ/2.

If the power supply voltage VCCQ is equal to or close to 3.3 V, the pull-up operation at the output terminal is actively performed by the transistor 542. This is because the transistor 543 performs the source-follower operation, and does not have a sufficient driving ability due to a voltage loss equal to its threshold voltage with respect to the output signal Dout close to the power supply voltage VCC. That is, in the above case, the nMOS transistor 643 has the driving ability only in the initial state of switching of the output signal Dout from the low level to the high level, and looses the driving ability as the output level rises.

However, if the power supply voltage VCCQ is set approximately equal to 1.0 V, a voltage as low as approximately 1.0 V is applied across the gate and source of the pMOS transistor 642. Hence, only 1.0 V or a voltage close thereto is applied in the pull-up operation, and a sufficient driving ability is not exhibited. Hence, the pMOS transistor 642 does not have a sufficient driving ability. If the threshold voltage of the pMOS transistor 642 is set to, for example, −1 V, it cannot be turned ON.

On the other hand, the nMOS transistor 643 has a sufficient driving ability in the pull-up operation because the power supply voltage VCC of 3.3 V is applied thereto. Hence, the nMOS transistor 643 actively performs the pull-up operation.

That is, the output circuit 639 is equipped with, as the pull-up element, the pMOS transistor 642 receiving the high level equal to VCCQ and, as the pull-down element, the nMOS transistor 643 receiving the high level equal to VCC. Hence, the driving ability of the output circuit 639 does not change greatly even when the output circuit is made to output the small-amplitude signal Dout having different voltages based on the different values of the reference voltage Vref by changing the power supply voltage VCCQ within the definite range.

The destination of the output signal Dout is equipped with the input circuit according to the aforementioned thirteenth, fourteenth, fifteenth, sixteenth, seventeenth or eighteenth embodiment of the present invention, the lower limit of the reference voltage Vref is equal to 0.8 V as shown in FIG. 57, 59, 61, 65, 67 or 70. This is because, when the threshold voltages of the nMOS transistors 507 and 508 are set to 0.6 V and the reference voltage Vref is 0.8 V, the voltage of the small-amplitude signal Sin becomes close to the threshold voltages of the nMOS transistors 507 and 508, and the differential amplifier circuit 503 or 563 is shifted to the inoperable range. The reference voltage Vref can be further reduced and practically reduced to the amplitude of the small-amplitude signal Sin by setting the threshold voltages of the nMOS transistors 507 and 508 to a value lower than 0.6 V or using the depletion type of nMOS transistors 507 and 508.

Figure 78:
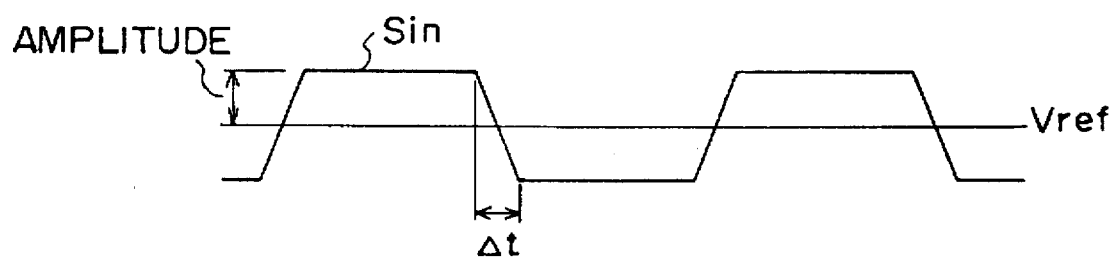
FIG. 78 is a waveform diagram of an input signal applied to the output circuit shown in FIG. 77.
Figure 79:
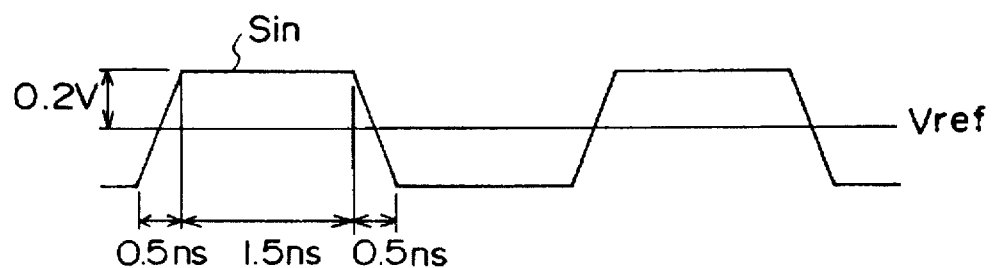
FIG. 79 is a waveform diagram of the input signal of a frequency of 200 MHz.

If the input signal Sin having a waveform shown in FIG. 78 is input to the input circuit, the slew rate of the input signal Sin can be defined as $\Delta t/(2\times\text{amplitude})$. If the input signal Sin has a frequency of 200 MHz, the waveform thereof will be as shown in FIG. 79, and the slew rate thereof is 1.25 ns/V.

Figure 80:
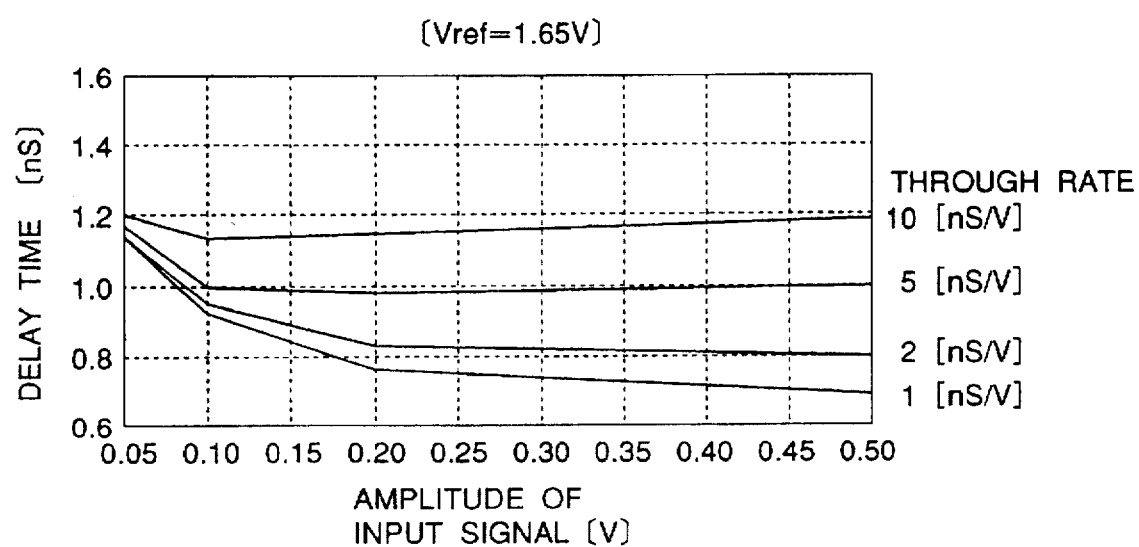
FIG. 80 is a graph of the relationship between the amplitude of the input signal and the time delay of an input circuit of an nMOS current-mirror type differential amplifier circuit when the reference voltage is equal to 1.65 V.
Figure 81:
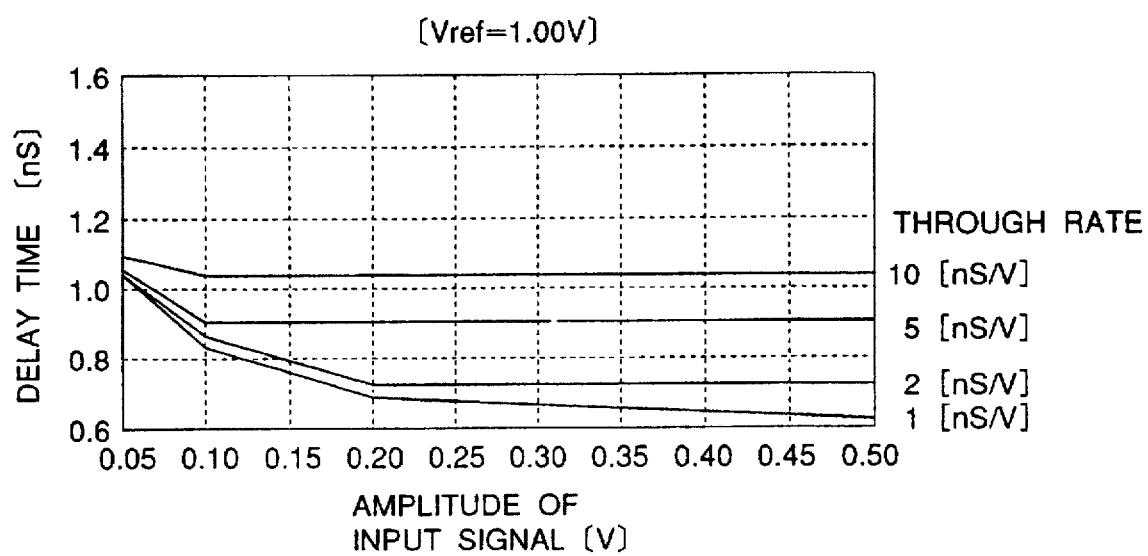
FIG. 81 is a graph of the relationship between the amplitude of the input signal and the time delay of the input circuit of the nMOS current-mirror type differential amplifier circuit when the reference voltage is equal to 1.0 V.

FIGS. 80 and 81 are graphs of the relationship between the amplitude of the input signal Sin and delay time caused in the input circuit containing an nMOS current-mirror type differential amplifier circuit in which the driving transistors are of the nMOS type and the load is a current-mirror circuit of pMOS transistors. It can be seen from FIGS. 80 and 81 that the delay time caused in the input circuit depends on the amplitude of the input signal Sin at a slew rate of 1–2 ns/V unless the amplitude of the input signal Sin is equal to or greater than 0.2 V. Hence, the input signal Sin is required to have a minimum amplitude of 0.2 V.

In order to set the amplitude of the input signal Sin equal to lower than 0.2 V, it is necessary for the output circuit to provide the output signal having an amplitude of 0.3 V, taking into consideration a deformation of the waveform caused by reflection on the bus line. This corresponds to the case where a signal reflection coefficient is equal to ⅓. In this case, the characteristic impedance of the bus line is half the resistance of the termination resistors provided at either end of the bus line. For example, if the termination resistance is 50 Ω, the load viewed from the output circuit 639 is 25 Ω. In order to apply a signal having an amplitude equal to 0.3 V. It is necessary to make a current of ±12 mA flow in the bus line.

Generally, the inner resistance of the nMOS transistor 644 is designed to have a minimum resistance of 10 Ω due to the size of the transistor 644. In order to flow a current of ±12 mA in the bus line, a voltage of 0.2 V develops across the drain and source of the nMOS transistor 644. Hence, the minimum level of the power supply voltage VCCQ is 0.84 V (=0.12+0.3)×2. If the power supply voltage VCCQ is lower than the above level, the characteristics of the input circuit will be degraded. Hence, the power supply voltage VCCQ should be equal to or higher than 0.84 V. In this case, the reference voltage Vref is suitably equal to 0.42 V. In this case, the driving transistors of the differential amplifier circuit of the input circuit are formed by depletion type nMOS transistors.

According to the circuit shown in FIG. 77, the output circuit 639 is provided in which the driving ability of the output circuit 639 does not change greatly even when the output circuit is made to output the small-amplitude signal Dout having different voltages based on the different values of the reference voltage Vref by changing the power supply voltage VCCQ within the definite range. Hence, it is possible to process the small-amplitude signal Dout which may have different levels based on the different values of the reference voltage Vref within the definite range. As a result, the output circuit shown in FIG. 77 has improved convenience.

When the operation temperature relatively rises, the threshold voltages of the pMOS transistor 642 and nMOS transistor 643 become relatively small. Further, the ON resistance of the pMOS transistor 642 becomes relatively large, and the ON resistance of the nMOS transistor 643 becomes relatively small. When the operation temperature relatively becomes low, the threshold voltages of the pMOS transistor 642 and nMOS transistor 643 become relatively high. Further, the ON resistance of the pMOS transistor 642 becomes relatively small, and the ON resistance of the nMOS transistor 643 becomes relatively large. Hence, the amplitude of the output signal Dout can be maintained at a constant level independently of variations in the operation temperature.

Figure 82:
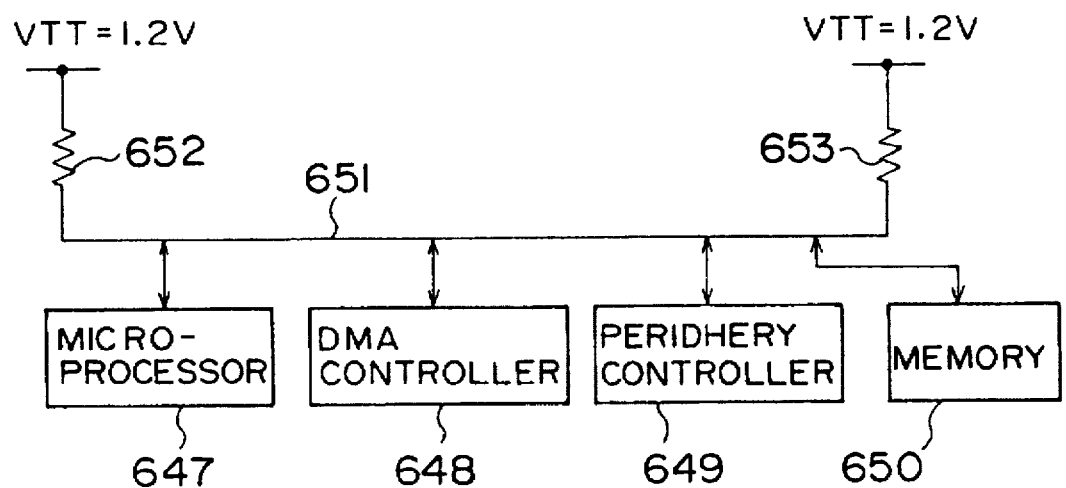
FIG. 82 is a block diagram of a first example of the electronic system according to the present invention.

FIG. 82 is a block diagram of an example of the overall electronic system according to the present invention. The system shown in FIG. 82 includes a microprocessor 647, a DMA (Direct Memory Access) controller 148, and a periphery controller 649. These elements are logic IC devices. Further the system includes a memory 650, which is, for example, a DRAM (Dynamic Random Access Memory), an SDRAM, an SRAM (Static Random Access Memory), a VRAM (Video RAM), a ROM (Read Only Memory) or the like. The devices 647–650 are connected to a bus 651 having a plurality of bus lines. The bus 651 is terminated by means of resistors 652 and 653 to which the termination voltage VTT equal to, for example, 1.2 V is applied.

The aforementioned input and output circuits can be provided in each of the devices 647–650. It will be noted that the bus transmits not only data signals but also other signals such as address signals, clock signals and control signals. The aforementioned input and output circuits can be applied to transmissions of these signals.

Figure 83:
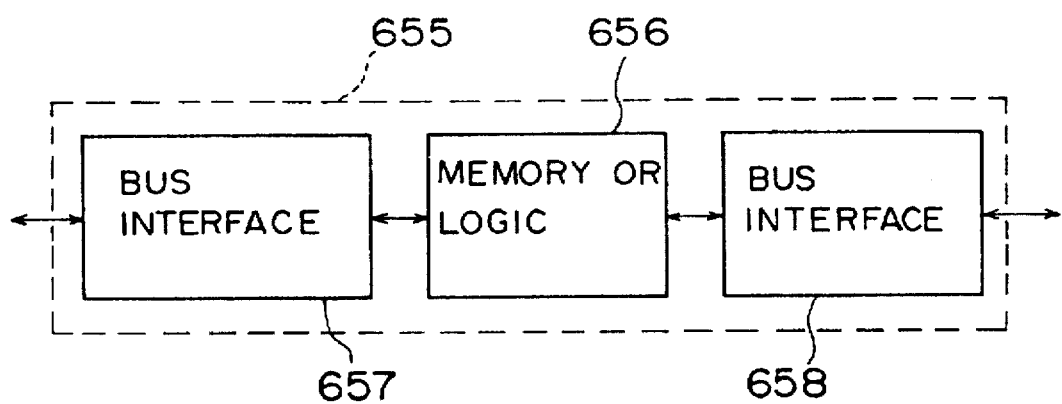
FIG. 83 is a block diagram of a second example of the electronic system according to the present invention.

FIG. 83 is a block diagram of an IC chip, which includes an IC chip main body 655, a memory part or a logic part 656, and bus interfaces 657 and 658. The aforementioned input and output circuits can be applied to the bus interfaces 657 and 658.

Figure 84:
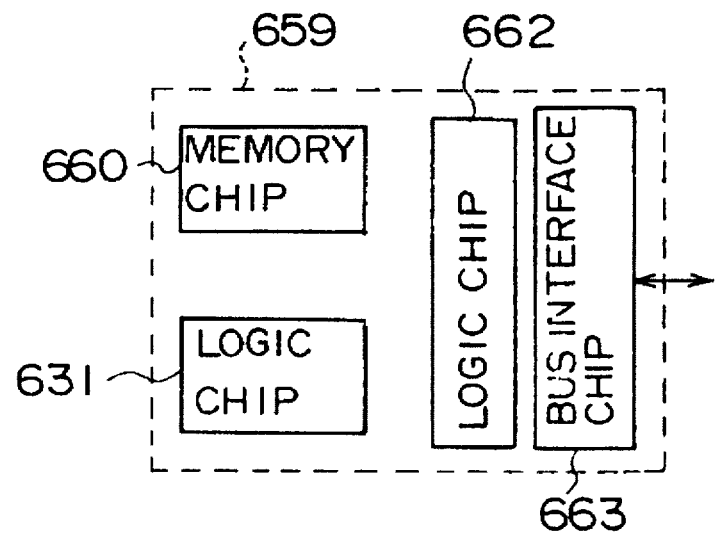
FIG. 84 is a block diagram of a third example of the electronic system according to the present invention.

FIG. 84 is a block diagram of a multi-carrier module (MCM), which includes an MCM substrate 659, a memory chip 660, logic chips 661 and 662, and a bus interface chip 663. The aforementioned input and output circuits can be applied to the bus interface chip 663.

Figure 85:
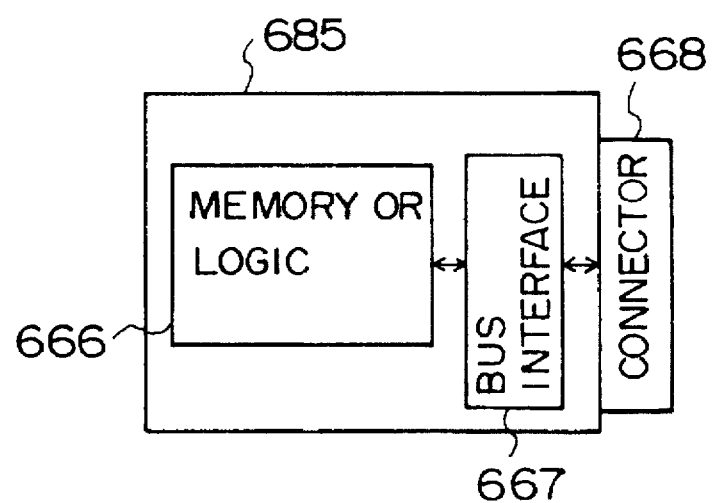
FIG. 85 is a block diagram of a fourth example of the present invention.

FIG. 85 is a block diagram of a printed circuit board module, which includes a printed circuit board 665, a memory circuit or a logic circuit 666, a bus interface circuit 667, and a connector 668. The aforementioned input and output circuits can be applied to the bus interface circuit 663.

The present invention can be applied to various standards such as the GTL, the NTL (nMOS Transceiver Logic), LVTTL (low-voltage TTL), T-LVTTL (Terminated LVTTL) and the CTT (Center Tapped Termination) standards.

The present invention is not limited to the specifically disclosed embodiments, and variations and modifications may be made without departing from the scope of the present invention.

What is claimed is:

1. An electronic system comprising:
    a plurality of electronic circuits each having a signal input and output function;
    a bus to which the plurality of electronic circuits are connected;
    first termination resistors connected to ends of the bus; and
    a termination voltage circuit having a first part generating a first voltage and a second part generating a second voltage, a sum of the first voltage and the second voltage being supplied, as a power supply voltage, to output circuits of the plurality of electronic circuits connected to the bus, the second voltage being supplied to the first termination resistors as a termination voltage.

2. The electronic system as claimed in claim 1, wherein the first and second parts of said termination voltage circuit are connected in series.

3. The electronic system as claimed in claim 1, wherein:
    the second part comprises an operational amplifier having a first input terminal receiving a divided voltage derived from the first voltage, a second input terminal, and an output terminal connected to the second input terminal; and
    the second voltage is output via said output terminal and is equal to the first voltage.

4. The electronic system as claimed in claim 1, further comprising second resistors connected to branch points, the plurality of electronic circuits being coupled to the branch points of the bus via said second resistors.

5. The electronic system as claimed in claim 4, wherein the second resistors have resistance values which produce driving currents for driving the output circuits, said driving currents being equal to those obtained if the second resistors are omitted and the power supply voltage supplied to the output circuits is increased.

6. The electronic system as claimed in claim 1, further comprising a second resistor which connects at least one electronic circuit to the bus, the remaining electronic circuits being directly connected to the bus.

7. The electronic system as claimed in claim 6, wherein:
driving currents for driving the output circuits of the remaining electronic circuits directly connected to the bus have a first driving current value viewed from the bus;
driving circuits for driving the output circuit of said at least one electronic circuit connected to the bus via the second resistor has a second driving current value; and
the first driving current value is equal to or nearly equal to the second driving current value.

8. The electronic system as claimed in claim 1, wherein a value of a characteristic impedance of a wire connecting a second resistor and one of the plurality of electronic circuits connected to the bus via the second resistor is equal to or less than a resistance value of the second resistor and half of a value of a characteristic impedance of the bus.

9. The electronic system as claimed in claim 1, wherein at least one of the plurality of electronic circuits directly connected to the bus provides an output signal via a second resistor disposed closed to the output circuit of said at least one of the plurality of electronic circuits.

10. The electronic system as claimed in claim 9, wherein said second resistor has a negative temperature coefficient.

11. The electronic system as claimed in claim 9, wherein said second resistor is arranged in a package of said at least one of the plurality of electronic circuits.

12. The electronic system as claimed in claim 1, wherein the first voltage generated by said first part depends on operation temperatures of the output circuits of some or all of the plurality of electronic circuits, and has a positive temperature coefficient.

13. The electronic system as claimed in claim 12, wherein the second voltage generated by said second part depends on operation temperatures of the output circuits of some or all of the plurality of electronic circuits, and has a positive temperature coefficient.

14. The electronic system as claimed in claim 1, further comprising a temperature sensor provided at least one of the plurality of electronic circuits,
wherein the first part generates the first voltage so as to be varied in response to a temperature sensed by the temperature sensor, and has a positive temperature coefficient.

15. The electronic system as claimed in claim 14, wherein the second part generates the second voltage so as to be varied in response to the temperature sensed by the temperature sensor, and has another positive temperature coefficient.

16. The electronic system as claimed in claim 1, wherein:
at least one of the plurality of electronic circuits is connected to the bus via a second resistor;
the first voltage generated by the first part depends on temperatures of some or all of electronic circuits directly connected to the bus, and has a positive temperature coefficient.

17. The electronic system as claimed in claim 16, wherein the second voltage generated by the first part depends on the temperatures of some or all of electronic circuits directly connected to the bus, and has another positive temperature coefficient.

18. The electronic system as claimed in claim 1, further comprising a temperature sensor provided at least one of the plurality of electronic circuits directly connected to the bus,
wherein the first part generates the first voltage so as to be varied in response to a temperature sensed by the temperature sensor, and has a positive temperature coefficient.

19. The electronic system as claimed in claim 18, wherein the second part generates the second voltage so as to be varied in response to the temperature sensed by the temperature sensor, and has another positive temperature coefficient.

20. The electronic system as claimed in claim 1, wherein each of the output circuits of the plurality of electronic circuits comprises a pull-up element of a first transistor formed of a p-channel insulation gate type field effect transistor, and a pull-down element of a second transistor formed of an n-channel insulation gate type field effect transistor, a connection of the first and second transistors in series in each of the output circuits being connected to an output terminal of the output circuit for connecting the output circuit to the bus.

21. The electronic system as claimed in claim 20, further comprising a first inverter of a complementary type driving the first transistor, and a second inverter of the complementary type driving the second transistor,
wherein the first and second inverters are supplied with a power supply voltage equal to the sum of the first voltage and the second voltage.

22. The electronic system as claimed in claim 1, wherein:
each of the output circuits of the plurality of electronic circuits comprises a pull-up element of a first transistor formed of an n-channel insulation gate type field effect transistor, and a pull-down element of a second transistor formed of an n-channel insulation gate type field effect transistor; and
a threshold voltage of the first transistor is equal to or higher than a low-level output signal output from each of the output circuits, and is lower than a threshold voltage of the second transistor, a connection of the first and second transistors in series in each of the output circuits being connected to an output terminal of the output circuit for connecting the output circuit to the bus.

23. The electronic system as claims in claim 1, wherein:
each of the output circuits of the plurality of electronic circuits comprises a pull-up element of a first transistor formed of a p-channel insulation gate type field effect transistor of a depletion type, and a pull-down element of a second transistor formed of an n-channel insulation gate type field effect transistor of an enhancement type; and
a threshold voltage of the first transistor is equal to or higher than a low-signal level output from each of the output circuits, a connection of the first and second transistors in series in each of the output circuits being connected to an output terminal of the output circuit for connecting the output circuit to the bus.

24. The electronic system as claimed in claim 1, further comprising a packaged termination device having the first termination resistors.

25. The electronic system as claimed in claim 1, further comprising a packaged termination device having the first termination resistors, at least one of the plurality of electronic circuits and said packaged termination device being arranged on a circuit board in a stack formation.

26. The electronic system as claimed in claim 24, wherein the packaged termination device has a reference voltage output terminal via which the termination voltage is output as a reference voltage used in the plurality of electronic circuits.

27. The electronic system as claimed in claim 3, further comprising a packaged termination device having the first termination resistors and said second part of the termination voltage circuit.

28. The electronic system as claimed in claim 3, further comprising a packaged termination device having the first termination resistors and the second part of the termination voltage circuit, wherein at least one of the plurality of electronic circuits and the packaged termination device are arranged on a circuit board in a stack formation.

29. The electronic system as claimed in claim 27, wherein the packaged termination device has a reference voltage output terminal via which the second voltage is output as a reference voltage used in the plurality of electronic circuits.

30. The electronic system as claimed in claim 3, wherein said operational amplifier comprises:

a first differential amplifier circuit supplied, as a power supply voltage, with said first voltage and comprised of driving transistors formed of first and second n-channel insulation gate type field effect transistors;

a second differential amplifier circuit supplied, as a power supply voltage, with said first voltage and comprised of driving transistors formed of first and second p-channel insulation gate type field effect transistors; and an output circuit supplied, as a power supply voltage, with said first voltage and comprised of a pull-up element driven by said first differential amplifier circuit and formed of a third p-channel insulation gate type field effect transistor and a pull-down element driven by said second differential amplifier circuit and formed of a third n-channel insulation gate type field effect transistor, wherein:

a connection node at which a gate of the first p-channel insulation gate type field effect transistor and a gate of the first n-channel insulation gate type field effect transistor are connected together is connected to said first input terminal;

a connection node at which a gate of the second p-channel insulation gate type field effect transistor and a gate of the second n-channel insulation gate type field effect transistor are connected together is connected to said second input terminal; and an output terminal of said output circuit of the operational amplifier forms the output terminal of the operational amplifier.

31. The electronic system as claimed in claim 1, wherein one of the first termination resistors has a resistance value greater than an effective characteristic impedance of the bus and smaller than a characteristic impedance of the bus obtained when no load is connected to the bus.

32. An electronic circuit comprising:

a main body circuit connected to a first power supply line supplying a first power supply voltage;

an output circuit having a first pull-up element formed of a first p-channel insulation gate type field effect transistor, and a first pull-down element formed of a first n-channel insulation gate type field effect transistor;

a first inverter having a second pull-up element formed of a second p-channel insulation gate type field effect transistor, and a second pull-down element formed of a second n-channel insulation gate type field effect transistor; and a second inverter having a third pull-up element formed of a third p-channel insulation gate type field effect transistor, and a third pull-down element formed of a third n-channel insulation gate type field effect transistor, the first pull-up element and the first pull-down element being connected in series between a second power supply line and a third power supply line, and a connection node thereof being connected to an output terminal of the output circuit for connecting the output circuit to a bus, the second power supply line supplying a second power supply voltage lower than the first power supply voltage, the third power supply line supplying a third power supply voltage lower than the second power supply voltage, the second pull-up element and the second pull-down element being connected in series between the second power supply line and the third power supply line, the third pull-up element and the third pull-down element being connected in series between the second power supply line and the third power supply line, the second power supply voltage being applied, as a back bias voltage, to the second and third pull-up elements, the first inverter driving the first pull-up element, and the second inverter driving the first pull-down element.

33. An electronic circuit comprising:

an output circuit having a first pull-up element formed of a first n-channel insulation gate type field effect transistor, and a first pull-down element formed of a second n-channel insulation gate type field effect transistor, the first n-channel insulation gate type field effect transistor has a threshold voltage equal to or higher than a low-level signal output from said output circuit and is lower than a threshold voltage of said second n-channel insulation gate type field effect transistor, a connection of the first and second transistors in series in the output circuit being connected to an output terminal of the output circuit for connecting the output circuit to the bus.

34. An electronic circuit comprising:

an output circuit having a first pull-up element formed of a first n-channel insulation gate type field effect transistor of a depletion type, and a first pull-down element formed of a second n-channel insulation gate type field effect transistor of an enhancement type, the first n-channel insulation gate type field effect transistor has a threshold voltage equal to or higher than a low-level signal output from said output circuit, a connection of the first and second transistors in series in the output circuit being connected to an output terminal of the output circuit for connecting the output circuit to the bus.

35. A termination device applied to an electronic system comprising: a plurality of electronic circuits each having a signal input and output function; and a bus to which the plurality of electronic circuits are connected, said termination device comprising:

termination resistors connected to ends of the bus; and a package member packaging said termination resistors.

36. The termination device as claimed in claim 35, further comprising a termination voltage circuit packaged by said package member and composed of a first part generating a first voltage and a second part generating a second voltage, a sum of the first voltage and the second voltage being supplied, as a power supply voltage, to output circuits of the plurality of electronic circuits connected to the bus, the second voltage being supplied to the first termination resistors as a termination voltage.

37. The termination device as claimed in claim 36, further comprising a reference voltage output terminal via which said second voltage is output as a reference voltage used for the plurality of electronic circuits.

38. The termination device as claimed in claim 36, wherein the termination resistors and at least one of the plurality of electronic circuits are arranged in a stack formation.

39. An electronic system comprising:

a plurality of electronic circuits having a signal input and output function and a push-pull type output circuit;

a bus to which the plurality of electronic circuits are connected; and a termination device having a first non-linear element, and a second non-linear element, the first non-linear element being connected between a termination voltage line and said bus in a forward direction, the second non-linear element being connected, in the forward direction, between the bus and a voltage line carrying a voltage lower than a termination voltage supplied via the termination voltage line, no current flowing in the bus when no signal is transmitted via the bus, wherein said first and second non-linear elements are series circuits, each having a diode and a resistor connected in series.

40. An electronic system comprising:

a plurality of electronic circuits having a signal input and output function and a push-pull type output circuit;

a bus to which the plurality of electronic circuits are connected; and a termination device having a first non-linear element, and a second non-linear element, the first non-linear element being connected between a termination voltage line and said bus in a forward direction, the second non-linear element being connected, in the forward direction, between the bus and a voltage line carrying a voltage lower than a termination voltage supplied via the termination voltage line, no current flowing in the bus when no signal is transmitted via the bus, wherein:

said first non-linear element comprises an n-channel insulation gate type field effect transistor having a drain receiving the termination voltage, a source connected to the bus, and a gate supplied with a first bias voltage; and said second non-linear element comprises a p-channel insulation gate type field effect transistor having a source connected to the bus, a drain connected to said voltage line via which the voltage lower than the termination voltage is supplied, and a gate supplied with a second bias voltage.

41. The electronic system as claimed in claim 40, wherein a value obtained by subtracting the second bias voltage from the first bias voltage is less; than a sum of a threshold voltage of the n-channel insulation gate type field effect transistor and an absolute value of a threshold voltage of the p-channel insulation gate type field effect transistor.

42. The electronic system as claimed in claim 40, further comprising:

a first bias voltage generating circuit including a first operational amplifier and generating said first bias voltage; and a second bias voltage generating circuit including a second operational amplifier and generating said second bias voltage.

43. The electronic system as claimed in claim 42, wherein said first operational amplifier comprises:

a first differential amplifier circuit having driving transistors formed of first and second n-channel insulation gate type field effect transistors;

a second differential amplifier having driving transistors formed of first and second p-channel insulation gate type field effect transistors; and a first output circuit having a pull-up element driven by the first differential amplifier circuit and formed of a third p-channel insulation gate type field effect transistor, and a pull-down element driven by the second differential amplifier circuit and formed of a third n-channel insulation gate type field effect transistor, the first operational amplifier having a first input terminal corresponding to a first connection node at which a gate of the first p-channel insulation gate type field effect transistor and a gate of the first n-channel insulation gate type field effect transistor are connected together, a second input terminal corresponding to a second connection node at which a gate of the second p-channel insulation gate type field effect transistor and a gate of the second n-channel insulation gate type field effect transistor are connected together, and an output terminal corresponding to an output terminal of said first output circuit, the output terminal of the first operational amplifier being connected to the first input terminal thereof, the second input terminal being supplied with a reference voltage, said first bias voltage being obtained at the output terminal of the first operational amplifier, and wherein said second bias voltage generating circuit comprises:

a third differential amplifier circuit having driving transistors formed of fourth and fifth n-channel insulation gate type field effect transistors;

a fourth differential amplifier having driving transistors formed of fourth and fifth p-channel insulation gate type field effect transistors; and a second output circuit having a pull-up element driven by the third differential amplifier circuit and formed of a sixth third p-channel insulation gate type field effect transistor, and a pull-down element driven by the fourth differential amplifier circuit and formed of a sixth n-channel insulation gate type field effect transistor, the second operational amplifier having a first input terminal corresponding to a third connection node at which a gate of the fourth p-channel insulation gate type field effect transistor and a gate of the fourth n-channel insulation gate type field effect transistor are connected together, a second input terminal corresponding to a fourth connection node at which a gate of the fifth p-channel insulation gate type field effect transistor and a gate of the fifth n-channel insulation gate type field effect transistor are connected together, and an output terminal corresponding to an output terminal of said second output circuit, the output terminal of the second operational amplifier being connected to the first input terminal thereof, the second input terminal being supplied with the reference voltage, said second bias voltage being obtained at the output terminal of the first operational amplifier.

44. An electronic system comprising:

a plurality of electronic circuits having a signal input and output function and a push-pull type output circuit;

a bus to which the plurality of electronic circuits are connected; and a termination device having a first non-linear element, and a second non-linear element, the first non-linear element being connected between a termination voltage line and said bus in a forward direction, the second non-linear element being connected, in the forward direction, between the bus and a voltage line carrying a voltage lower than a termination voltage supplied via the termination voltage line, no current flowing in the bus when no signal is transmitted via the bus, wherein said termination device includes an integrated circuit having the first and second non-linear elements, and a termination voltage generating circuit connected to the termination voltage line.

45. An electronic system comprising:

a plurality of electronic circuits having a signal input and output function and a push-pull type output circuit;

a bus to which the plurality of electronic circuits are connected; and a termination device having a first non-linear element, and a second non-linear element, the first non-linear element being connected between a termination voltage line and said bus in a forward direction, the second non-linear element being connected, in the forward direction, between the bus and a voltage line carrying a voltage lower than a termination voltage supplied via the termination voltage line, no current flowing in the bus when no signal is transmitted via the bus, wherein said termination device has an integrated circuit having the first and second non-linear elements, and a reference voltage output terminal via which the reference voltage is output.

46. An electronic system comprising:

a plurality of electronic circuits having a signal input and output function and a push-pull type output circuit;

a bus to which the plurality of electronic circuits are connected; and a termination device having a first non-linear element, and a second non-linear element, the first non-linear element being connected between a termination voltage line and said bus in a forward direction, the second non-linear element being connected, in the forward direction, between the bus and a voltage line carrying a voltage lower than a termination voltage supplied via the termination voltage line, no current flowing in the bus when no signal is transmitted via the bus, wherein the termination device and the plurality of electronic circuits are arranged on a circuit board in a stack formation.

47. An electronic system comprising:

a plurality of electronic circuits having a signal input and output function and a push-pull type output circuit;

a bus to which the plurality of electronic circuits are connected; and a termination device having a first non-linear element, and a second non-linear element, the first non-linear element being connected between a termination voltage line and said bus in a forward direction, the second non-linear element being connected, in the forward direction, between the bus and a voltage line carrying a voltage lower than a termination voltage supplied via the termination voltage line, no current flowing in the bus when no signal is transmitted via the bus, the electronic system further comprising:
a third non-linear element; and
a fourth non-linear element, the third non-linear element being connected between the termination voltage line and said bus in the forward direction, the fourth non-linear element being connected, in the forward direction, between the bus and the voltage line carrying the voltage lower than the termination voltage supplied via the termination voltage line, a reference voltage necessary for operations of input circuits of the plurality of electronic circuits is output via a connection node at which the third and fourth non-linear elements are connected in series.

48. The electronic system as claimed in claim 47, wherein said third and fourth non-linear elements comprise diodes.

49. The electronic system as claimed in claim 47, wherein said third and fourth non-linear elements comprise series circuits, each having a diode and a resistor connected in series.

50. The electronic system as claimed in claim 47, wherein said third and fourth non-linear elements comprise insulation gate type field effect transistors which are diode-connected.

51. An termination device comprising:

a first non-linear element; and a second non-linear element, the first non-linear element being connected, in a forward direction, between a bus and a termination voltage line via which a termination voltage is supplied, the second non-linear element being connected, in the forward direction, between the bus and a voltage line via which a voltage lower than the termination voltage is supplied, wherein said first and second non-linear elements comprise series circuits, each having a diode and a resistor connected in series.

52. An electronic circuit comprising:

a plurality of logic decision circuits, each having a first load element having a first end connected to a power supply line supplying a power supply voltage, and a first n-channel field effect transistor of an insulation gate type having a drain connected to a second end of the first load element, a gate supplied with an inner reference voltage via a first input protection circuit, and a source receiving a transmitted signal, an output signal obtained by making a logic decision on the transmitted signal being output via the drain; and an inner reference voltage generating circuit having a second load element having a first end connected to said power supply line, a second n-channel field effect transistor of the insulation gate type having a drain connected to a second end of the second load element, a gate connected to the drain of the second n-channel field effect transistor and the gate of the first n-channel field effect transistor, and a source receiving a reference voltage via a reference voltage input terminal and a second input protection circuit, the reference voltage being used to make said logic decision, and a capacitor having a first end connected to the gate of the second n-channel field effect transistor and a second end connected to the second input protection circuit, said inner reference voltage being obtained at the gate of the second n-channel field effect transistor, the plurality of logic decision circuits and said inner reference voltage generating circuit forming input circuits of electronic circuits connected to a bus through which the transmitted signal passes.

53. The electronic circuit as claimed in claim 52, wherein the first and second load elements comprise p-channel insulation gate type field effect transistors having sources corresponding to the respective first terminals, drains corresponding to the respective second terminals, and gates receiving a bias voltage.

54. An electronic circuit comprising:

a plurality of logic decision circuits, each having a first load element having a first end connected to a power supply line supplying a power supply voltage, and a first n-channel field effect transistor of an insulation gate type having a drain connected to a second end of the first load element, a gate supplied with an inner reference voltage via a first input protection circuit, and a source receiving a transmitted signal, an output signal obtained by making a logic decision on the transmitted signal being output via the drain; and an inner reference voltage generating circuit having a second load element having a first end connected to said power supply line, a second n-channel field effect transistor of the insulation gate type having a drain connected to a second end of the second load element, a gate connected to the drain of the second n-channel field effect transistor and the gate of the first n-channel field effect transistor, and a source receiving a reference voltage via a reference voltage input terminal and a second input protection circuit, the reference voltage being used to make said logic decision, and an operational amplifier having a non-inverting input terminal connected to the source of the second n-channel field effect transistor, an inverting input terminal connected to an output terminal thereof and the gate of the first n-channel field effect transistor, said inner reference voltage being obtained at the output terminal of the operational amplifier, the plurality of logic decision circuits and said inner reference voltage generating circuit forming input circuits of electronic circuits connected to a bus through which the transmitted signal passes.

55. The electronic circuit as claimed in claim 54, wherein the first and second load elements comprise p-channel insulation gate type field effect transistors having sources corresponding to the respective first terminals, drains corresponding to the respective second terminals, and gates receiving a bias voltage.

56. An electronic circuit comprising:

a plurality of logic decision circuits, each having a first load element having a first end connected to a power supply line supplying a power supply voltage, and a first n-channel field effect transistor of an insulation gate type having a drain connected to a second end of the first load element, a gate supplied with an inner reference voltage, and a source, and a first variable impedance element having a current input terminal connected to the source, a current output terminal set to a group potential, and a control terminal receiving a transmitted signal via which a transmitted signal input terminal and a first input protection circuit, an output signal obtained by making a logic decision on the transmitted signal being output via the drain of the first n-channel field effect transistor; and an inner reference voltage generating circuit having a second load element having a first end connected to the power supply line, a second n-channel field effect transistor of the insulation gate type having a drain connected to a second terminal of the second load element, a gate connected to the second terminal and the gate of the first n-channel field effect transistor, and a source, and a second variable impedance element having a current input terminal connected to the source of the second n-channel field effect transistor, and a current output terminal set to the ground potential, and a control terminal receiving a reference voltage via a reference voltage input terminal and a second input protection circuit, the reference voltage being used to make the logic decision on the transmitted signal, the inner reference voltage being obtained at the gate of the second n-channel field effect transistor.

57. The electronic circuit as claimed in claim 56, wherein the first and second variable impedance elements respectively comprise p-channel insulation gate type field effect transistors having sources corresponding to the respective current input terminals, drains corresponding to the respective current output terminals, and gates corresponding to the respective control terminals.

58. The electronic circuit as claimed in claim 56, wherein the first and second variable impedance elements respectively comprise n-channel insulation gate type field effect transistors having drains corresponding to the respective current input terminals, sources corresponding to the respective current output terminals, and gates corresponding to the respective current control terminals.

59. The electronic circuit as claimed in claim 58, wherein the n-channel insulation gate type field effect transistors are of a depletion type.

60. The electronic circuit as claimed in claim 56, wherein the first and second load elements comprise p-channel insulation gate type field effect transistors having sources corresponding to the respective first terminals, drains corresponding to the respective second terminals, and gates receiving a bias voltage.

61. An electronic circuit comprising:

a differential amplifier circuit supplied with an input signal on which a logic decision should be made, and a reference voltage used to make the logic decision; and an input circuit including a current control circuit which controls said differential amplifier circuit so that a variation in a current flowing in the differential amplifier circuit with respect to a change of the reference voltage within a predetermined range can be suppressed.

62. The electronic circuit as claimed in claim 61, wherein said differential amplifier circuit comprises:

first and second loads respectively having first ends connected to a first power supply line via which a first power supply voltage is supplied;

a first transistor formed of an insulation gate type field effect transistor having a drain connected to a second end of the first load, a gate supplied with the input signal, and a source;

a second transistor formed of an insulation gate type field effect transistor having a drain connected to a second end of the second load, a gate supplied with the reference voltage, and a source connected to the source of the first transistor; and a variable resistance circuit having a first end connected to the sources of the first and second transistors, and a second end connected to a second power supply line via which a second power supply voltage is supplied, an output signal of said electronic circuit being output via at least one of the drains of the first and second transistors.

63. The electronic circuit as claimed in claim 62, wherein:

the first and second transistors are of an n-channel type; and the current control circuit increases a resistance value of the variable resistance circuit when the reference voltage is relatively high and decreases the resistance value of the variable resistance circuit when the reference voltage is relatively low.

64. The electronic circuit as claimed in claim 63, wherein:

the first load comprises a third transistor formed of a p-channel insulation gate type field effect transistor having a source connected to the first power supply line, a drain connected to the drain of the first transistor, and a source; and the second load comprises a fourth transistor formed of a p-channel insulation gate type field effect transistor having a source connected to the first power supply line, a gate, and a drain connected to the gate of the fourth transistor and the gate of the third transistor.

65. The electronic circuit as claimed in claim 63, wherein said variable resistance circuit comprises a third transistor formed of an n-channel insulation gate type field effect transistor having a drain connected to the sources of the first and second transistors, a source connected to the second power supply line, and a gate controlled by said current control circuit.

66. The electronic circuit as claimed in claim 63, wherein said variable resistance circuit comprises:

a third transistor formed of an n-channel insulation gate type field effect transistor having a drain connected to the sources of the first and second transistors, a source connected to the second power supply line, and a gate controlled by said current control circuit; and a fourth transistor formed of an n-channel insulation gate type field effect transistor having a drain connected to the sources of the first and second transistors, a source connected to the second power supply line, and a gate supplied with said reference voltage.

67. The electronic circuit as claimed in claim 65, wherein said current control circuit comprises:

a fourth transistor formed of a p-channel insulation gate type field effect transistor having a source connected to the first power supply line, a gate supplied with said reference voltage, and a drain; and a resistance element having a first end connected to the drain of the fourth transistor, and a second end connected to the second power supply line, the first end of said resistance element connected to the drain of the fourth transistor being connected to the gate thereof.

68. The electronic circuit as claimed in claim 66, wherein said current control circuit comprises:

a fifth transistor formed of a p-channel insulation gate type field effect transistor having a source connected to the first power supply line, a gate supplied with said reference voltage, and a drain; and a resistance element having a first end connected to the drain of the fifth transistor, and a second end connected to the second power supply line, the first end of said resistance element connected to the drain of the fifth transistor being connected to the gate thereof.

69. The electronic circuit as claimed in claim 65, wherein the current control circuit comprises:

a fourth transistor of a p-channel insulation gate type field effect transistor having a source connected to the first power supply line, a gate supplied with said reference voltage, and a drain; and a fifth transistor of an n-channel insulation gate type field effect transistor having a gate, a drain connected to the gate of the fifth transistor and the drain of the fourth transistor, and a source connected to the second power supply line, the drains of the fourth and fifth transistors being connected to the gate of the third transistor.

70. The electronic circuit as claimed in claim 66, wherein the current control circuit comprises:

a fifth transistor of a p-channel insulation gate type field effect transistor having a source connected to the first power supply line, a gate supplied with said reference voltage, and a drain; and a sixth transistor of an n-channel insulation gate type field effect transistor having a gate, a drain connected to the gate of the sixth transistor and the drain of the fifth transistor, and a source connected to the second power supply line, the drains of the fifth and sixth transistors being connected to the gate of the third transistor.

71. The electronic circuit as claimed in claim 65, wherein said current control circuit comprises:

a fourth transistor having a source connected to the first power supply line, a gate supplied with said reference voltage, and a drain;

a fifth transistor having a drain connected to the drain of the fourth transistor, a gate supplied with said reference voltage, and a source; and a sixth transistor having a drain connected to the drain of the fifth transistor, a gate connected to the gate of the fourth transistor, and a source connected to the second power supply line, the drains of the fourth and fifth transistors being connected to the gate of the third transistor.

72. The electronic circuit as claimed in claim 66, wherein said current control circuit comprises:

a fifth transistor having a source connected to the first power supply line, a gate supplied with said reference voltage, and a drain;

a sixth transistor having a drain connected to the drain of the fifth transistor, a gate supplied with said reference voltage, and a source; and a seventh transistor having a drain connected to the drain of the sixth transistor, a gate connected to the gate of the fifth transistor, and a source connected to the second power supply line, the drains of the fifth and sixth transistors being connected to the gate of the third transistor.

73. The electronic circuit as claimed in claim 65, wherein said current control circuit comprises:
- a monitor circuit which monitors the current flowing in the variable resistance circuit; and
- a feedback control circuit which controls a gate voltage of the third transistor so that the current monitored by the monitor circuit is maintained at an approximately constant level.

74. The electronic circuit as claimed in claim 73, wherein said monitor circuit comprises:
- a resistor having a first end connected to the first power supply line, and a second end;
- fourth and fifth transistors respectively formed of n-channel insulation gate type field effect transistors respectively having gates having gate widths equal to 1/m of that of each of the first and second transistors where m≧1, drains connected to the second end of said resistor, and sources connected to each other, the reference voltage being supplied to the gates of the fourth and fifth transistors; and,
- a sixth transistor formed of an n-channel insulation gate type field effect transistor having a gate having a gate width equal to said 1/m, a drain connected to the sources of said fourth and fifth transistors, and a source connected to the second power supply line, said feedback control circuit comprising a differential amplifier circuit including:
- a first input terminal connected to the drains of the fourth and fifth transistors;
- a second input terminal supplied with a predetermined voltage; and
- an output terminal via which an output voltage in phase with a voltage applied to said first input terminal is provided, the output terminal of said feedback control circuit being connected to the gate of said third transistor.

75. The electronic circuit as claimed in claim 64, wherein said variable resistance circuit comprises a fifth transistor formed of an n-channel insulation gate type field effect transistor having a drain connected to the sources of the first and second transistors, a source connected to the second power supply line, and a gate controlled by said current control circuit,
wherein said monitor circuit comprises:
- a sixth transistor formed of a p-channel insulation gate type field effect transistor having a gate having a gate width equal to 1/m of that of the third transistor where m≧1, a source connected to the first power supply line, and a drain;
- a seventh transistor formed of a p-channel insulation gate type field effect transistor having a gate having a gate width equal to 1/m of that of the fourth transistor, a source connected to the first power supply line, and a drain connected to the gate of the seventh transistor and the gate of the sixth transistor;
- an eighth transistor formed of an n-channel insulation gate type field effect transistor having a gate width equal to 1/m of that of the first transistor, a drain connected to the drain of the sixth transistor, and a source; and
- a ninth transistor formed of an n-channel insulation gate type field effect transistor having a gate width equal to 1/m of that of the second transistor, a drain connected to the drain of the seventh transistor, and a source connected to the eighth transistor, the gate of the ninth transistor receiving said reference voltage; and

- a tenth transistor formed of an n-channel insulation gate type field effect transistor having a gate width equal to 1/m of that of the fifth transistor, a drain connected to the sources of the eighth and ninth transistors, and a source connected to the second power supply line, said feedback circuit comprising a differential amplifier circuit comprising:
- a first input terminal connected to the drains of the sixth and eighth transistors;
- a second input terminal receiving a constant voltage; and
- an output terminal outputting a voltage in phase with a voltage applied to the first input terminal, said output terminal of the differential amplifier circuit being connected to the gates of the fifth and tenth transistors.

76. The electronic circuit as claimed in claim 62, wherein:
the first and second transistors are of a p-channel type; and
the current control circuit decreases a resistance value of the variable resistance circuit when the reference voltage is relatively high, and increases the resistance value of the variable resistance circuit when the reference voltage is relatively low.

77. The electronic circuit as claimed in claim 76, wherein:
the first load comprises a third transistor formed of a p-channel insulation gate type field effect transistor having a source connected to the second power supply line, a drain connected to the drain of the first transistor, and a source; and
the second load comprises a fourth transistor formed of a p-channel insulation gate type field effect transistor having a source connected to the second power supply line, a gate, and a drain connected to the gate of the fourth transistor and the gate of the third transistor.

78. The electronic circuit as claimed in claim 63, wherein said variable resistance circuit comprises a third transistor formed of an n-channel insulation gate type field effect transistor having a drain connected to the sources of the first and second transistors, a source connected to the second power supply line, and a gate controlled by said current control circuit.

79. The electronic circuit as claimed in claim 77, wherein said variable resistance circuit comprises:
- a third transistor formed of an n-channel insulation gate type field effect transistor having a drain connected to the sources of the first and second transistors, a source connected to the first power supply line, and a gate controlled by said current control circuit; and
- a fourth transistor formed of a p-channel insulation gate type field effect transistor having a drain connected to the sources of the first and second transistors, a source connected to the first power supply line, and a gate supplied with said reference voltage.

80. The electronic circuit as claimed in claim 78, wherein said current control circuit comprises:
- a fourth transistor formed of a p-channel insulation gate type field effect transistor having a source connected to the first power supply line, a gate supplied with said reference voltage, and a drain; and
- a resistance element having a first end connected to the drain of the fourth transistor, and a second end connected to the second power supply line.

81. The electronic circuit as claimed in claim 78, wherein the current control circuit comprises:
- a fourth transistor of a p-channel insulation gate type field effect transistor having a source connected to the first power supply line, a gate supplied with the reference voltage, and a drain connected to said gate thereof; and a fifth transistor of an n-channel insulation gate type field effect transistor having a drain connected to the drain of the fourth transistor, a source connected to the second power supply line, and a gate supplied with the reference voltage, the drains of the fourth and fifth transistors being connected to the gate of the third transistor.

82. The electronic circuit as claimed in claim 78, wherein the current control circuit comprises:

a fourth transistor of a p-channel insulation gate type field effect transistor having a source connected to the first power supply line, a gate supplied with the reference voltage, and a drain; and a fifth transistor of an n-channel insulation gate type field effect transistor having a drain connected to the drain of the fourth transistor, a gate supplied with the reference voltage and a source; and a sixth transistor of an n-channel insulation gate type field effect transistor having a drain connected to the drain of the fifth transistor and the gate of the fifth transistor, a source connected to the second power supply line, and a gate supplied with the reference voltage, the drains of the fifth and sixth transistors being connected to the gate of the third transistor.

83. The electronic circuit as claimed in claim 78, wherein said current control circuit comprises:

a monitor circuit which monitors the current flowing in the variable resistance circuit; and a feedback control circuit which controls a gate voltage of the third transistor so that the current monitored by the monitor circuit is maintained at an approximately constant level.

84. The electronic circuit as claimed in claim 53, wherein said monitor circuit comprises:

a fourth transistor of a p-channel insulation gate type field effect transistor having a gate having a gate width equal to 1/m of that of the third transistor where m≧1, a source connected to the first power supply line, and a drain;

fifth and sixth transistors respectively formed of p-channel insulation gate type field effect transistors respectively having gates having gate widths equal to 1/m of that of the second transistor, drains connected to each other, and gates receiving the reference voltage; and a resistor having a first end connected to the drains of the fifth and sixth transistors, and a second end connected to the second power supply line, said feedback control circuit comprising a differential amplifier circuit including:

a first input terminal connected to the drains of the fifth and sixth transistors;

a second input terminal supplied with a predetermined voltage; and an output terminal via which an output voltage in phase with a voltage applied to said first input terminal is provided, the output terminal of said feedback control circuit being connected to the gates of said third and fourth transistors.

85. An electronic circuit connected to a first power supply line via which a first power supply voltage is supplied, said electronic circuit comprising:

a first transistor formed of a p-channel insulation gate field effect transistor having a source connected to a second power supply line via which a second power supply voltage equal to or lower than the first power supply voltage is supplied, a drain connected to an output terminal of the electronic circuit, and a gate supplied with a first signal switchable between a high level corresponding to the second power supply voltage and a low level corresponding to a ground voltage;

a second transistor formed of an n-channel insulation gate field effect transistor having a drain connected to the second power supply line, a source connected to the output terminal, and a gate supplied with a second signal switchable between a high level corresponding to said first power supply voltage and a low level corresponding to the ground voltage; and a third transistor formed of an n-channel insulation gate field effect transistor having a drain connected to the output terminal, a source connected to the ground, and a gate supplied with a third signal switchable between a high level corresponding to the first power supply voltage and a second level corresponding to the ground voltage.

86. The electronic circuit as claimed in claim 85, wherein the second power supply voltage has a lower limit value of 0.84 V.

87. The electronic circuit as claimed in claim 86, wherein the second power supply voltage has an upper limit value equal to the first power supply voltage.

88. An electronic circuit comprising:

an output control circuit having a power supply terminal connected to a first power supply line via which a first power supply voltage is supplied and outputting first and second signals each switchable between a high level corresponding to the first power supply voltage and a low level corresponding to a ground voltage;

a first inverter having a power supply terminal connected to a second power supply line via which a second power supply voltage equal to or lower than the first power supply voltage is supplied, an input terminal supplied with the first signal, and an output terminal outputting a signal switchable between a high level corresponding to the second power supply voltage and a low level corresponding to the ground voltage;

a second inverter having a power supply terminal connected to the first power supply line, an input terminal supplied with the second signal, and an output terminal outputting a signal switchable between a high level corresponding to the first power supply voltage and a low level corresponding to the ground voltage;

a first transistor formed of a p-channel insulation gate type field effect transistor having a drain connected to the second power supply line, a source connected to the output terminal, and a gate connected to the output terminal of the first inverter;

a second transistor formed of an n-channel insulation gate type field effect transistor having a drain connected to the second power supply line, a source connected to the output terminal, and a gate supplied with the first signal; and a third transistor formed of an n-channel insulation gate type field effect transistor having a drain connected to the output terminal, a source grounded, and a gate connected to the output terminal of the second inverter.

89. The electronic circuit as claimed in claim 88, wherein the second power supply voltage has a lower limit value of 0.84 V.

90. The electronic circuit as claimed in claim 89, wherein the second power supply voltage has an upper limit value equal to the first power supply voltage.

* * * * *